US012672288B2

(12) United States Patent
Nagashima et al.

(10) Patent No.: US 12,672,288 B2
(45) Date of Patent: Jun. 30, 2026

(54) SEMICONDUCTOR DEVICE AND METHOD FOR MANUFACTURING SEMICONDUCTOR DEVICE

(71) Applicant: Kioxia Corporation, Tokyo (JP)

(72) Inventors: Satoshi Nagashima, Yokkaichi Mie (JP); Shota Kashiyama, Mie Mie (JP); Tadashi Iguchi, Yokkaichi Mie (JP); Takuya Nishikawa, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 366 days.

(21) Appl. No.: 18/461,326

(22) Filed: Sep. 5, 2023

(65) Prior Publication Data

US 2024/0121962 A1 Apr. 11, 2024

(30) Foreign Application Priority Data

Oct. 11, 2022 (JP) ................................. 2022-163557
Jul. 31, 2023 (JP) ................................. 2023-125128

(51) Int. Cl.
*H10B 43/27* (2023.01)
*H10B 41/10* (2023.01)
*H10B 41/27* (2023.01)
*H10B 43/10* (2023.01)

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
None
See application file for complete search history.

(56) References Cited

U.S. PATENT DOCUMENTS

| | | | |
|---|---|---|---|
| 10,854,620 B2 | 12/2020 | Mori | |
| 11,508,743 B2 | 11/2022 | Zhu | |
| 2014/0054789 A1 | 2/2014 | Chiu | |
| 2019/0088672 A1 | 3/2019 | Tomimatsu | |
| 2020/0083241 A1* | 3/2020 | Okawa | ................... H10B 43/27 |

(Continued)

FOREIGN PATENT DOCUMENTS

| | | |
|---|---|---|
| JP | 2019057623 A | 4/2019 |
| JP | 2023045293 A | 4/2023 |

(Continued)

OTHER PUBLICATIONS

U.S. Appl. No. 18/177,010.

*Primary Examiner* — Alexander G Ghyka
(74) *Attorney, Agent, or Firm* — Kim & Stewart LLP

(57) ABSTRACT

According to one embodiment, a semiconductor device includes a stacked film with first insulating films and electrode layers alternately stacked in a first direction. The device further includes a columnar portion extending in the first direction and provided in a first region of the stacked film. The columnar portion forms memory cells at its intersections with the electrode layers. The device further includes a support column portion provided in a second region and extending in the first direction. A conductive plug is provided on a first electrode layer among the electrode layers in the second region. A first side surface of the support column portion faces a second side surface of the plug and the second side surface is concave in a direction toward the first side surface.

12 Claims, 49 Drawing Sheets

(56)      References Cited

U.S. PATENT DOCUMENTS

| | | | | |
|---|---|---|---|---|
| 2021/0296348 A1* | 9/2021 | Fukumaki | .............. | H10B 43/27 |
| 2022/0051930 A1 | 2/2022 | Gupta | | |
| 2022/0123008 A1 | 4/2022 | Lee | | |
| 2022/0123010 A1* | 4/2022 | Gao | ........................ | H10B 43/10 |
| 2022/0278124 A1* | 9/2022 | Hamada | ................. | H10B 43/27 |
| 2022/0293751 A1* | 9/2022 | Suzuki | ................ | H10D 64/252 |
| 2022/0302150 A1 | 9/2022 | Zhang | | |
| 2022/0302152 A1* | 9/2022 | Sakata | ................... | H10B 41/27 |
| 2023/0090305 A1 | 3/2023 | Iguchi | | |
| 2023/0307287 A1 | 9/2023 | Komukai | | |
| 2024/0099001 A1 | 3/2024 | Iguchi | | |

FOREIGN PATENT DOCUMENTS

| | | | |
|---|---|---|---|
| JP | 2024039485 A | 3/2024 |
| TW | 201916321 A | 4/2019 |
| TW | 202036828 A | 10/2020 |
| TW | 202114147 A | 4/2021 |
| TW | 202218056 A | 5/2022 |
| TW | 202238945 A | 10/2022 |

* cited by examiner

*FIG. 24A*
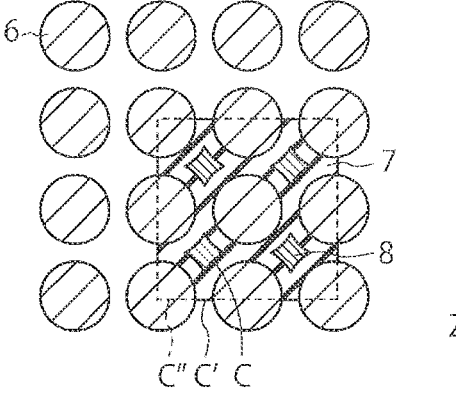
*FIG. 24B*
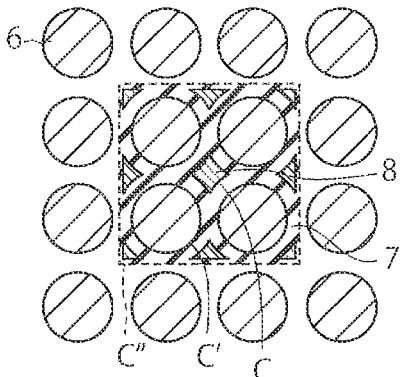
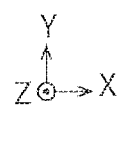
*FIG. 24C*
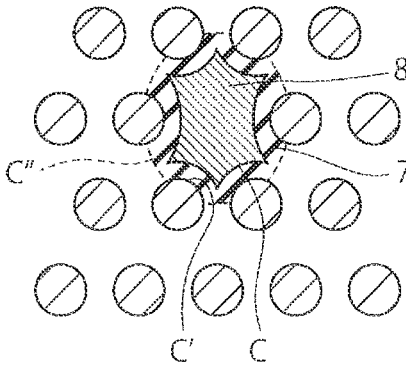
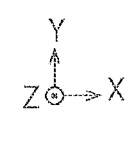

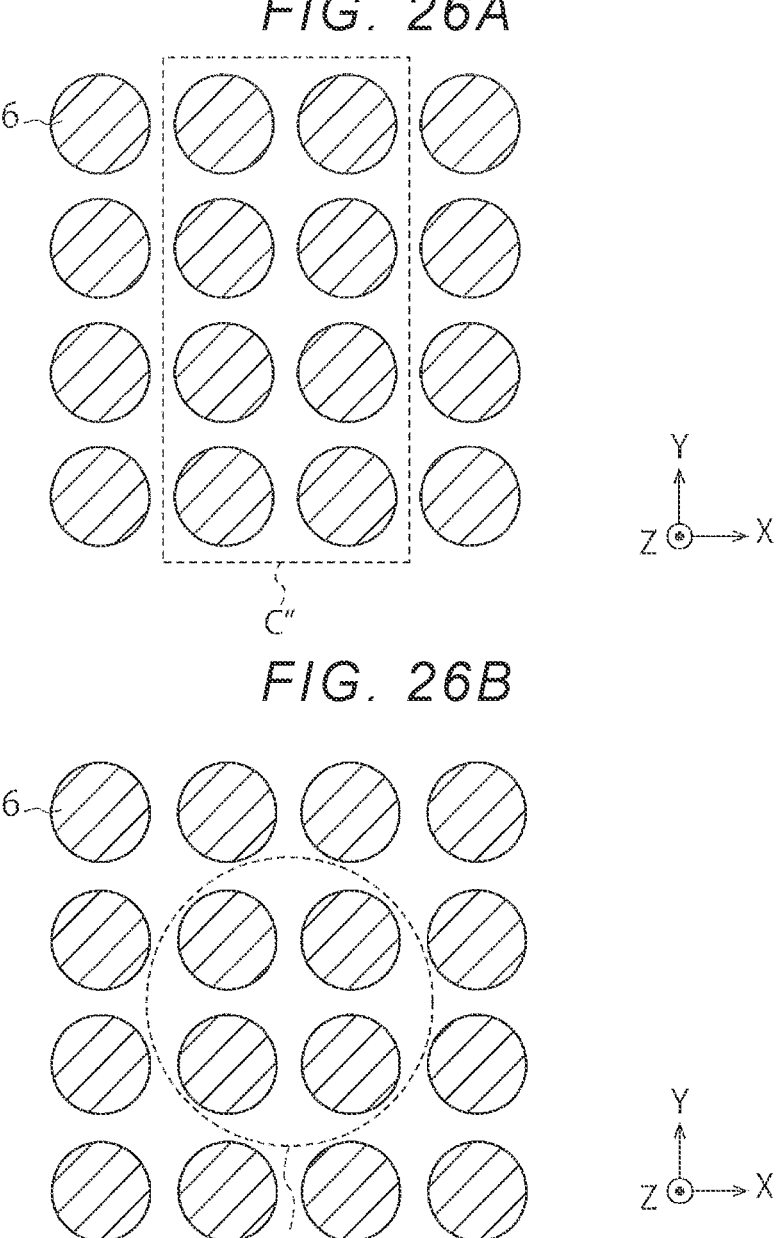

SEMICONDUCTOR DEVICE AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2022-163557, filed Oct. 11, 2022, and Japanese Patent Application No. 2023-125128, filed Jul. 31, 2023, the entire contents of which are incorporated herein by reference.

FIELD

Embodiments described herein relate generally to a semiconductor device and a method for manufacturing the same.

BACKGROUND

When a column portion and a contact plug are formed in a contact region of a three-dimensional semiconductor memory, an abnormality may occur in the shape of the contact plug.

BRIEF DESCRIPTION OF THE DRAWINGS

FIG. 3 is a cross-sectional view illustrating a structure of a columnar portion according to the first embodiment.

FIG. 4 is a cross-sectional view illustrating a structure of a column portion according to the first embodiment.

FIGS. 5A and 5B are, respectively, a plan view and a perspective view illustrating an example of a structure of a contact region according to the first embodiment.

FIGS. 11A and 11B are cross-sectional views illustrating a method for manufacturing a semiconductor device according to the first embodiment.

FIGS. 13A and 13B are cross-sectional views illustrating the method for manufacturing a semiconductor device according to the first embodiment.

FIGS. 14A and 14B are cross-sectional views illustrating a method for manufacturing a semiconductor device according to the first comparative example.

FIGS. 15A and 15B are cross-sectional views illustrating the method for manufacturing a semiconductor device according to the first comparative example.

FIGS. 17A and 17B are cross-sectional views illustrating a method for manufacturing a semiconductor device according to the first modified example.

FIGS. 19A and 19B are cross-sectional views illustrating a method for manufacturing a semiconductor device according to the first modified example.

FIGS. 21A and 21B are cross-sectional views illustrating the method for manufacturing a semiconductor device according to the first modified example.

FIGS. 22A and 22B are cross-sectional views illustrating the method for manufacturing a semiconductor device according to the first modified example.

FIGS. 23A and 23B are cross-sectional views illustrating the method for manufacturing a semiconductor device according to the first modified example.

FIGS. 24A to 24C are plan views illustrating various examples of a structure of a semiconductor device according to the first embodiment.

FIGS. 26A and 26B are plan views illustrating various examples of a structure of a semiconductor device according to the first embodiment.

FIGS. 29 to 40 are cross-sectional views illustrating a method for manufacturing a semiconductor device according to the second embodiment.

FIG. 45 is a cross-sectional view illustrating a structure of a semiconductor device according to a fourth modified example of the second embodiment.

FIG. 49 is a block diagram illustrating a configuration of a semiconductor device according to the fifth modified example of the second embodiment.

DETAILED DESCRIPTION

In general, according to one embodiment, a semiconductor device includes a stacked film with a plurality of first insulating films and a plurality of electrode layers alternately stacked with each other in a first direction. The device further includes a columnar portion provided in a first region of the stacked film and extending in the first direction. The columnar portion forms a plurality of memory cells at intersections with the plurality of electrode layers. The device further includes a support column portion provided in a second region of the stacked film and extending in the first direction. The device further includes a plug (e.g., a contact plug) contacting a first electrode layer among the plurality of electrode layers in the second region. A first side surface of the column portion faces a second side surface of the plug, and the second side surface is concave in a direction toward the first side surface.

Certain example embodiments will now be described with reference to the accompanying drawings. In FIGS. 1 to 49, the same components are denoted by the same reference symbols and redundant description may be omitted from discussion of subsequent drawings and/or embodiments.

First Embodiment (1) Structure of Semiconductor Device

Figure 1:
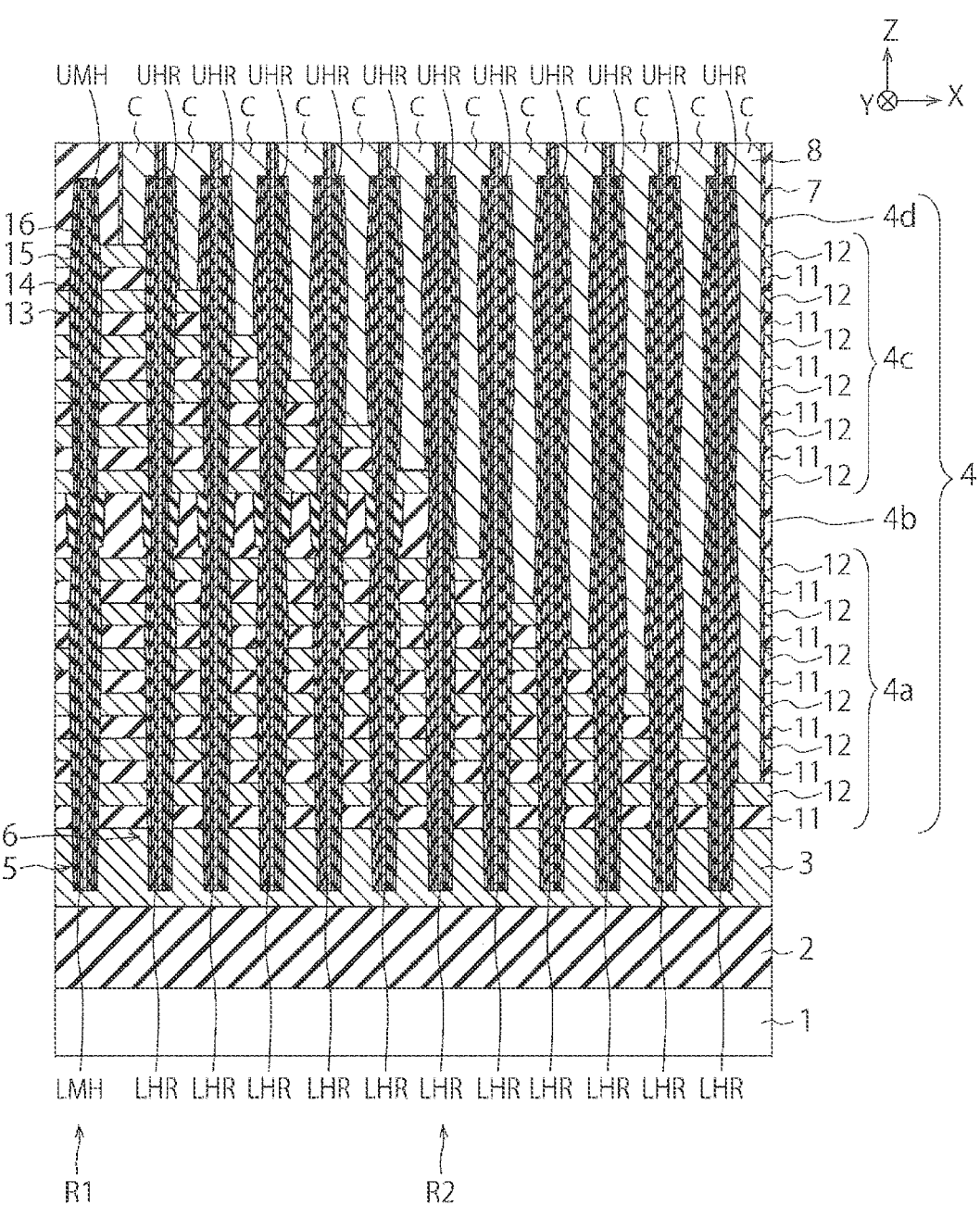
FIG. 1 is a cross-sectional view illustrating a structure of a semiconductor device according to a first embodiment.

FIG. 1 is a cross-sectional view illustrating a structure of a semiconductor device according to a first embodiment. The semiconductor device of the first embodiment includes a three-dimensional semiconductor memory.

The semiconductor device includes a substrate 1, an interlayer insulating film 2, a source layer 3, a stacked film 4, a plurality of columnar portions 5, a plurality of column portions 6, a plurality of insulating films 7, and a plurality of contact plugs 8. The insulating film 7 is an example of a second insulating film. The contact plug 8 is an example of a plug. FIG. 1 illustrates one of the plurality of columnar portions 5, eleven of the plurality of column portions 6, and twelve of the plurality of contact plugs 8.

The stacked film 4 includes a lower stacked film 4*a*, an insulating film 4*b*, an upper stacked film 4*c*, and an insulating film 4*d*. The lower stacked film 4*a* and the upper stacked film 4*c* each includes a plurality of insulating films 11 and a plurality of electrode layers 12. The insulating films 11, 4*b*, and 4*d* are examples of a first insulating film.

The columnar portion 5 and the column portion 6 each includes a block insulating film 13, a charge storage layer 14, a tunnel insulating film 15, and a channel semiconductor layer 16. The block insulating film 13, the charge storage layer 14, and the tunnel insulating film 15 in each columnar portion 5 are examples of a third insulating film, and the channel semiconductor layer 16 in each columnar portion 5 is an example of a first semiconductor layer. The block insulating film 13, the charge storage layer 14, and the tunnel insulating film 15 in each column portion 6 are examples of a fourth insulating film, and the channel semiconductor layer 16 in each column portion 6 is an example of a second semiconductor layer.

The substrate 1 is a semiconductor substrate such as a silicon (Si) substrate. FIG. 1 illustrates an X direction and a Y direction that are parallel to a surface of the substrate 1 and perpendicular to each other, and a Z direction orthogonal to the surface of the substrate 1. In the present specification, a +Z direction can be referred to as an upward direction, and a −Z direction can be referred to as a downward direction. The −Z direction may coincide with the direction of gravity or may not coincide with the direction of gravity. The Z direction is an example of the first direction.

When the semiconductor device of the first embodiment can be manufactured by bonding the substrate 1 to another substrate, the substrate 1 may be removed after the bonding. In this case, the semiconductor device of the present embodiment need not include the substrate 1.

The interlayer insulating film 2 is formed on the substrate 1. The interlayer insulating film 2 is, for example, a $SiO_2$ film (silicon oxide film).

The source layer 3 is formed on the interlayer insulating film 2 and serves as a source line. The source layer 3 is, for example, a semiconductor layer such as a polysilicon layer. The source layer 3 may be a stacked film including a semiconductor layer and a metal layer.

The stacked film 4 includes the lower stacked film 4*a*, the insulating film 4*b*, the upper stacked film 4*c*, and the insulating film 4*d* stacked in this order on the source layer 3. The lower stacked film 4*a* includes a plurality of insulating films 11 and a plurality of electrode layers 12 which are alternately formed in the Z direction. Similarly, the upper stacked film 4*c* also includes a plurality of insulating films 11 and a plurality of electrode layers 12 which are alternately formed in the Z direction. The stacked film 4 of the present embodiment serves as a memory cell array region of a three-dimensional semiconductor memory. Each of the insulating films 11, 4*b*, and 4*d* is, for example, a $SiO_2$ film. Each electrode layer 12 includes, for example, a metal layer such as a tungsten (W) layer or a molybdenum (Mo) layer. For example, each electrode layer 12 serves as a word line, a source-side selection line, or a drain-side selection line.

The stacked film 4 of the present embodiment has a cell region R1 (where the columnar portion 5 is disposed) and a contact region R2 (where the column portion 6 and the contact plug 8 are disposed). The cell region R1 is an example of the first region, and the contact region R2 is an example of the second region.

Each columnar portion 5 is formed in the cell region R1 and has a columnar shape extending in the Z direction. Each intersection between a columnar portion 5 and one of the electrode layers 12 forms a cell transistor (memory cell), a source-side select transistor, or a drain-side select transistor. Each columnar portion 5 is inside a lower memory hole LMH (formed in the lower stacked film 4*a*) and an upper memory hole UMH (formed in the upper stacked film 4*c*). A lower end of each columnar portion 5 is located in the source layer 3.

Each columnar portion 5 includes a block insulating film 13, a charge storage layer 14, a tunnel insulating film 15, and a channel semiconductor layer 16 which are sequentially formed in the stacked film 4. The block insulating film 13 is, for example, a $SiO_2$ film. The charge storage layer 14 is, for example, an insulating film such as a SiN film (silicon nitride film). The charge storage layer 14 may be a semiconductor layer such as a polysilicon layer in some examples. The tunnel insulating film 15 is, for example, a $SiO_2$ film or a SiON film (silicon oxynitride film). The channel semiconductor layer 16 is, for example, a polysilicon layer. The charge storage layer 14 in each columnar portion 5 can store a charge used for data storage in each memory cell. The channel semiconductor layer 16 in each columnar portion 5 is electrically connected to the source layer 3 and serves as a channel of the cell transistors, the source-side select transistors, and the drain-side select transistors.

Each column portion 6 is formed in the contact region R2 and has a columnar shape extending in the Z direction. Each column portion 6 serves as a column (also referred to as a beam or support beam) for preventing the stacked film 4 from being broken/damaged during a replacement process used in the manufacturing of the semiconductor device. Each column portion 6 is embedded in a lower hole LHR (formed in the lower stacked film 4a) and an upper hole UHR (formed in the upper stacked film 4c). A lower end of each column portion 6 is located in the source layer 3.

Each column portion 6 includes a block insulating film 13, a charge storage layer 14, a tunnel insulating film 15, and a channel semiconductor layer 16 which are sequentially formed in the stacked film 4. According to the present embodiment, each of the block insulating film 13, the charge storage layer 14, the tunnel insulating film 15, and the channel semiconductor layer 16 in the column portion 6 are formed of the same material as the block insulating film 13, the charge storage layer 14, the tunnel insulating film 15, and the channel semiconductor layer 16 in the columnar portion 5. It is noted that since the column portion 6 is not used to form a memory cell like the columnar portion 5, the channel semiconductor layer 16 in each column portion 6 need not be electrically connected to the source layer 3. In addition, each column portion 6 may be formed of a material different from a material from those in the columnar portions 5, and for example, may be formed of only an insulating film such as an $SiO_2$ film.

Each contact plug 8 is formed in the contact region R2 passing through the insulating film 7 and has a columnar shape extending in the Z direction. Each contact plug 8 is formed on one of the plurality of electrode layers 12, and is electrically connected to that electrode layer 12. The connected electrode layer 12 is an example of a first electrode layer. For example, when a certain contact plug 8 is formed on an Nth (where N is an integer of 2 or more) electrode layer 12 from the top, the contact plug 8 passes through the first to (N−1)th electrode layers 12 from the top in the Z direction. Each contact plug 8 is electrically insulated from the other electrode layers 12 by the insulating film 7. Each insulating film 7 is, for example, a $SiO_2$ film. Each insulating film 7 may be a stacked film including a $SiO_2$ film and a high-k film (for example, a SiN film, an aluminum oxide film ($AlO_x$) film, a hafnium oxide film ($HfO_x$) film, and/or a zirconium oxide film ($ZrO_x$) film. In addition, each contact plug 8 includes, for example, a metal layer such as a tungsten (W) layer, a copper (Cu) layer, or an aluminum (Al) layer.

Each contact plug 8 is embedded in a contact hole C formed in the stacked film 4. According to the present embodiment, a contact hole that is larger than the contact hole C can be formed in the stacked film 4, and a sacrificial layer is formed in the contact hole, and the column portion 6 is then formed in the stacked film 4. Furthermore, by removing the sacrificial layer, the contact hole C is formed in a region between the column portions 6, and the contact plug 8 is embedded in the contact hole C. Therefore, a shape of a side surface of the contact hole C and a shape of the side surface of the contact plug 8 are affected by a shape of the side surface of the column portion 6. The side surfaces will be described in more detail below.

Figure 2:
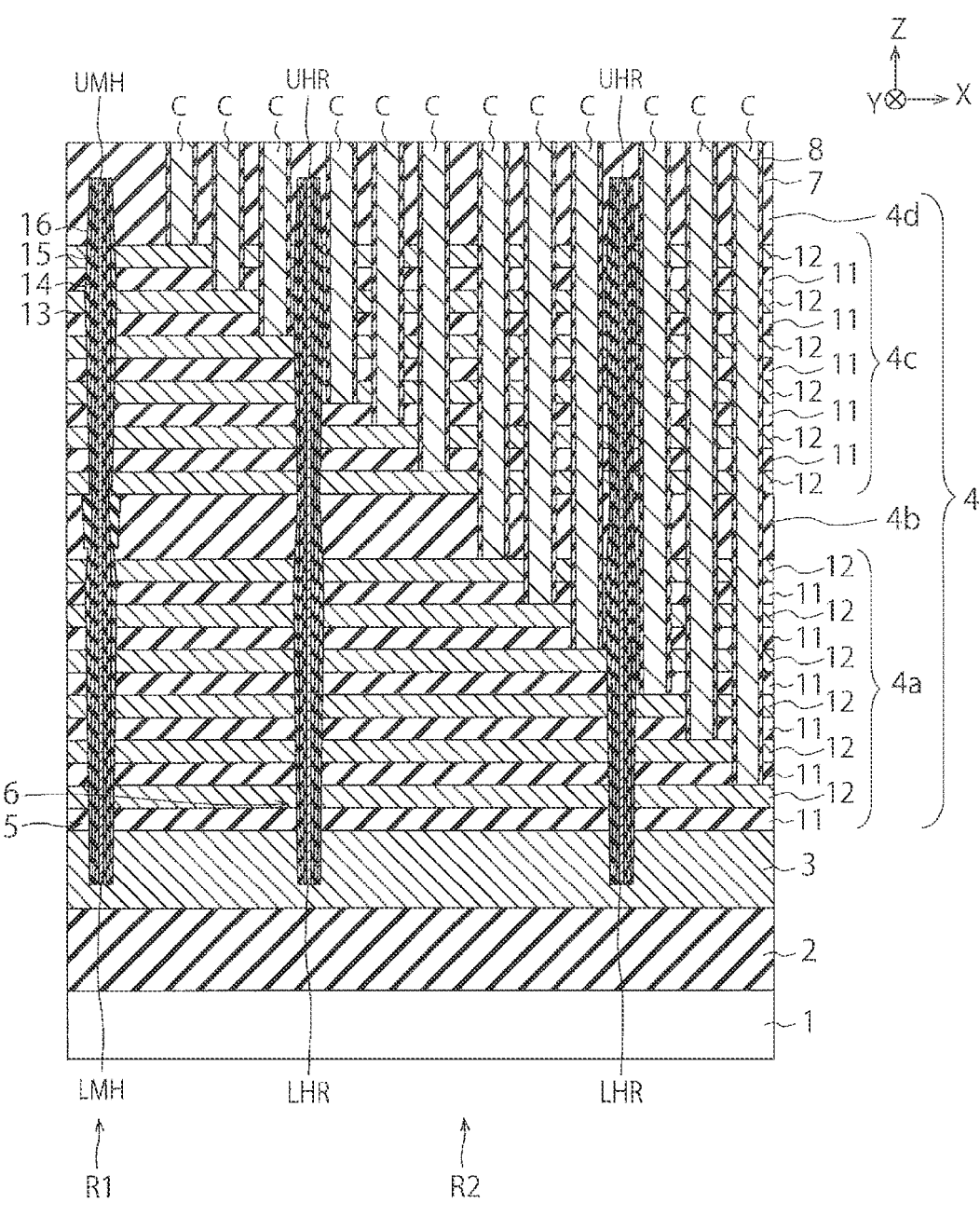
FIG. 2 is a cross-sectional view illustrating a structure of a semiconductor device according to a first modified example of the first embodiment.

FIG. 2 is a cross-sectional view illustrating a structure of a semiconductor device according to a first modified example of the first embodiment.

As in the semiconductor device of the first embodiment (FIG. 1), the semiconductor device of the first modified example (FIG. 2) includes a substrate 1, an interlayer insulating film 2, a source layer 3, a stacked film 4, a plurality of columnar portions 5, a plurality of column portions 6, a plurality of insulating films 7, and a plurality of contact plugs 8. FIG. 2 illustrates one of the plurality of columnar portions 5, two of the plurality of column portions 6, and twelve of the plurality of contact plugs 8.

The structure of the stacked film 4 may be the structure illustrated in FIG. 1 or may be the structure illustrated in FIG. 2. The number of columnar portions 5, the number of column portions 6, and the number of contact plugs 8 in the stacked film 4 may be set freely, and may be different from the numbers illustrated in FIG. 1 or FIG. 2. In addition, a cross section of the semiconductor device illustrated in FIG. 1 may be different from a cross section of the semiconductor device illustrated in FIG. 2. In the Z direction of FIGS. 1 and 2, a position of an upper end (surface) of the insulating film 7 and a position of an upper end (surface) of the contact plug 8 are higher than a position of an upper end (surface) of the column portion 6. This is because the contact hole C is formed after the column portion 6 is formed.

Figure 3:
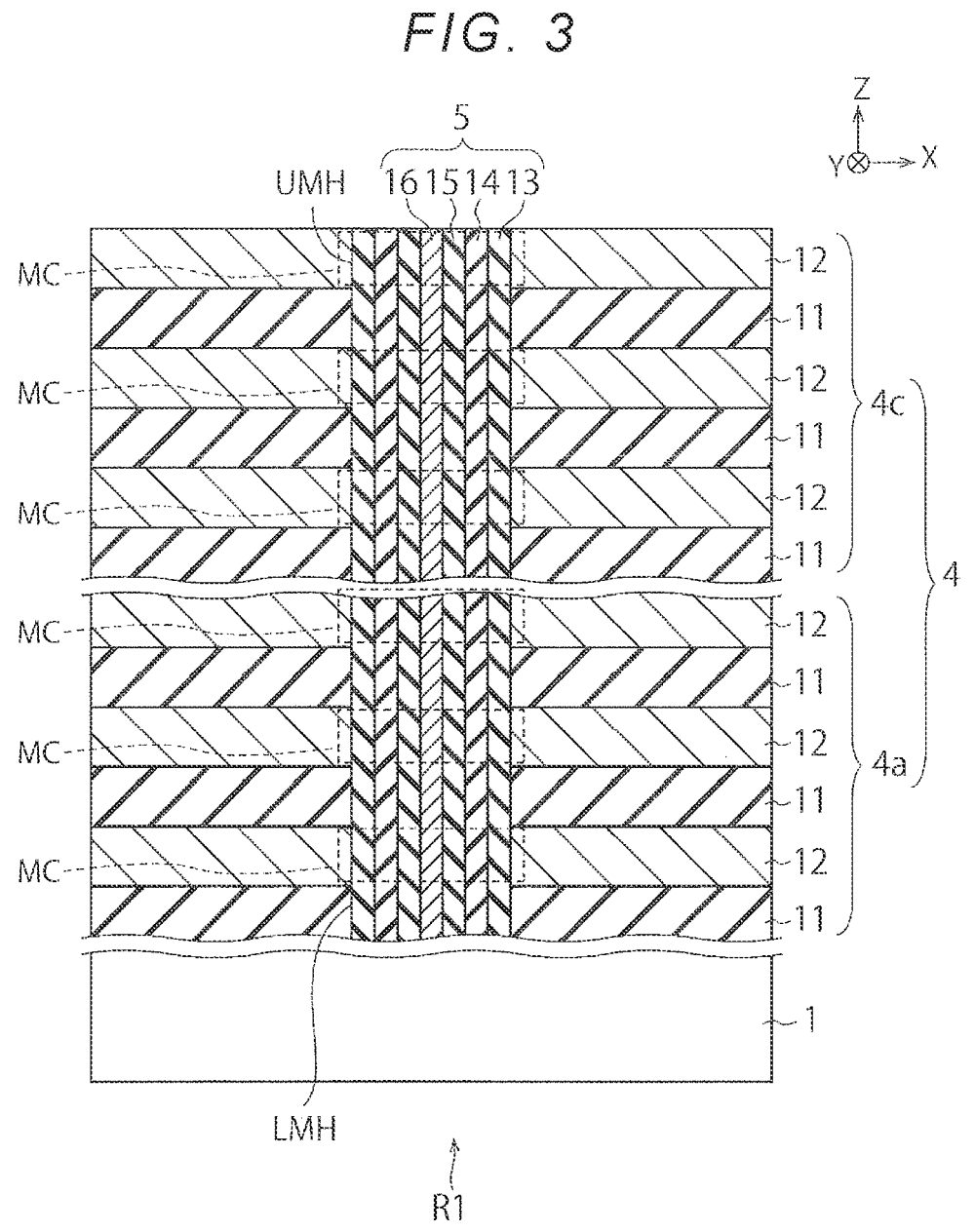

FIG. 3 is a cross-sectional view illustrating a structure of a columnar portion 5 according to the first embodiment. FIG. 3 illustrates one of the plurality of columnar portions 5 of the present embodiment.

As illustrated in FIG. 3, each columnar portion 5 includes a block insulating film 13, a charge storage layer 14, a tunnel insulating film 15, and a channel semiconductor layer 16 which are sequentially formed. In FIG. 3, the channel semiconductor layer 16 has a solid columnar shape extending in the Z direction. The tunnel insulating film 15, the charge storage layer 14, and the block insulating film 13 have a hollow columnar shape extending in the Z direction, and surround side surface of the channel semiconductor layer 16 in a tubular shape. In other examples, the columnar portion 5 may further include a core insulating film inside the channel semiconductor layer 16. The core insulating film can be, for example, a $SiO_2$ film.

The electrode layers 12 illustrated in FIG. 3 serve as a word line. Accordingly, the columnar portion 5 illustrated in FIG. 3 forms a memory cell MC at the intersection with the electrode layer 12. The channel semiconductor layer 16 in the columnar portion 5 is electrically connected to a source line (source layer 3) at a lower end side thereof, and is electrically connected to a bit line at an upper end side thereof.

Figure 4:
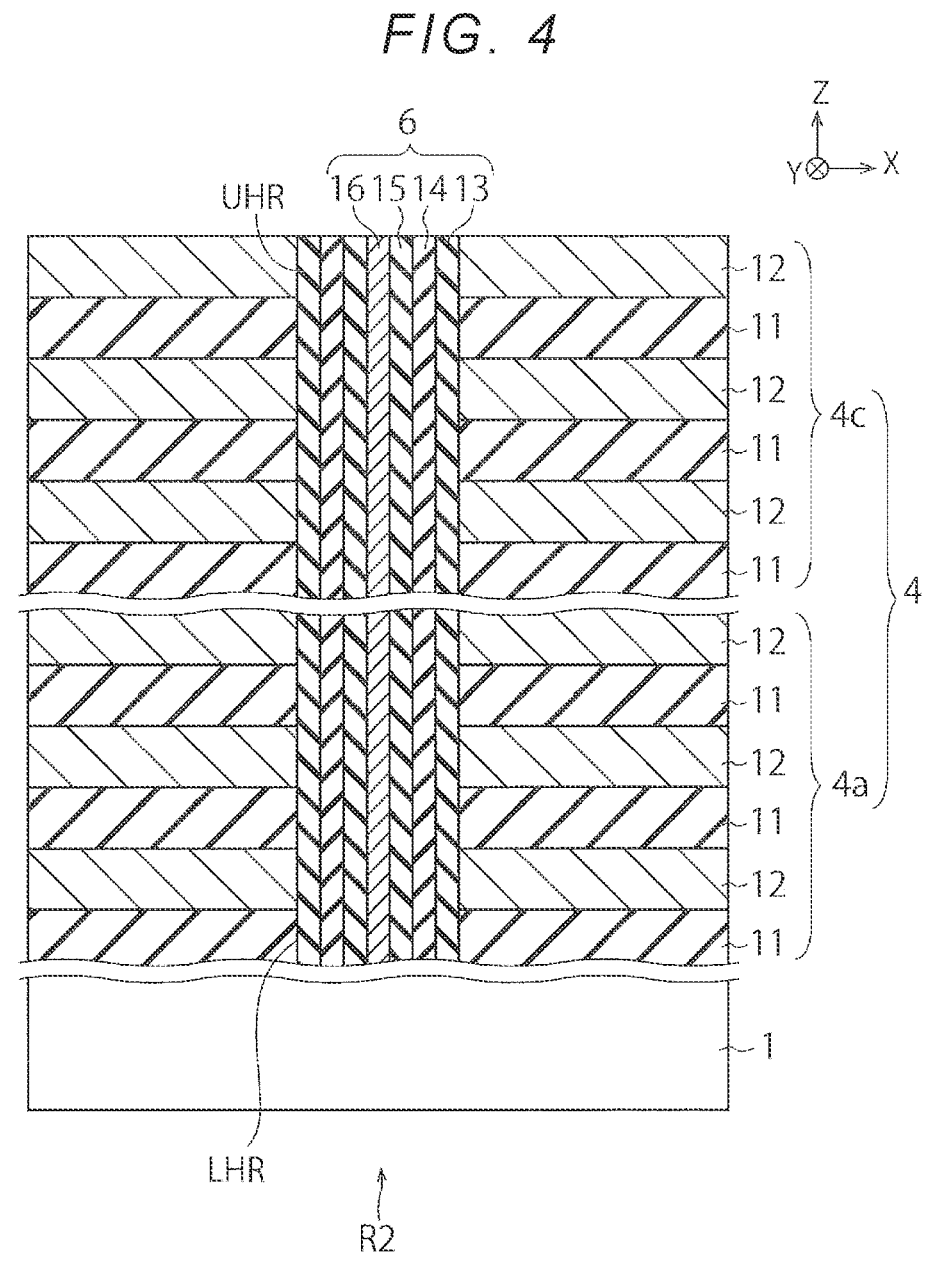

FIG. 4 is a cross-sectional view illustrating a structure of a column portion 6 (support column portion) according to the first embodiment. FIG. 4 illustrates one of the plurality of column portions 6 of the present embodiment.

As illustrated in FIG. 4, each column portion 6 of the present embodiment includes a block insulating film 13, a charge storage layer 14, a tunnel insulating film 15, and a channel semiconductor layer 16 which are sequentially formed. In FIG. 4, the channel semiconductor layer 16 has a solid columnar shape extending in the Z direction. The tunnel insulating film 15, the charge storage layer 14, and the block insulating film 13 have a hollow columnar shape extending in the Z direction, and sequentially surround side surfaces of the channel semiconductor layer 16 in a tubular shape. Each column portion 6 may further include a core insulating film inside the channel semiconductor layer 16. In this case, the core insulating film in the column portion 6 may be formed of a material the same as a material of the core insulating film in the columnar portion 5.

Figures 5A, 5B:
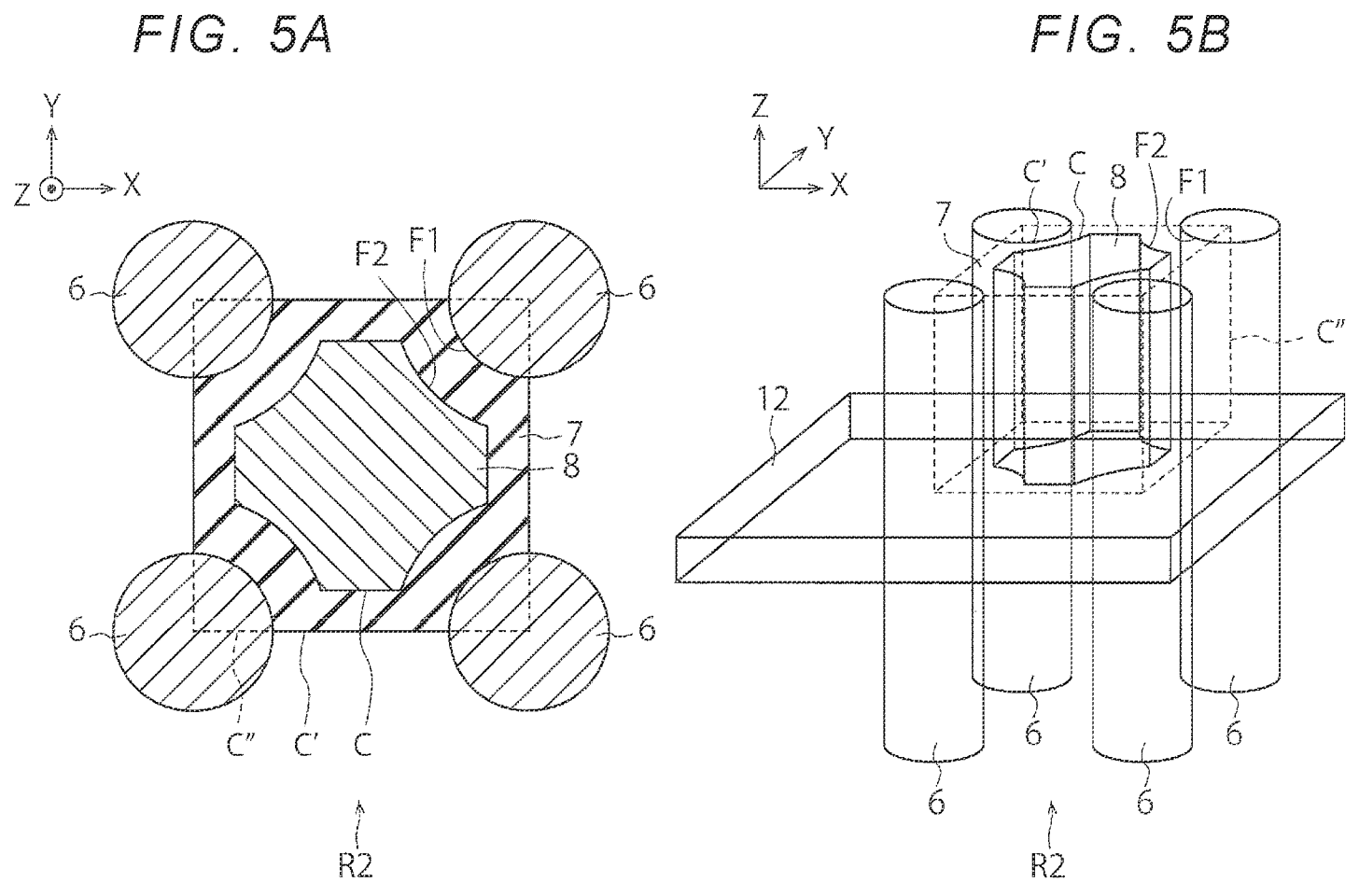

FIGS. 5A and 5B are a plan view and a perspective view illustrating an example of a structure of a contact region according to the first embodiment.

FIG. 5A illustrates an XY cross-sectional shape of one contact plug 8, one insulating film 7 formed on the side surface of the contact plug 8, and four column portions 6 arranged near the contact plug 8. FIG. 5B further illustrates one electrode layer 12 electrically connected to the contact plug 8.

FIG. 5A illustrates a contact hole C", a contact hole C', and the contact hole C. According to the present embodiment, the contact hole C" is formed in the stacked film 4, a sacrificial layer (material) is formed in the contact hole C", and then the column portion 6 is formed in the stacked film 4 before performing of the replacement process on the stacked film 4. Next, the sacrificial layer is removed from the contact hole C" after performing the replacement process. As a result, a contact hole C' is formed in the stacked film 4. Next, the insulating film 7 and the contact plug 8 are sequentially formed in the contact hole C'. The contact hole C corresponds to a hole in which the contact hole C' is narrowed by the insulating film 7. The contact plug 8 is formed in the contact hole C. Shapes of the contact holes C", C', and C are also illustrated in FIG. 5B.

The column portions 6 are formed in the stacked film 4, the contact hole C' is formed in a region between the column portions 6, and the insulating film 7 and the contact plug 8 are formed in the contact hole C'. Therefore, the shape of the side surface of the contact plug 8 is affected by the shape of the column portions 6.

In FIG. 5A, a side surface F1 of the upper right column portion 6 faces a side surface F2 of the contact plug 8. The side surface F1 is a part of the full side surface of the upper right column portion 6, and the side surface F2 is a part of the full side surface of the contact plug 8. A shape of the side surface F1 is convex in a direction toward the side surface F2, and a shape of the side surface F2 is concave in a direction toward the side surface F1. This is because the shape of the side surface F2 is affected by the shape of the side surface F1. In FIG. 5A, since the shape of the XY cross section of each column portion 6 is circular, the shape of the XY cross section of the side surface F1 is an arc shape centered on a central axis of an upper right column portion 6. As a result, the shape of the XY cross section of the side surface F2 is also an arc shape centered on the central axis of the upper right column portion 6. In FIG. 5A, the same relationship is established between the other three column portions 6 and the contact plug 8. The shapes of the side surfaces F1 and F2 are also illustrated in FIG. 5B. The side surface F1 is an example of a first side surface, and the side surface F2 is an example of a second side surface. An interface between the upper right column portion 6 and the insulating film 7 exists at the position of the side surface F1. This interface protrudes in a direction toward the insulating film 7 in the XY cross section illustrated in FIG. 5A.

In FIG. 5A, a side surface F1 of the upper right column portion 6 faces a side surface F2 of the contact plug 8 through the interposed insulating film 7. As a result, the contact plug 8 is not in contact with the upper right column portion 6 as illustrated in FIG. 5B. The same relationship is established between the other three column portions 6 and the contact plug 8. As illustrated in FIG. 5B, the insulating film 7 is formed in a tubular shape on the side surface of the contact plug 8. Accordingly, in the XY cross section illustrated in FIG. 5A, the contact plug 8 is surrounded by the insulating film 7.

In FIG. 5A, the shape of the XY cross section of the contact plug 8 is close to an octagon. It is noted that four sides of the contact plug 8 shape have a linear portion, but the remaining portions of the four sides of the shape have an arc shape. In FIG. 5B, the shape of a any XY cross section of the contact plug 8 has the same shape. Accordingly, a shape of a bottom surface of the contact plug 8 is the same shape. In other words, the shape of the XY cross section of the contact hole C is similar to an octagon. The same applies to the contact hole C'. The outer shape of the XY cross section of the contact hole C" is a rectangular shape (for example, a regular square or a rectangle). The shape of the XY cross section of the contact hole C" may be a square shape with rounded corners (race track shape) as described later.

The shape of each column portion 6 illustrated in FIG. 5B is a columnar shape (cylindrical shape) having a fixed diameter, but may be a columnar shape that does not have a fixed diameter due to bowing or tapering. In this case, the shapes of the contact plug 8 at different XY cross sections will be different from each other, and for example, each has a shape of an octagon but with different areas.

In first and second comparative examples described below, the contact hole C' is formed by removing a part of each column portion 6. As a result, when the insulating film 7 and the contact plug 8 are formed on an upper surface of the electrode layer 12, the insulating film 7 is formed on not only the upper surface of the electrode layer 12 but also the upper surface of each column portion 6 having the same height as the upper surface of the electrode layer 12. The reason is that not only the upper surface of the electrode layer 12 but also the upper surface of each column portion 6 is exposed at a bottom surface of the contact hole C'. However, the contact hole C' of the present embodiment is formed without substantially removing each of the column portions 6. As a result, when the insulating film 7 and the contact plug 8 of the present embodiment are formed on the upper surface of the electrode layer 12, the insulating film 7 is formed on the upper surface of the electrode layer 12, but may not be formed on the upper surface of each column portion 6 at the same height as the upper surface of electrode layer 12 (FIG. 5B). The reason is that although the upper surface of the electrode layer 12 is exposed to the bottom surface of the contact hole C' of the present embodiment, the upper surface of each column portion 6 is not exposed. In FIG. 5B, the shape of the XY cross section of each column portion 6 is circular above the upper surface of the electrode layer 12 and also below the upper surface of the electrode layer 12.

Figures 6A, 6B:
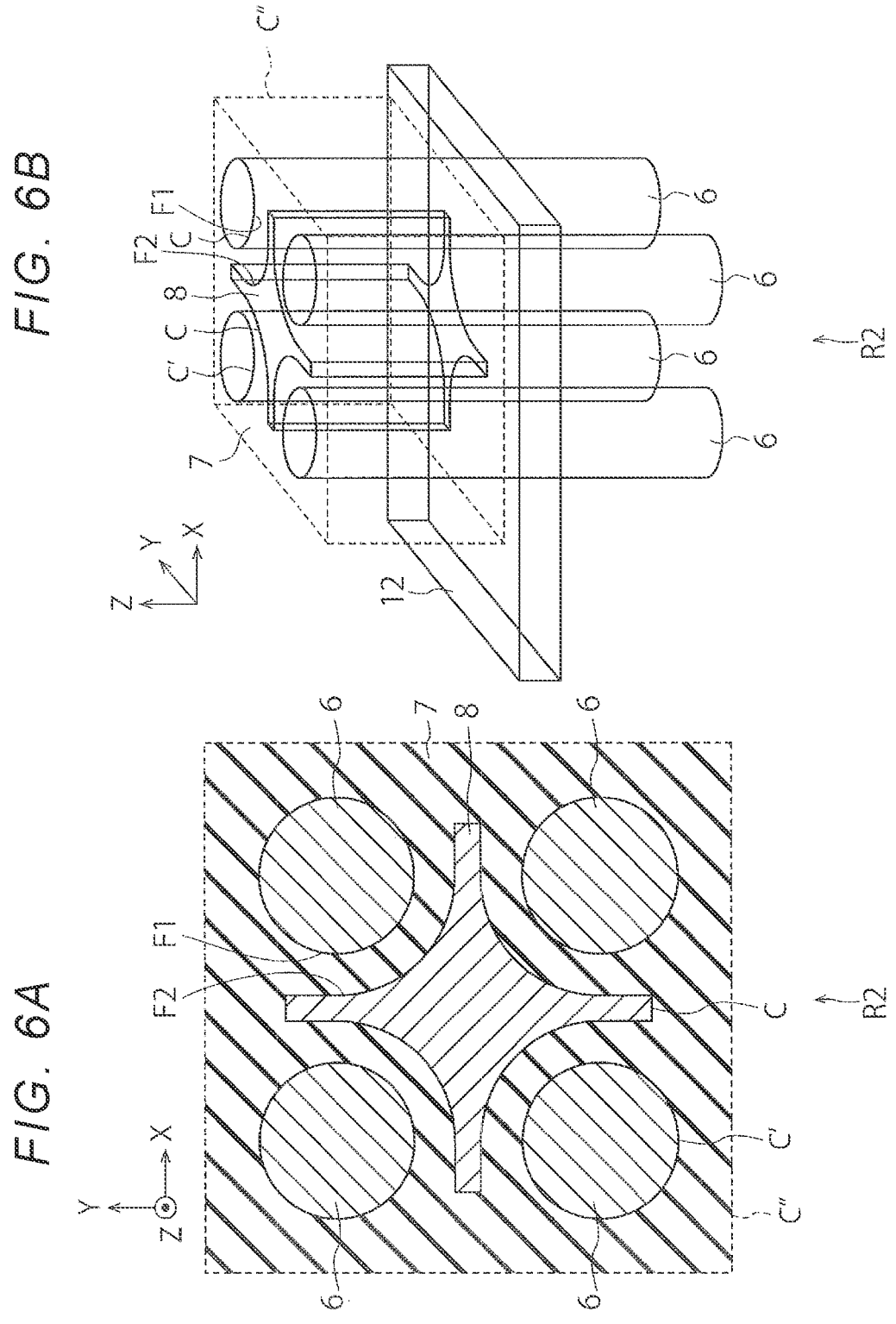
FIGS. 6A and 6B are, respectively, a plan view and a perspective view illustrating another example of a structure of a contact region of the first embodiment.

FIGS. 6A and 6B are a plan view and a perspective view illustrating another example of the structure of the contact region of the first embodiment.

FIGS. 6A and 6B correspond to FIGS. 5A and 5B, respectively. The four column portions 6 illustrated in FIG. 5A are formed at a position overlapping the side surface of the contact hole C". However, the four column portions 6 illustrated in FIG. 6A are formed inside the side surface of the contact hole C. Accordingly, in the XY cross section illustrated in FIG. 6A, each column portion 6 is surrounded by the insulating film 7. As described above, each column portion 6 may be formed at a position overlapping the side surface of the contact hole C" or may be formed at a position not overlapping the side surface of the contact hole C".

Figure 7:
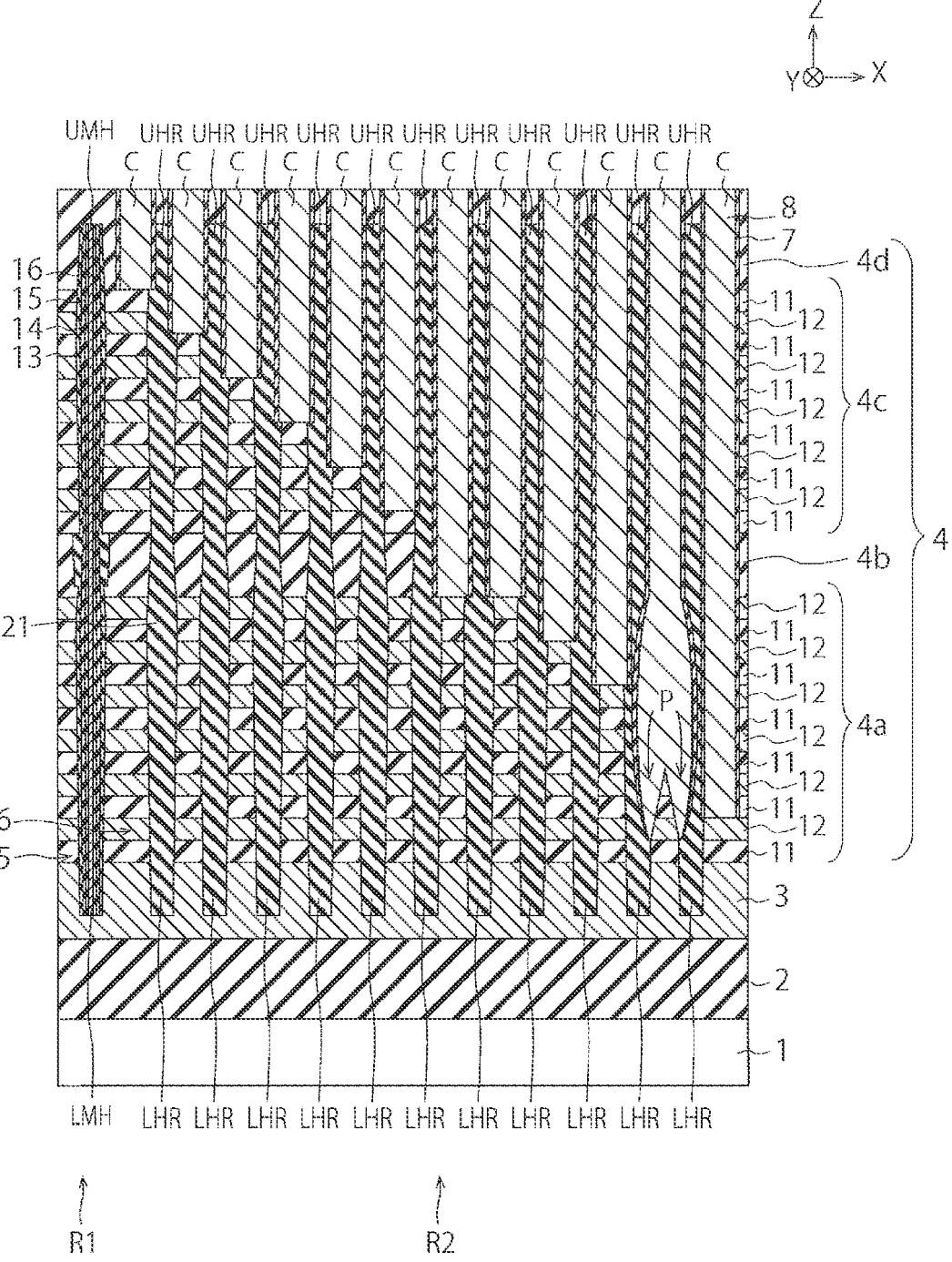
FIG. 7 is a cross-sectional view illustrating a structure of a semiconductor device according to a first comparative example.

FIG. 7 is a cross-sectional view illustrating a structure of a semiconductor device according to a first comparative example of the first embodiment.

As in the semiconductor device of the first embodiment (FIG. 1), the semiconductor device of the first comparative example (FIG. 7) includes a substrate 1, an interlayer insulating film 2, a source layer 3, a stacked film 4, a plurality of columnar portions 5, a plurality of column portions 6, a plurality of insulating films 7, and a plurality of contact plugs 8. FIG. 7 illustrates one of the plurality of columnar portions 5, eleven of the plurality of column portions 6, and twelve of the plurality of contact plugs 8. Each column portion 6 of the this first comparative example includes an insulating film 21. The insulating film 21 is, for example, a SiO$_2$ film.

In this first comparative example, a column portion 6 is formed in the stacked film 4, a contact hole C is formed in the stacked film 4, and a contact plug 8 is embedded in the contact hole C. More specifically, a lower hole LHR is formed in the stacked film 4, a part of the column portion 6 is formed in the lower hole LHR, and then a part of the contact hole C is formed. Moreover, an upper hole UHR is formed in the stacked film 4, a remaining portion of the column portion 6 is formed in the upper hole UHR, and then a remaining portion of the contact hole C is formed. There-fore, when a seam is formed in a column portion 6, the contact hole C formed after the column portion 6 is formed may expand the seam. A reference symbol P illustrated in FIG. 7 indicates a protruding portion of a contact plug 8 generated by the expansion of a seam. When such a pro-truding portion is generated, the resulting contact plug 8 may be electrically connected to the electrode layer 12 different from the electrode layer 12 to which it is intended to be connected. This may cause a short circuit between the electrode layers 12.

Each column portion 6 of this first comparative example is formed of only the insulating film 21. The insulating film 21 is, for example, a SiO$_2$ film. In this case, the insulating film 21 may shrink due to the chemicals used in the replacement process. As a result, the entire semiconductor device may shrink dimensionally in the Z direction. The reason is that when the stacked film 4 becomes a "loosened structure" formed on only the insulating films 11, 4b, and 4d through the replacement process, a stress caused by the shrinkage of the insulating film 21 may deform the stacked film 4.

In addition, when the contact hole C is formed after forming the column portion 6 as in this first comparative example, a part of the column portion 6 is removed at this time. As a result, an action of the column portion 6 for preventing the stacked film 4 from being broken during the replacement process may be weakened.

On the other hand, according to the first embodiment, the sacrificial material is formed in the stacked film 4 before the column portion 6 is formed, and the sacrificial material is removed after the column portion 6 is formed, thereby forming the contact hole C in a region between the column portions 6. Accordingly, it is possible to form the contact hole C without substantially removing the column portion 6. As a result, it is possible to prevent the contact hole C from expanding the seam in the column portion 6. In addition, since the column portion 6 of the first embodiment is formed of the block insulating film 13, the charge storage layer 14, the tunnel insulating film 15, and the channel semiconductor layer 16 rather than just SiO$_2$, shrinkage can be prevented. The reason is that the column portion 6 includes not only a material (for example, a SiO$_2$ film) that is easily shrunk but also a material that is hardly shrunk (for example, a SiN film or a Si film).

Figure 8:
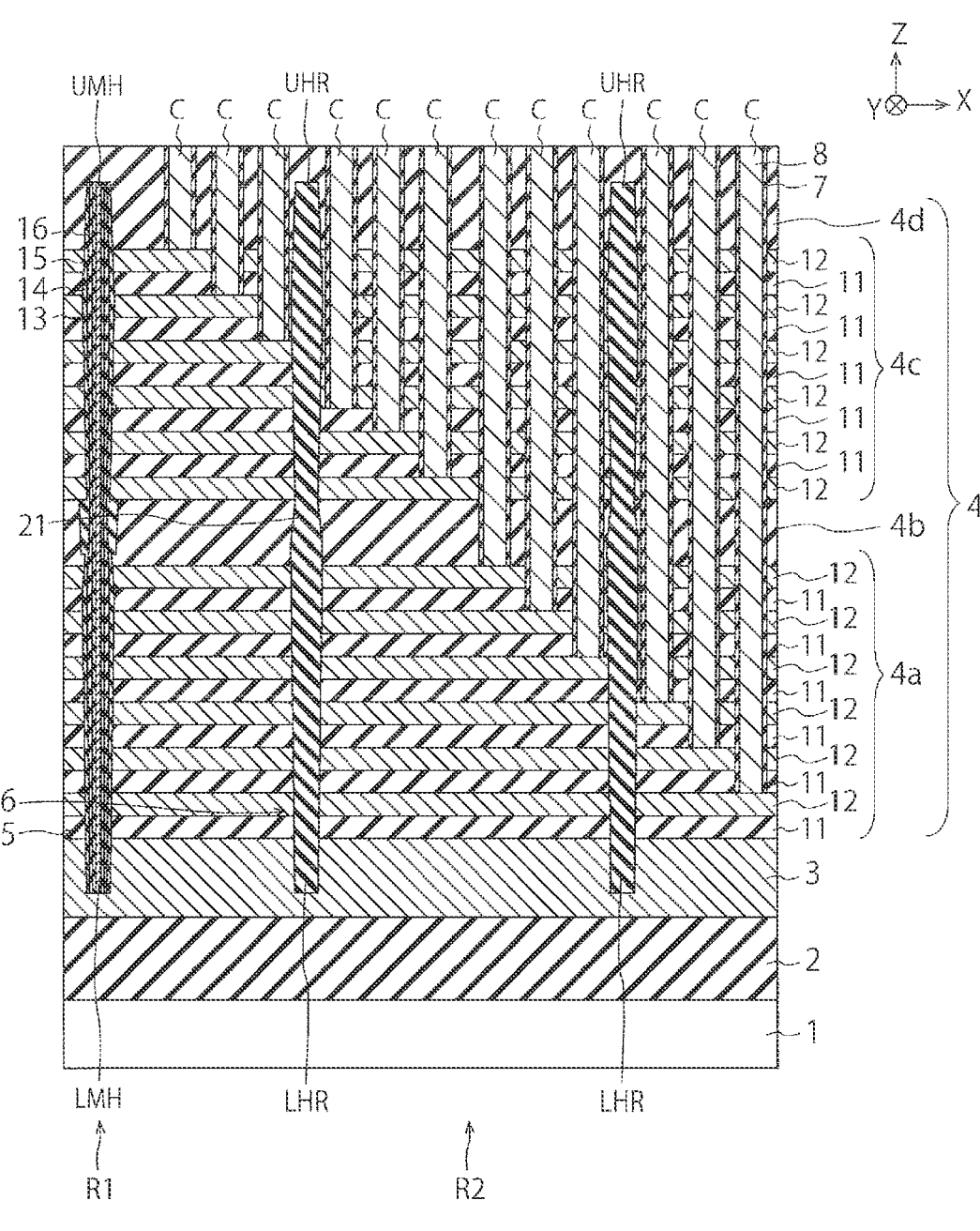
FIG. 8 is a cross-sectional view illustrating a structure of a semiconductor device according to a second comparative example.

FIG. 8 is a cross-sectional view illustrating a structure of a semiconductor device according to a second comparative example of the first embodiment.

As in the semiconductor device of the first comparative example (FIG. 7), the semiconductor device of the second comparative example (FIG. 8) includes a substrate 1, an interlayer insulating film 2, a source layer 3, a stacked film 4, a plurality of columnar portions 5, a plurality of column portions 6, a plurality of insulating films 7, and a plurality of contact plugs 8. FIG. 8 illustrates one of the plurality of columnar portions 5, two of the plurality of column portions 6, and twelve of the plurality of contact plugs 8. A cross section of the semiconductor device illustrated in FIG. 7 may be different from a cross section of the semiconductor device illustrated in FIG. 8.

In the second comparative example, problems similar to those in the first comparative example may arise. According to the first embodiment, such a problem can be solved as described above.

Figures 9A, 9B:
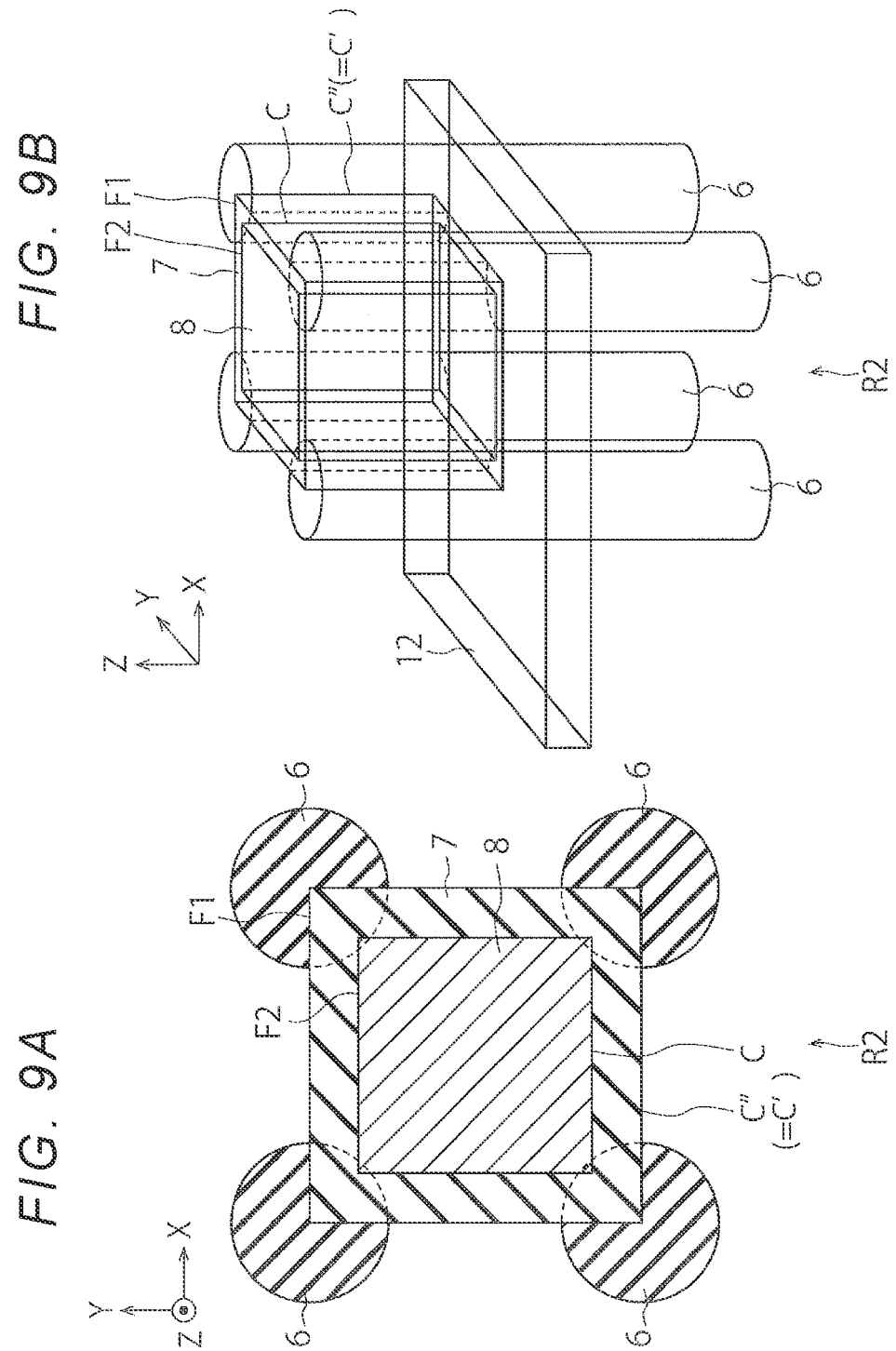
FIGS. 9A and 9B are, respectively, a plan view and a perspective view illustrating an example of a structure of a contact region according to the first comparative example.

FIGS. 9A and 9B are a plan view and a perspective view illustrating an example of a structure of a contact region according to the second comparative example.

FIG. 9A illustrates an XY cross-sectional shape of one contact plug 8, one insulating film 7 formed on the side surface of the contact plug 8, and four column portions 6 arranged near the contact plug 8. FIG. 9B further illustrates one electrode layer 12 electrically connected to the contact plug 8.

FIG. 9A illustrates the contact hole C" and the contact hole C. According to this second comparative example, the column portion 6 is formed in the stacked film 4, the contact hole C' is formed in the stacked film 4, and the insulating film 7 and the contact plug 8 are sequentially formed in the contact hole C'. The contact hole C corresponds to a hole in a state where the contact hole C" is narrowed by the insulating film 7. The contact plug 8 is formed in the contact hole C. A shape of the contact hole C" is also illustrated in FIG. 9B. The contact hole C" of this second comparative example corresponds to the contact hole C" of the first embodiment and also the contact hole C' of the first embodi-ment.

In FIG. 9A, a side surface F1 of the upper right column portion 6 faces a side surface F2 of the contact plug 8. The shape of the side surface F2 of this second comparative example is affected by the shape of the side surface F1. It is noted that according to this second comparative example, the shape of the side surface F1 is convex in a direction toward the side surface F2, and the shape of the side surface F2 is concave in a direction toward the side surface F1. The reason why the shape of the side surface F1 is concave is that a part of the upper right column portion 6 is removed when the contact hole C" is formed. The shapes of the side surfaces F1 and F2 are also illustrated in FIG. 9B.

The contact hole C" of this second comparative example is formed by removing a part of each of the adjacent column portions 6. As a result, when the insulating film 7 and the contact plug 8 are formed on an upper surface of the electrode layer 12, the insulating film 7 is formed on not only the upper surface of the electrode layer 12 but also the upper surface of each column portion 6 having the same height as the upper surface of the electrode layer 12 (FIG. 9B). The reason is that not only the upper surface of the electrode layer 12 but also the upper surface of each column portion 6 is exposed at the bottom surface of the contact hole C. In FIG. 9B, the shape of the XY cross section of each column portion 6 is a fan shape above the upper surface of the electrode layer 12, and is circular below the upper surface of the electrode layer 12.

The contact hole C' of the first embodiment is formed without substantially removing any portion of the column portions 6. As a result, when the insulating film 7 and the contact plug 8 of the present embodiment are formed on just the upper surface of the electrode layer 12, the insulating film 7 is formed on the upper surface of the electrode layer 12, but need not be formed on the upper surface of each column portion 6 at the same height as the upper surface of the electrode layer 12 (FIG. 5B). The reason is that although the upper surface of the electrode layer 12 is exposed at the bottom surface of the contact hole C' of the first embodiment, the upper surface of each adjacent column portion 6 is not exposed. In FIG. 5B, the shape of the XY cross section of each column portion 6 is fully circular above the upper surface of the electrode layer 12 and also below the upper surface of the electrode layer 12.

Figures 10A, 10B:
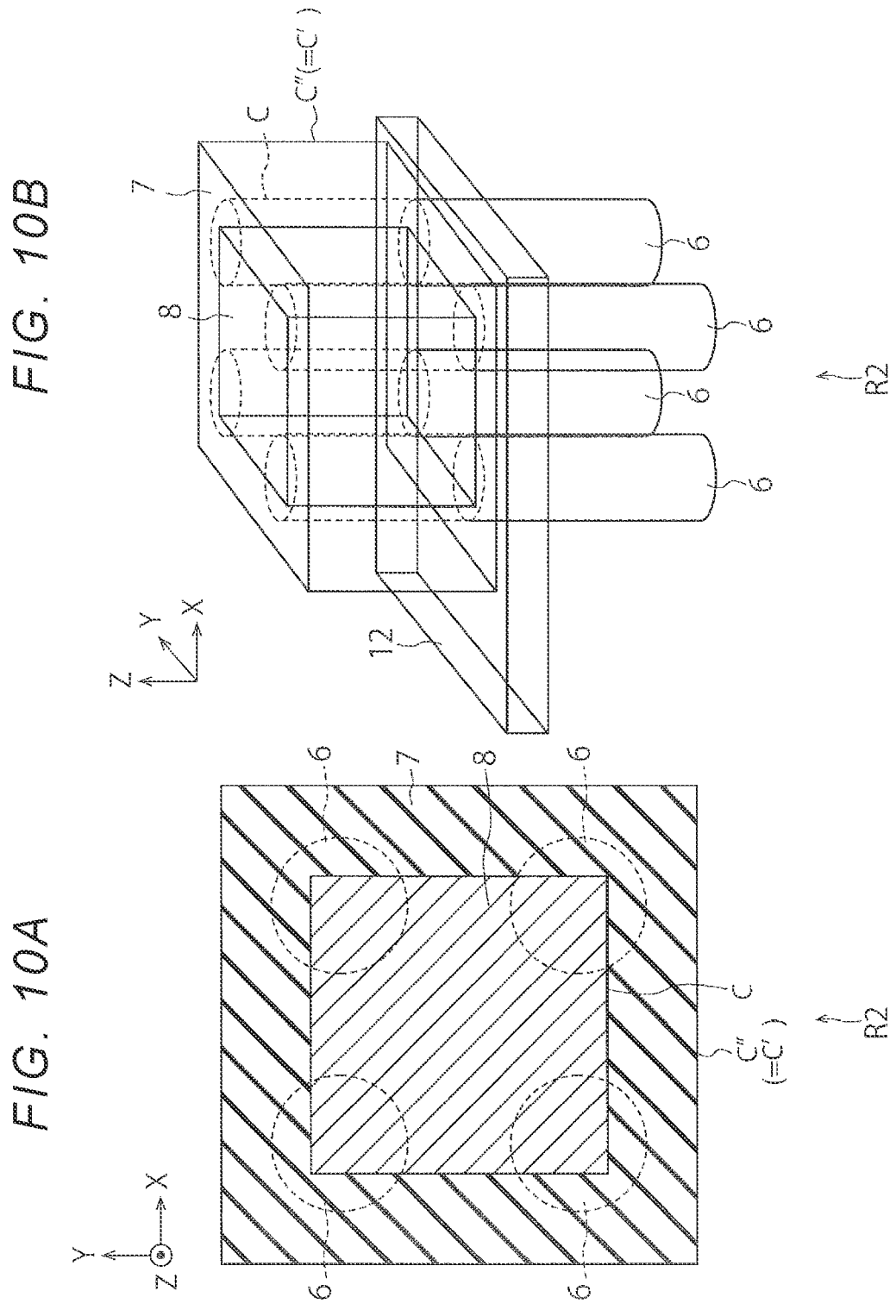
FIGS. 10A and 10B are, respectively, a plan view and a perspective view illustrating another example of a structure of a contact region according to the first comparative example.

FIGS. 10A and 10B are a plan view and a perspective view illustrating another example of the structure of the contact region according to this second comparative example.

FIGS. 10A and 10B correspond to FIGS. 9A and 9B, respectively. The contact hole C" illustrated in FIG. 10A is formed at a position overlapping the entire four adjacent column portions 6 in a plan view. Therefore, the entire column portion 6 is removed above the upper surface of the electrode layer 12 illustrated in FIG. 10B. FIG. 10B illustrates the column portions 6 remaining only under the upper surface of the electrode layer 12.

(2) Method for Manufacturing Semiconductor Device

FIGS. 11A to 13B are cross-sectional views illustrating a method for manufacturing the semiconductor device according to the first embodiment.

Figures 11A, 11B:
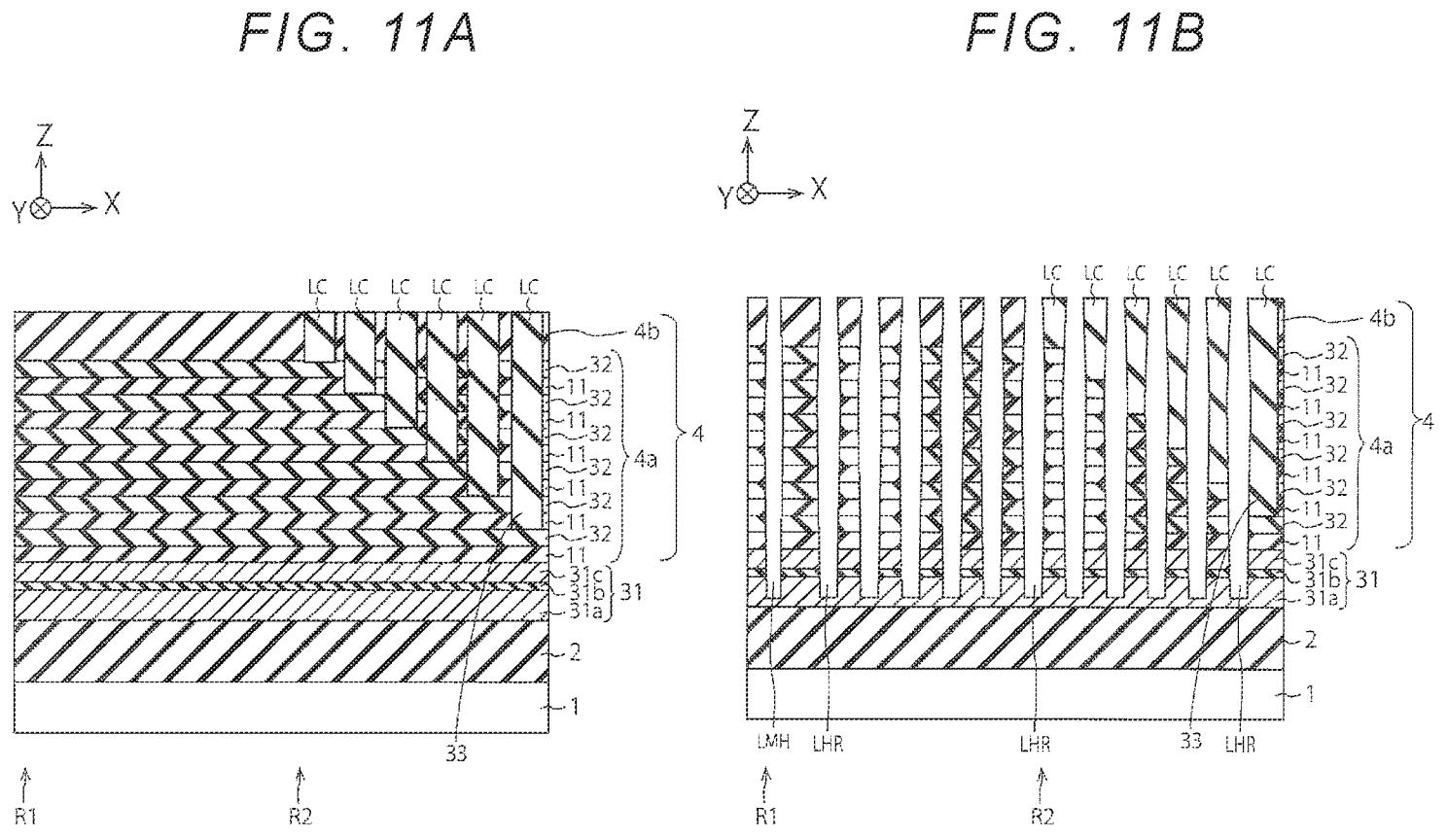

First, the substrate 1 is prepared to sequentially form the interlayer insulating film 2, the sacrificial layer 31, the lower stacked film 4a, and the insulating film 4b on the substrate 1 (FIG. 11A). The sacrificial layer 31 includes a semiconductor layer 31a, an insulating film 31b, and a semiconductor layer 31c which are sequentially formed on the interlayer insulating film 2. The semiconductor layer 31a is, for example, a polysilicon layer. The insulating film 31b is, for example, a SiN film. The semiconductor layer 31c is, for example, a polysilicon layer. The lower stacked film 4a includes a plurality of insulating films 11 and a plurality of sacrificial layers 32 which are alternately formed on the sacrificial layer 31. The sacrificial layer 32 is, for example, a SiN film. The sacrificial layer 32 is an example of the first layer. FIG. 11A further illustrates a cell region R1 and a contact region R2 of the stacked film 4 including the lower stacked film 4a and the insulating film 4b.

Next, a plurality of lower contact holes C are formed in the insulating film 4b and the lower stacked film 4a by lithography and reactive ion etching (RIE) (FIG. 11A). The lower contact hole LC is a part of the contact hole C". Each lower contact hole LC is formed on the corresponding sacrificial layer 32 in the contact region R2. FIG. 11A illustrates six lower contact holes LC respectively formed in the six sacrificial layers 32. The contact hole C" is an example of a first hole, and the lower contact hole LC is an example of a lower hole which is a part of the first hole.

Next, a sacrificial layer 33 is formed in each lower contact hole LC (FIG. 11A). The sacrificial layer 33 is, for example, an amorphous silicon layer. The sacrificial layer 33 is an example of a lower layer that is a part of the second layer.

Next, a plurality of lower memory holes LMH and a plurality of lower holes LHR are formed in the insulating film 4b, the lower stacked film 4a, and the sacrificial layer 31 by lithography and RIE (FIG. 11B). FIG. 11B illustrates one of the plurality of lower memory holes LMH and eleven of the plurality of lower holes LHR. The lower memory hole LMH is formed in the cell region R1, and the lower hole LHR is formed in the contact region R2. In the first embodiment, the lower memory hole LMH and the lower hole LHR are formed simultaneously by the same lithography and RIE. The lower hole LHR illustrated in FIG. 11B removes a part of the sacrificial layer 33. The lower hole LHR is an example of a third hole and a fourth hole.

Figures 12A, 12B:
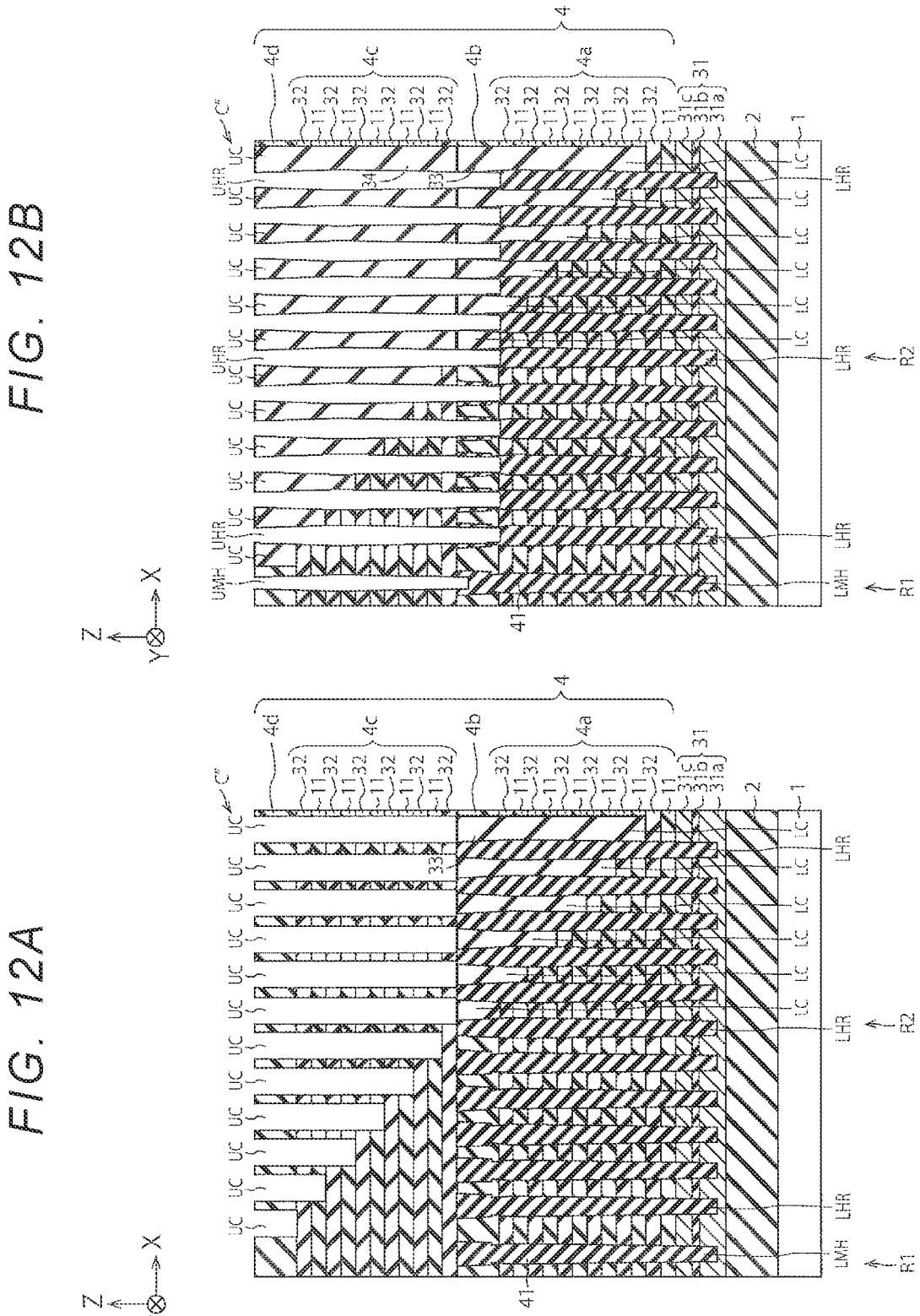
FIGS. 12A and 12B are cross-sectional views illustrating the method for manufacturing a semiconductor device according to the first embodiment.

Next, a sacrificial layer 41 is formed in each of the lower memory holes LMH and the lower holes LHR (FIG. 12A). The sacrificial layer 41 is, for example, a carbon (C) layer. The sacrificial layer 41 is an example of a third layer.

Next, the upper stacked film 4c and the insulating film 4d are formed on the insulating film 4b (FIG. 12A). The upper stacked film 4c includes a plurality of insulating films 11 and a plurality of sacrificial layers 32 which are alternately formed on the insulating film 4b. The sacrificial layer 32 in the upper stacked film 4c is, for example, a SiN film. The sacrificial layer 32 in the upper stacked film 4c is also an example of a first layer.

Next, a plurality of upper contact holes UC are formed in the insulating film 4d and the upper stacked film 4c by lithography and RIE (FIG. 12A). The upper contact hole UC is also a part of the contact hole C". Each upper contact hole UC is formed on a corresponding sacrificial layer 32 in the upper stacked film 4c or on a corresponding sacrificial layer 33 in the lower stacked film 4a within the contact region R2. FIG. 12A illustrates six upper contact holes UC formed on six different sacrificial layers 32, respectively, and six upper contact holes UC formed on six different sacrificial layers 33, respectively. The upper contact hole UC on the sacrificial layer 32 individually forms a contact hole C", and the upper contact hole UC on the sacrificial layer 33 forms a contact hole C" together with the lower contact hole LC. The upper contact hole UC is an example of an upper hole that is a part of the first hole.

Next, a sacrificial layer 34 is formed in each upper contact hole UC (FIG. 12B). The sacrificial layer 34 is, for example, an amorphous silicon layer. The sacrificial layer 34 is an example of an upper layer that is a part of the second layer.

Next, a plurality of upper memory holes UMH and a plurality of upper holes UHR are formed in the insulating film 4d, the upper stacked film 4c, and the insulating film 4b by lithography and RIE (FIG. 12B). FIG. 12B illustrates one of the plurality of upper memory holes UMH and eleven of the plurality of upper holes UHR. Each upper memory hole LMH is formed on the corresponding sacrificial layer 41 in the lower memory hole LMH within the cell region R1, and each upper hole LHR is formed on the corresponding sacrificial layer 41 in the lower hole LHR within the contact region R2. In the first embodiment, the upper memory hole UMH and the upper hole UHR are formed simultaneously by the same lithography and RIE steps. The upper hole UHR illustrated in FIG. 12B removes a part of the sacrificial layers 34 and 33. The upper hole UHR is an example of a third hole and a fifth hole.

Figures 13A, 13B:
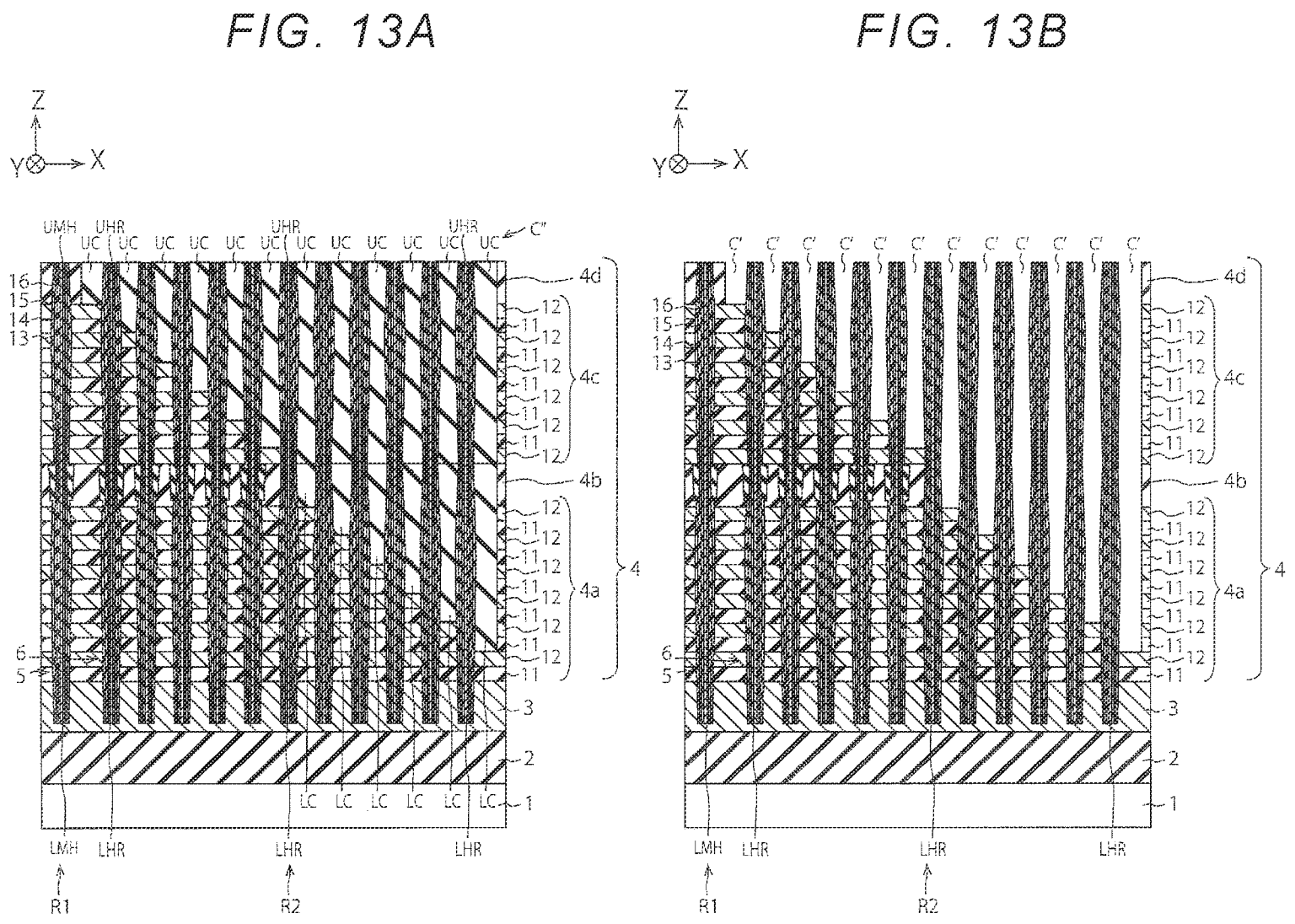

Next, the sacrificial layer 41 is removed from the lower memory hole LMH and the lower hole LHR (FIG. 13A). Next, a block insulating film 13, a charge storage layer 14, a tunnel insulating film 15, and a channel semiconductor layer 16 are formed in each of the lower memory hole LMH, the upper memory hole UMH, the lower hole LHR, and the upper hole UHR (FIG. 13A). As a result, each columnar portion 5 is formed in a paired lower memory hole LMH and upper memory hole UMH, and each column portion 6 is formed in a paired lower hole LHR and upper hole UHR. In the first embodiment, the columnar portion 5 and the column portion 6 are formed simultaneously of the same materials. Accordingly, it is possible to easily form the columnar portion 5 and the column portion 6.

Next, a plurality of slits is formed in the stacked film 4, and each sacrificial layer 32 is removed by wet etching via the slits (FIG. 13A). As a result, a plurality of cavities are formed in the stacked film 4. The wet etching is performed using, for example, a chemical liquid containing phosphoric acid. Next, a plurality of electrode layers 12 are formed in these cavities using the slits (FIG. 13A). In this manner, the plurality of sacrificial layers 32 in the stacked film 4 are replaced with the plurality of electrode layers 12 (in a replacement process). Similarly, the sacrificial layer 31 is replaced with the source layer 3. The source layer 3 is electrically connected to the channel semiconductor layer 16 in each columnar portion 5.

Next, the sacrificial layers 33 and 34 are removed to form a plurality of contact holes C' in the stacked film 4 (FIG. 13B). Each contact hole C' is formed on a corresponding electrode layer 12. Each contact hole C' illustrated in FIG. 13B has a size smaller than that of the corresponding contact hole C'''. The contact hole C' and the above-described contact hole C are examples of the second hole.

Thereafter, the insulating film 7 and the contact plug 8 are formed in the contact hole C'. Furthermore, various wiring layers, via plugs, interlayer insulating films, and the like are formed on the substrate 1. In this way, the semiconductor device of the first embodiment illustrated in FIG. 1 is manufactured.

When the insulating film 7 is formed in each contact hole C', the insulating film 7 can be conformally formed on the side surface and bottom surface of each contact hole C'. The insulating film 7 can then be removed from the bottom surface of each contact hole C' by RIE. As a result, an upper surface of the electrode layer 12 is exposed at the bottom of each contact hole C'. Next, a contact plug 8 is formed in each contact hole C'. The contact plug 8 is electrically connected to the electrode layer 12 at the bottom of the contact plug 8.

FIGS. 14A to 16B are cross-sectional views illustrating a method for manufacturing a semiconductor device according to a first comparative example. In the following those aspects of that are the same as in the method for manufacturing a semiconductor device according to the first embodiment will not necessarily be described.

Figures 14A, 14B:
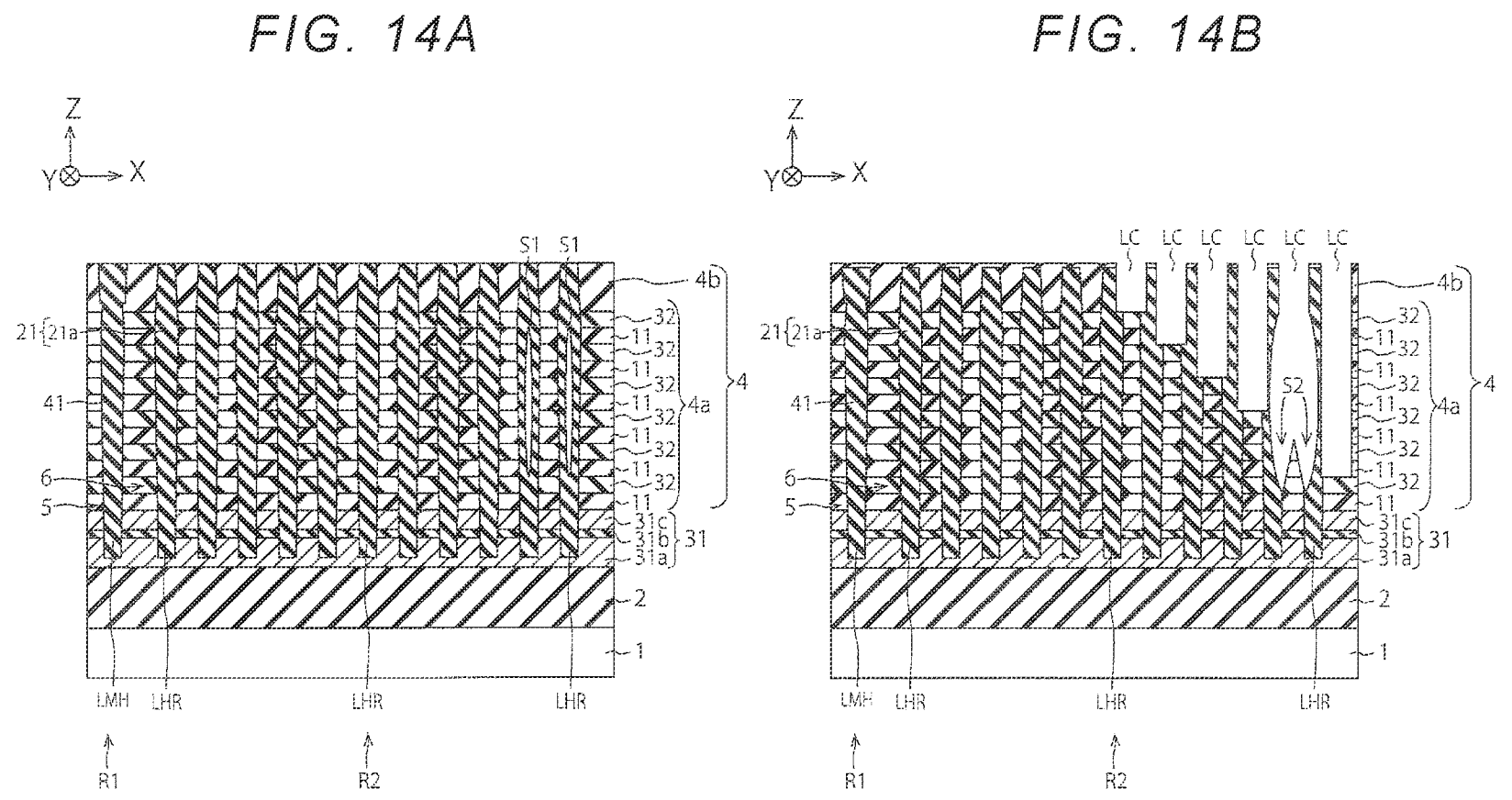

First, the substrate 1 is prepared to form the interlayer insulating film 2, the sacrificial layer 31, the lower stacked film 4a, and the insulating film 4b on the substrate 1 (FIG. 14A). The sacrificial layer 31 includes a semiconductor layer 31a, an insulating film 31b, and a semiconductor layer 31c which are formed on the interlayer insulating film 2. The lower stacked film 4a includes a plurality of insulating films 11 and a plurality of sacrificial layers 32 which are alternately formed on the sacrificial layer 31. FIG. 14A further illustrates a cell region R1 and a contact region R2 of the stacked film 4 including the lower stacked film 4a and the insulating film 4b.

Next, a plurality of lower memory holes LMH and a plurality of lower holes LHR are formed in the insulating film 4b, the lower stacked film 4a, and the sacrificial layer 31 by lithography and RIE (FIG. 14A). FIG. 14A illustrates just one of the plurality of lower memory holes LMH and eleven of the plurality of lower holes LHR. The lower memory hole LMH is formed in the cell region R1, and the lower hole LHR is formed in the contact region R2.

Next, a sacrificial layer 41 is formed in each lower memory hole LMH, and a lower insulating film 21a is formed in each lower hole LHR (FIG. 14A). The lower insulating film 21a is a part of the insulating film 21. In FIG. 14A, a seam S1 is formed in the two lower insulating films 21a. The lower insulating film 21a is, for example, a $SiO_2$ film.

Next, a plurality of lower contact holes LC are formed in the insulating film 4b and the lower stacked film 4a by lithography and RIE (FIG. 14B). The lower contact hole LC is a part of a contact hole C'''. Each lower contact hole LC is formed on the corresponding sacrificial layer 32 in the contact region R2. FIG. 14B illustrates six lower contact holes LC formed on the six sacrificial layers 32. FIG. 14B illustrates two seams S2 expanded from the seams S1 by RIE.

Figures 15A, 15B:
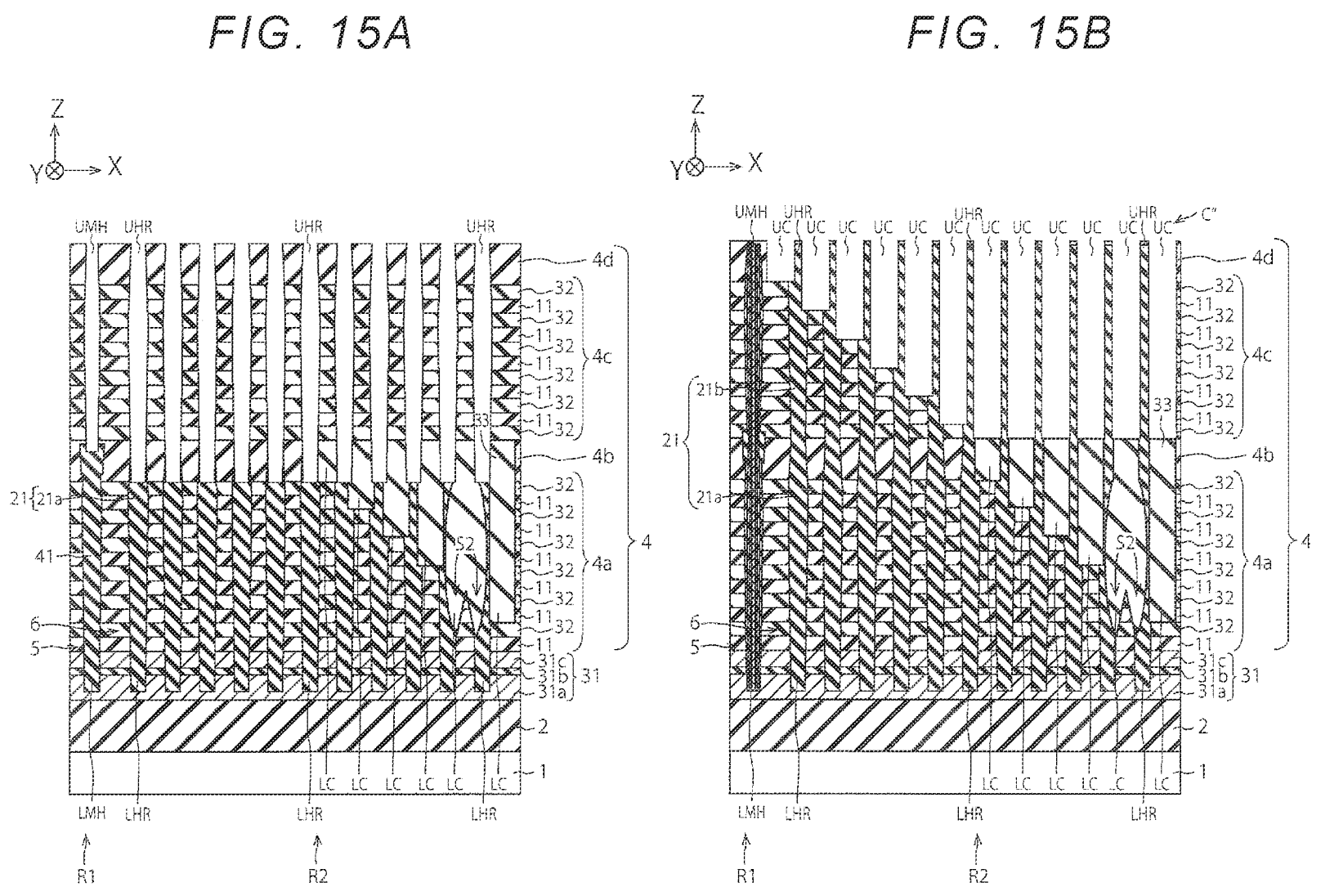

Next, a sacrificial layer 33 is formed in each lower contact hole LC (FIG. 15A). Next, the upper stacked film 4c and the insulating film 4d are formed on the insulating film 4b (FIG. 15A). The upper stacked film 4c includes a plurality of insulating films 11 and a plurality of sacrificial layers 32 which are alternately formed on the insulating film 4b.

Next, a plurality of upper memory holes UMH and a plurality of upper holes UHR are formed in the insulating film 4d, the upper stacked film 4c, and the insulating film 4b by lithography and RIE (FIG. 15A). FIG. 15A illustrates one of the plurality of upper memory holes UMH and eleven of the plurality of upper holes UHR. Each upper memory hole LMH is formed on the corresponding sacrificial layer 41 in the lower memory hole LMH within the cell region R1, and each upper hole LHR is formed on the corresponding lower insulating film 21a in the lower hole LHR within the contact region R2.

Next, the sacrificial layer 41 is removed from the lower memory holes LMH (FIG. 15B). Next, a block insulating film 13, a charge storage layer 14, a tunnel insulating film 15, and a channel semiconductor layer 16 are formed in each of the lower memory holes LMH and the upper memory holes UMH (FIG. 15B). As a result, each columnar portion 5 is formed in a paired lower memory hole LMH and upper memory hole UMH.

Next, an upper insulating film 21b, which is a part of the insulating film 21, is formed in each upper hole UHR (FIG. 15B). As a result, each column portion 6 is formed in a paired lower hole LHR and upper hole UHR. The upper insulating film 21b is, for example, a $SiO_2$ film.

Next, a plurality of upper contact holes UC are formed in the insulating film 4d and the upper stacked film 4c by lithography and RIE (FIG. 15B). The upper contact hole UC is also a part of the contact hole C'''. Each upper contact hole UC is formed on the corresponding sacrificial layer 32 in the upper stacked film 4c or on the corresponding sacrificial layer 33 in the lower stacked film 4a, within the contact region R2. FIG. 15B illustrates six upper contact holes UC formed on six sacrificial layers 32, respectively, and six upper contact holes UC formed on six sacrificial layers 33, respectively. The former upper contact hole UC individually forms a contact hole C''', and the latter upper contact hole UC forms a contact hole C''' together with the lower contact hole LC.

Figures 16A, 16B:
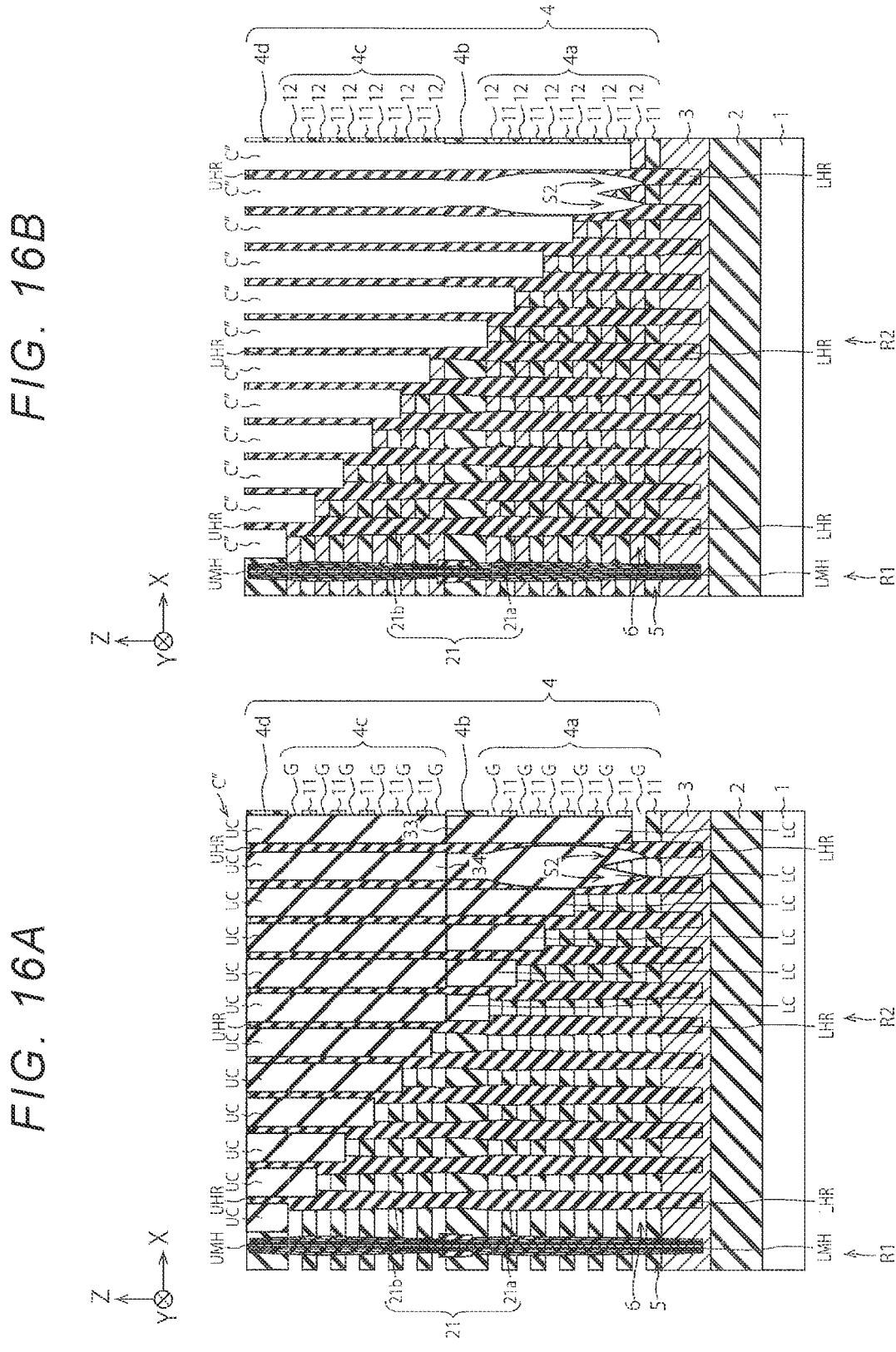
FIGS. 16A and 16B are cross-sectional views illustrating the method for manufacturing a semiconductor device according to the first comparative example.

Next, a sacrificial layer 34 is formed in each upper contact hole UC (FIG. 16A). Next, a plurality of slits is formed in the stacked film 4, and each sacrificial layer 32 is removed from the slit by wet etching (FIG. 16A). As a result, a plurality of cavities are formed in the stacked film 4. Next, a plurality of electrode layers 12 are formed in these cavities using the slits (FIG. 16A). In this manner, the plurality of sacrificial layers 32 in the stacked film 4 are replaced with the plurality of electrode layers 12. Similarly, the sacrificial layer 31 is replaced with the source layer 3.

Next, the sacrificial layers 33 and 34 are removed to form a plurality of contact holes C'' in the stacked film 4 (FIG. 16B). Each contact hole C'' is formed on the corresponding electrode layer 12. A size of each contact hole C'' illustrated in FIG. 16B is substantially the sum of a size of the lower contact hole LC before being filled with the sacrificial layer 33 and a size of the upper contact hole UL before being filled with the sacrificial layer 34.

Thereafter, the insulating film 7 and the contact plug 8 are formed in each contact hole C. Further, various wiring layers, via plugs, interlayer insulating films, and the like are formed on the substrate 1. In this way, the semiconductor device of the present comparative example illustrated in FIG. 7 is manufactured.

When a contact plug 8 is formed in the contact hole C'' illustrated in FIG. 16B, a protruding portion P of the contact plug 8 is generated as illustrated in FIG. 7. Such a protruding portion causes a short circuit between the electrode layers 12. In the present comparative example, since the contact hole C'' is formed by removing a part of the column portion 6, the seam S1 is expanded to the seam S2 to generate the protruding portion by the seam S2. On the other hand, according to the present embodiment, the contact hole C' is formed without substantially removing the column portion 6, so that it is possible to prevent the occurrence of such problems.

FIGS. 17A to 23B are cross-sectional views illustrating a method for manufacturing a semiconductor device according to a first modified example. In the following description, the same matters as those of the method for manufacturing the semiconductor device of the first embodiment will not be described as appropriate.

Figures 17A, 17B:
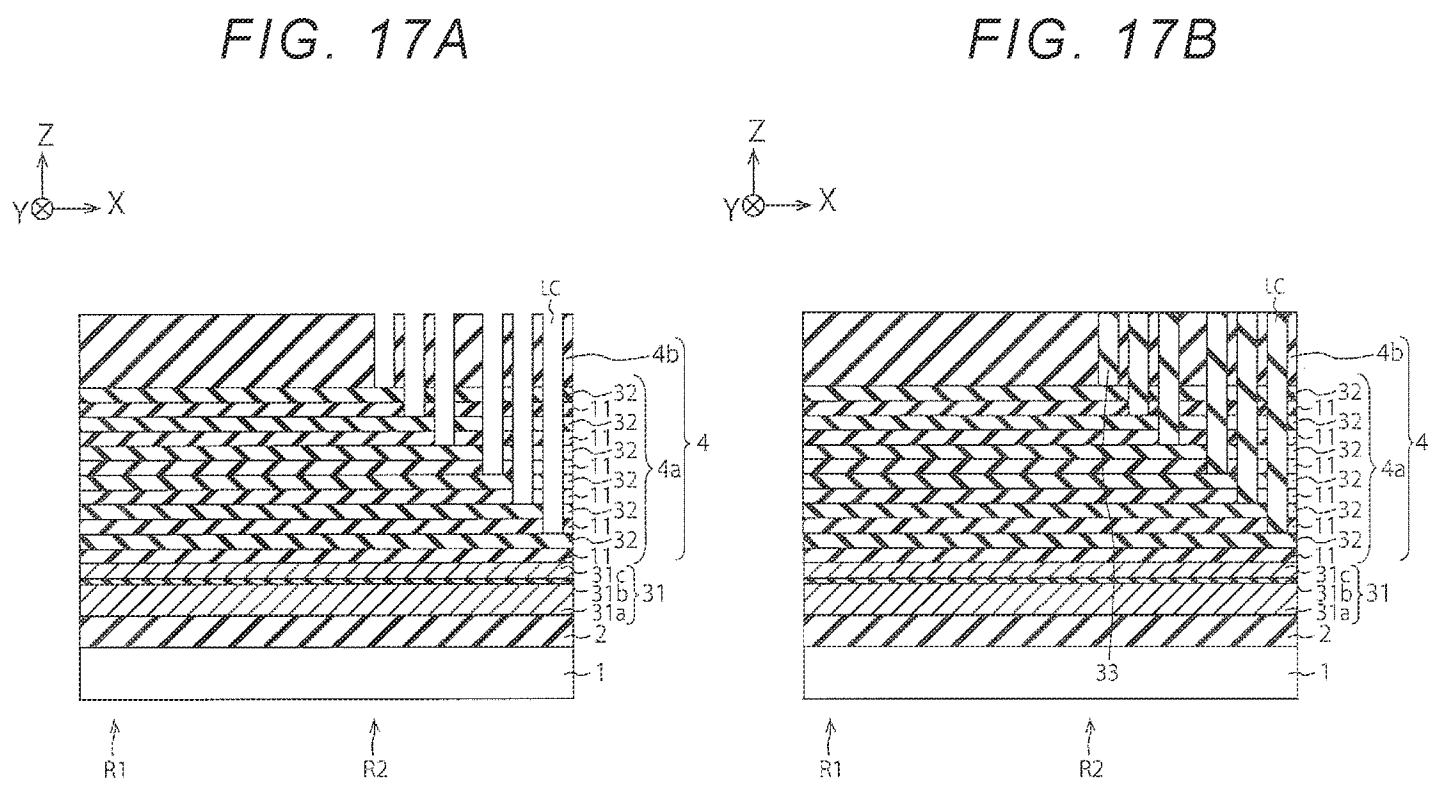

First, the substrate 1 is prepared to form the interlayer insulating film 2, the sacrificial layer 31, the lower stacked film 4a, and the insulating film 4b on the substrate 1 (FIG. 17A). The sacrificial layer 31 includes a semiconductor layer 31a, an insulating film 31b, and a semiconductor layer 31c which are sequentially formed on the interlayer insulating film 2. The lower stacked film 4a includes a plurality of insulating films 11 and a plurality of sacrificial layers 32 which are alternately formed on the sacrificial layer 31. FIG. 17A further illustrates a cell region R1 and a contact region R2 of the stacked film 4 including the lower stacked film 4a and the insulating film 4b.

Next, a plurality of lower contact holes LC are formed in the insulating film 4b and the lower stacked film 4a by lithography and RIE (FIG. 17A). The lower contact hole LC is a part of the contact hole C''. Each lower contact hole LC is formed on the corresponding sacrificial layer 32 in the contact region R2. FIG. 17A illustrates six lower contact holes LC respectively formed in the six sacrificial layers 32. Next, a sacrificial layer 33 is formed in each lower contact hole LC (FIG. 17B).

Figures 18A, 18B:
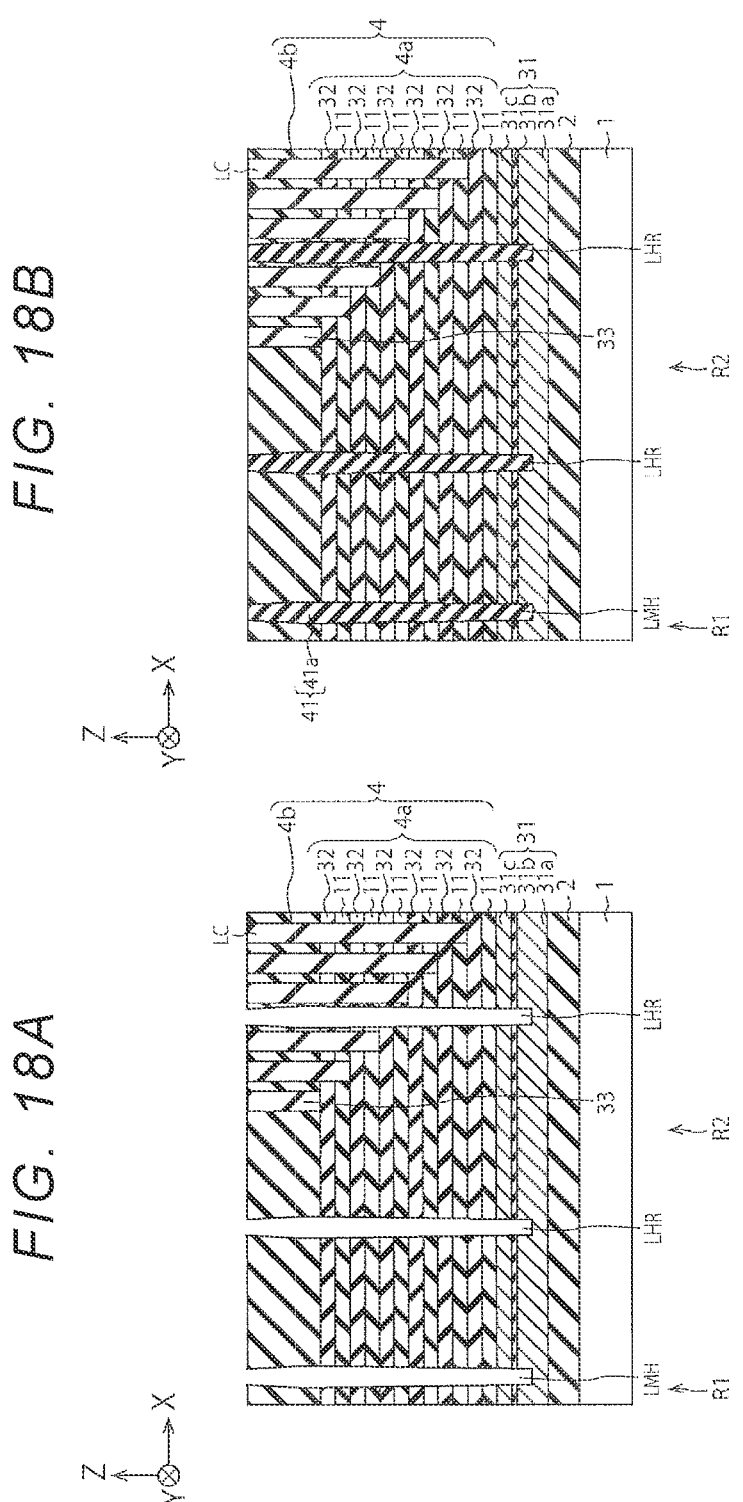
FIGS. 18A and 18B are cross-sectional views illustrating the method for manufacturing a semiconductor device according to the first modified example.

Next, a plurality of lower memory holes LMH and a plurality of lower holes LHR are formed in the insulating film 4b, the lower stacked film 4a, and the sacrificial layer 31 by lithography and RIE (FIG. 18A). FIG. 18A illustrates one of the plurality of lower memory holes LMH and two of the plurality of lower holes LHR. The lower memory hole LMH is formed in the cell region R1, and the lower hole LHR is formed in the contact region R2. In order to etch the sacrificial layer 33 when the lower hole LHR is formed, the RIE may be performed using CF-based gas or CHF-based gas and gas containing HBr, HCl, or $SF_6$ (where C is carbon, F is fluorine, H is hydrogen, Br is bromine, Cl is chlorine, and S is sulfur).

Next, a sacrificial layer 41a, which is a part of the sacrificial layer 41, is formed in each of the lower memory hole LMH and the lower hole LHR (FIG. 18B). The sacrificial layer 41a is, for example, a carbon layer.

Figures 19A, 19B:
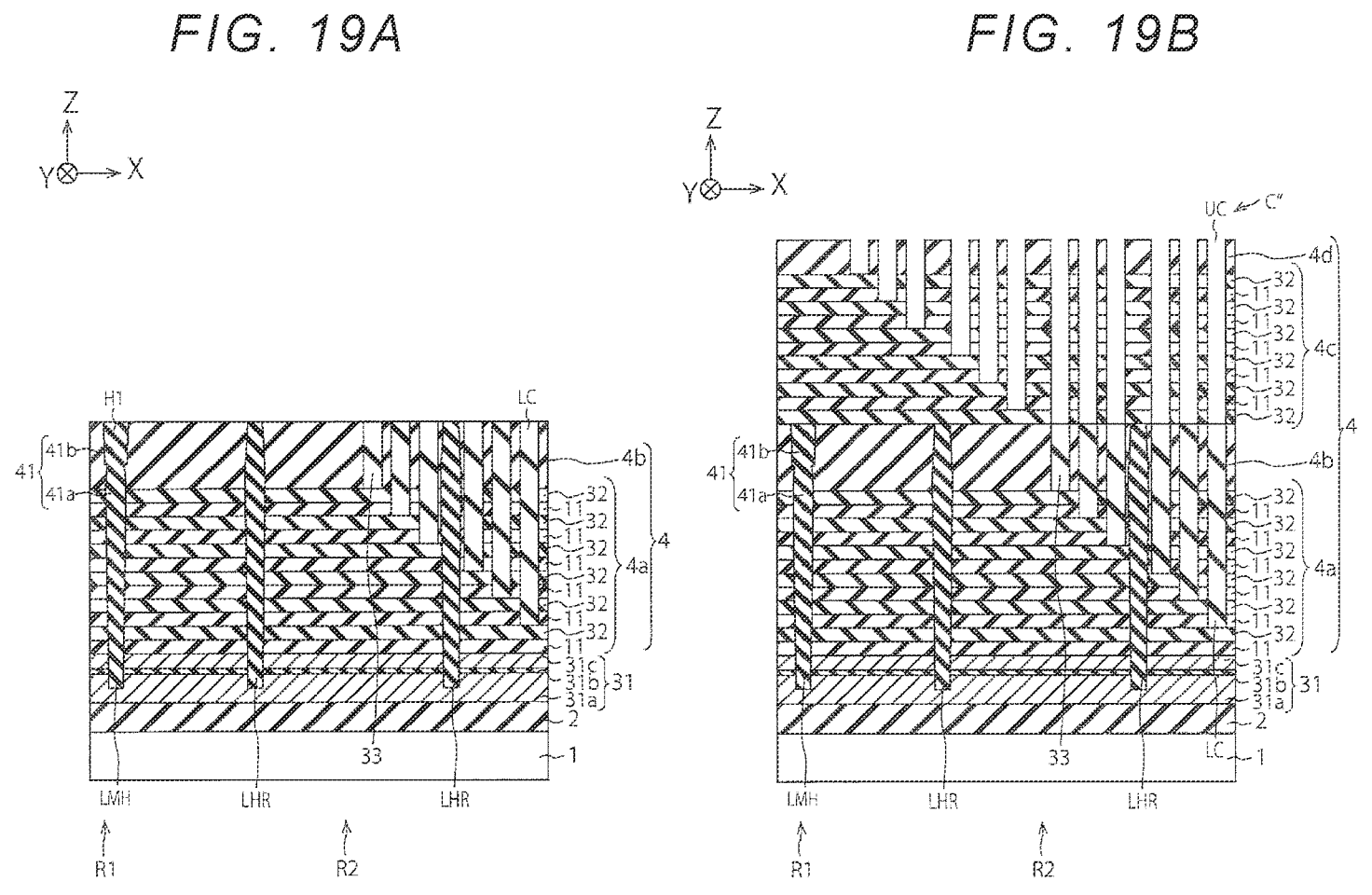

Next, a hole H1 is formed in a part of the sacrificial layer 41a in each lower memory hole LMH, and a sacrificial layer 41b, which is a part of the sacrificial layer 41, is formed in the hole H1 (FIG. 19A). The sacrificial layer 41a is, for example, a carbon layer. In this manner, a joint process is performed to join each lower memory hole LMH to the corresponding upper memory hole UMH.

Next, the upper stacked film 4c and the insulating film 4d are formed on the insulating film 4b (FIG. 19B). The upper stacked film 4c includes a plurality of insulating films 11 and a plurality of sacrificial layers 32 which are alternately formed on the insulating film 4b.

Next, a plurality of upper contact holes UC are formed in the insulating film 4d and the upper stacked film 4c by lithography and RIE (FIG. 19B). The upper contact hole UC is also a part of the contact hole C. Each upper contact hole UC is formed on the corresponding sacrificial layer 32 in the upper stacked film 4c or on the corresponding sacrificial layer 33 in the lower stacked film 4a, within the contact region R2. FIG. 19B illustrates six upper contact holes UC formed on six sacrificial layers 32, respectively, and six upper contact holes UC formed on six sacrificial layers 33, respectively. The former upper contact hole UC individually forms a contact hole C'', and the latter upper contact hole UC forms a contact hole C'' together with the lower contact hole LC. Next, a sacrificial layer 34 is formed in each upper contact hole UC (FIG. 20A).

Figures 20A, 20B:
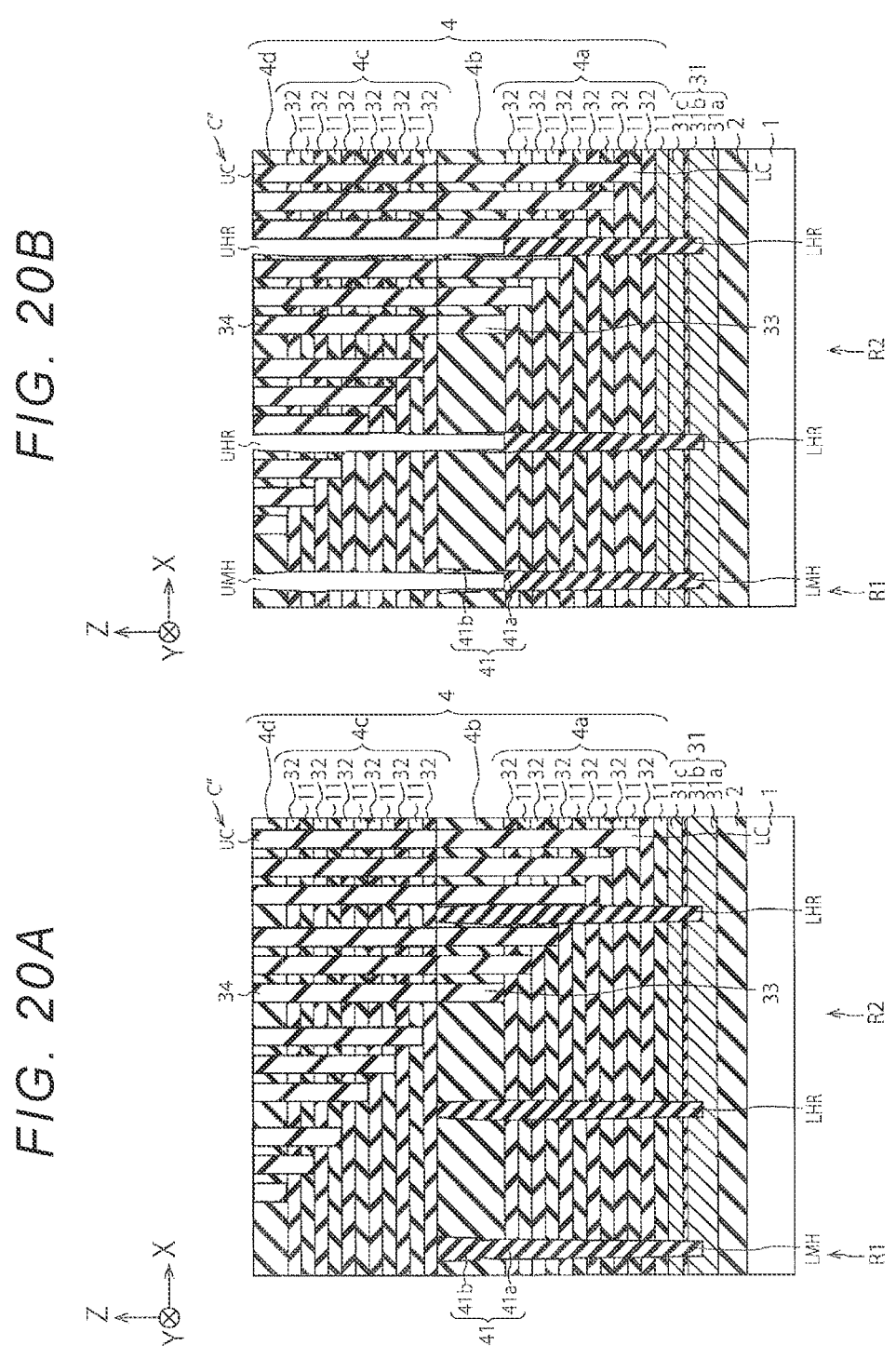
FIGS. 20A and 20B are cross-sectional views illustrating the method for manufacturing a semiconductor device according to the first modified example.

Next, a plurality of upper memory holes UMH and a plurality of upper holes UHR are formed in the insulating film 4d, the upper stacked film 4c, and the insulating film 4b by lithography and RIE (FIG. 20B). FIG. 20B illustrates one of the plurality of upper memory holes UMH and two of the plurality of upper holes UHR. Each upper memory hole LMH is formed on the corresponding sacrificial layer 41 in the lower memory hole LMH within the cell region R1, and each upper hole LHR is formed on the corresponding sacrificial layer 41 in the lower hole LHR within the contact region R2. In order to also etch the sacrificial layers 33 and 34 when the upper hole UHR is formed, the RIE may be performed using CF-based gas or CHF-based gas and gas containing HBr, HCl, or $SF_6$.

Figures 21A, 21B:
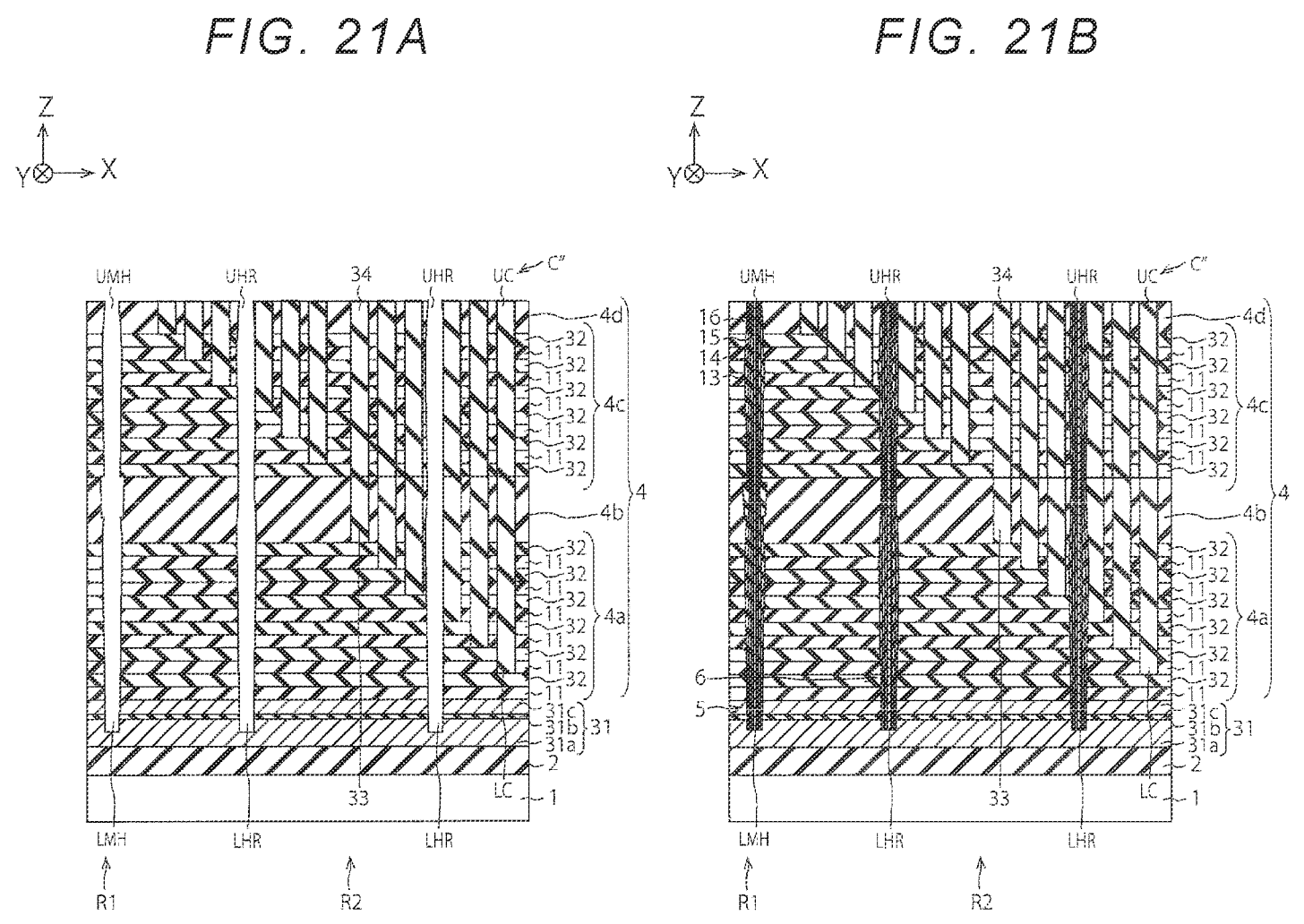

Next, the sacrificial layer 41 is removed from the lower memory hole LMH and the lower hole LHR (FIG. 21A). The sacrificial layer 41 is removed by asking, for example.

Next, a block insulating film 13, a charge storage layer 14, a tunnel insulating film 15, and a channel semiconductor layer 16 are formed in each of the lower memory hole LMH, the upper memory hole UMH, the lower hole LHR, and the upper hole UHR (FIG. 21B). As a result, each columnar portion 5 is formed in a paired lower memory hole LMH and upper memory hole UMH, and each column portion 6 is formed in a paired lower hole LHR and upper hole UHR.

Figures 22A, 22B:
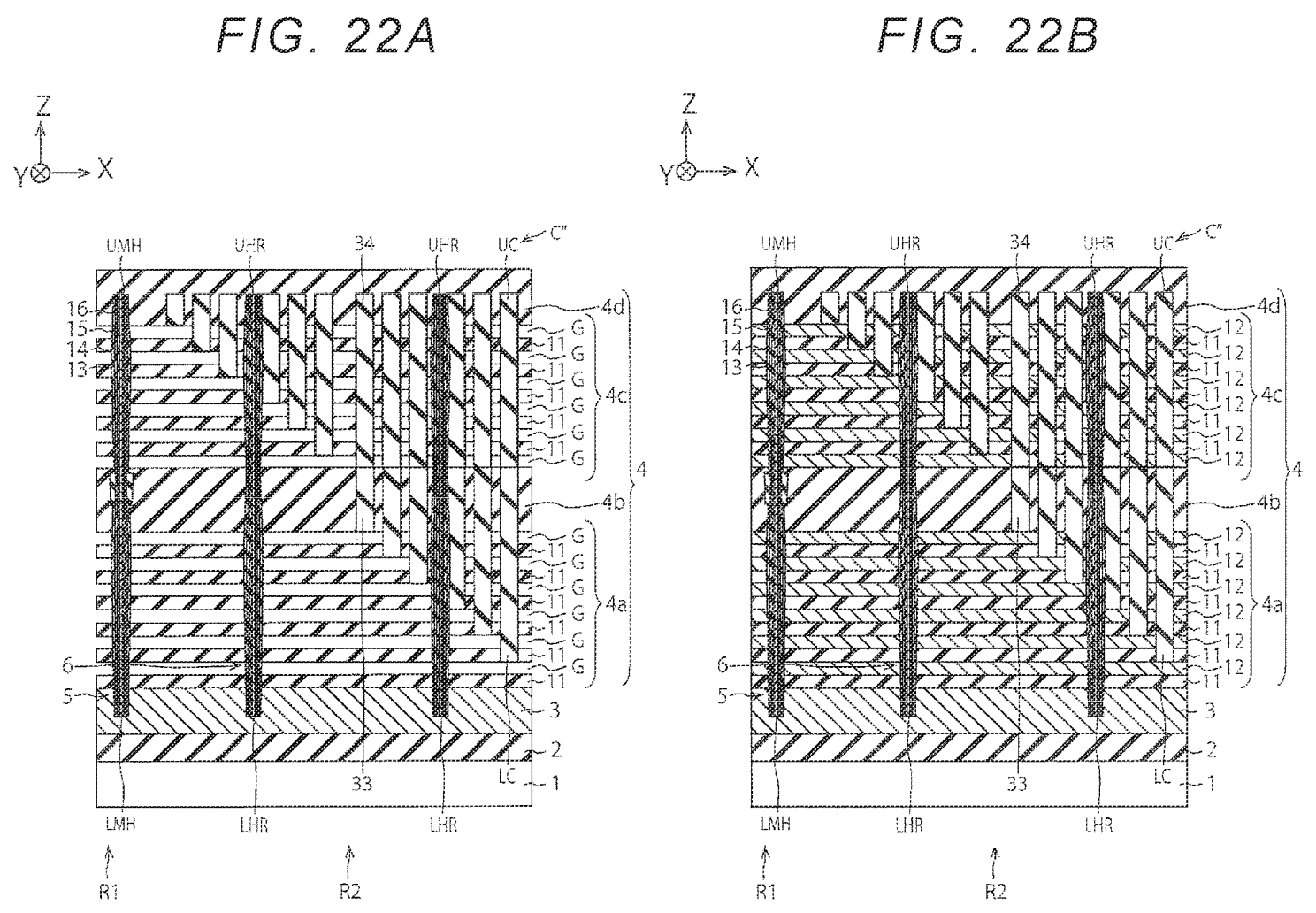

Next, after a remaining portion of the insulating film 4d is formed, a plurality of slits is formed in the stacked film 4, and each sacrificial layer 32 is removed from the slit by wet etching (FIG. 22A). As a result, a plurality of cavities G are formed in the stacked film 4. Next, a plurality of electrode layers 12 are formed in these cavities G using the slits (FIG. 22B). In this manner, the plurality of sacrificial layers 32 in the stacked film 4 are replaced with the plurality of electrode layers 12. Similarly, the sacrificial layer 31 is replaced with the source layer 3 through a process illustrated in FIG. 22A.

In the process illustrated in FIG. 22B, a block insulating film, a barrier metal layer, and an electrode material layer are sequentially formed in each cavity G. The block insulating film is, for example, an aluminum oxide film ($AlO_x$ film). The barrier metal layer is, for example, a titanium nitride film (TiN film). The electrode material layer is, for example, a tungsten (W) layer. In this case, each electrode layer 12 is formed of a barrier metal layer and an electrode material layer.

Figures 23A, 23B:
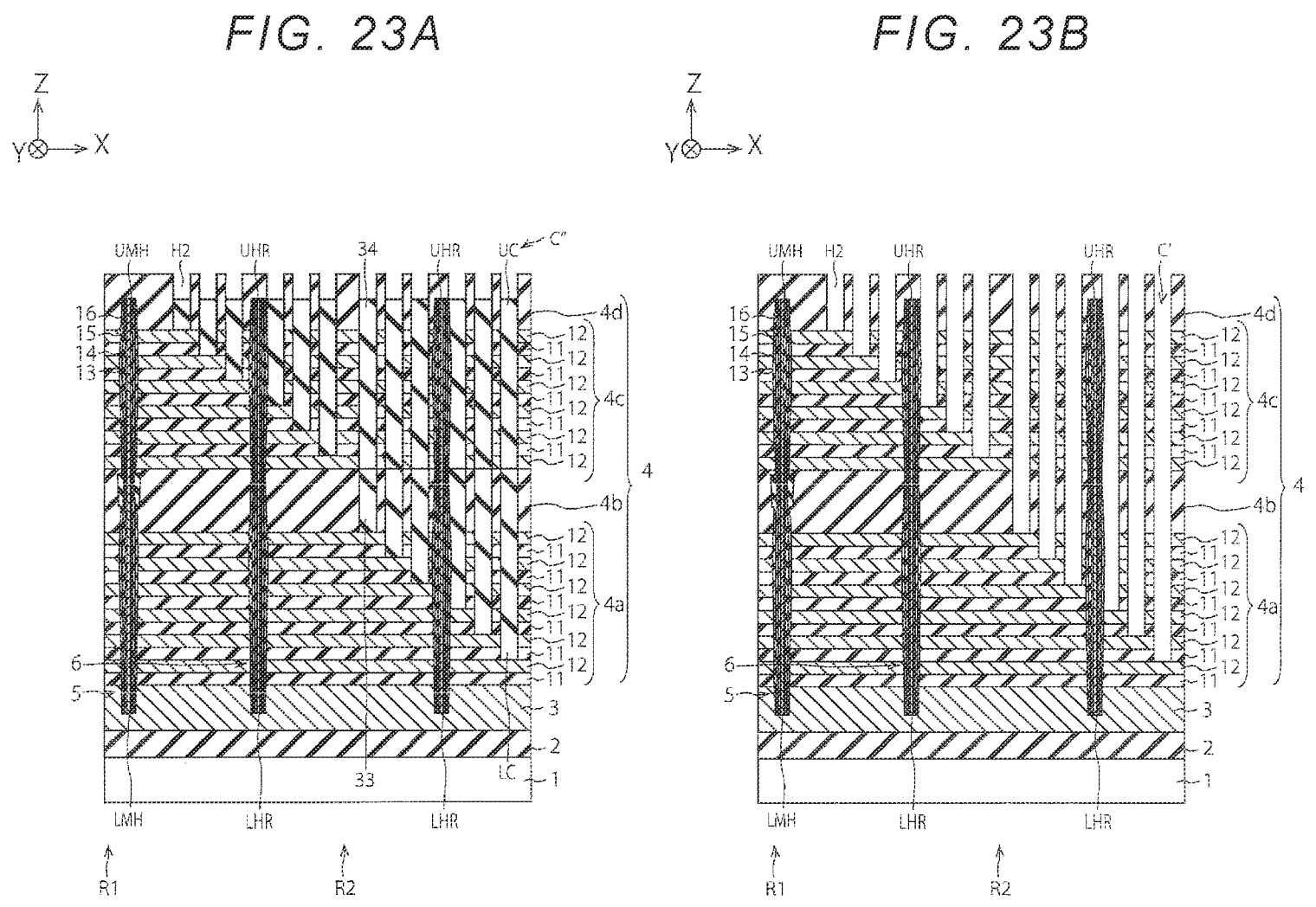

Next, a hole H2 is formed on each sacrificial layer 34 in the insulating film 4*d* (FIG. 23A). As a result, the sacrificial layer 34 is exposed in each hole H2.

Next, the sacrificial layers 33 and 34 are removed to form a plurality of contact holes C' in the stacked film 4 (FIG. 23B). The sacrificial layers 33 and 34 are removed by wet etching, for example. Each contact hole C' is formed on the corresponding electrode layer 12. Each contact hole C' illustrated in FIG. 23B has a size smaller than the corresponding contact hole C".

Thereafter, the insulating film 7 and the contact plug 8 are formed in the contact hole C'. Further, various wiring layers, via plugs, interlayer insulating films, and the like are formed on the substrate 1. In this way, the semiconductor device of the present modified example illustrated in FIG. 2 is manufactured.

(3) Various Examples of Structure of Semiconductor Device

FIGS. 24A and 26B are plan views illustrating various examples of the structure of the semiconductor device according to the first embodiment.

FIGS. 24A and 24B illustrate two examples of the arrangement of the contact hole C".

The contact hole C" of FIG. 24A is provided at a position overlapping with the nine column portions 6 in a plan view. As a result, four contact holes C are formed in one contact hole C". For example, the contact hole C" is formed by misalignment of a patterned resist for the contact hole C" when the contact hole C" in FIG. 5A or 6A is formed.

The contact hole C" of FIG. 24B is provided at a position overlapping with four column portions 6 in a plan view. In this case, nine contact holes C are formed in one contact hole C". The contact holes C include one contact hole C formed between four column portions 6, four contact holes C formed in the vicinity of a side of the contact hole C", and four contact holes C formed in the vicinity of a corner of the contact hole C".

The contact hole C" of FIG. 24C is provided at a position overlapping six column portions 6 in a plan view. As a result, one contact hole C is formed in one contact hole C". In FIG. 24C, the column portions 6 are arranged in a triangular lattice shape instead of a square lattice shape (zigzag arrangement), and the arrangement of the column portions 6 at the positions of the contact holes C is omitted. A planar shape of the contact hole C" illustrated in FIG. 24C is elliptical, but may be circular in other examples.

FIGS. 25A to 25D illustrate four examples of a cross-sectional shape of the contact hole C".

Figure 25A:
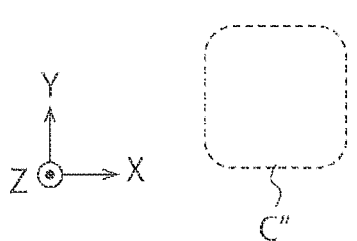
FIGS. 25A to 25D are plan views illustrating various examples of a structure of a semiconductor device according to the first embodiment.
Figure 25B:
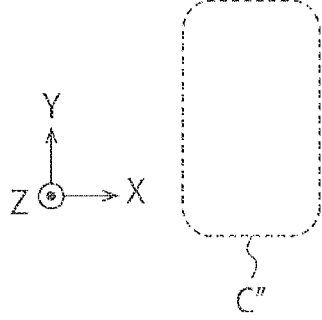
Figure 25C:
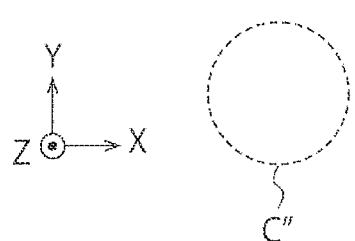
Figure 25D:
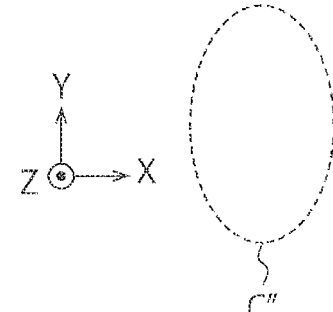

The cross-sectional shape of the contact hole C" of FIG. 25A is substantially square. The cross-sectional shape of the contact hole C" of FIG. 25B is substantially rectangular. The cross-sectional shape of the contact hole C" of FIG. 25C is circular. The cross-sectional shape of the contact hole C" of FIG. 25D is elliptical. The cross-sectional shape of the contact hole C" of the first embodiment may be another shape. A square shape with rounded corners, as illustrated in FIGS. 25A and 25B, is called a race track shape.

FIGS. 26A and 26B illustrate two examples of a relationship between the contact hole C" and the column portion 6.

The cross-sectional shape of the contact hole C" of FIG. 26A is rectangular. The contact hole C" is provided at a position overlapping eight column portions 6 in a plan view. These column portions 6 are arranged inside the side surface of the contact hole C", but may be arranged at a position overlapping the side surface (edge) of the contact hole C.

The cross-sectional shape of the contact hole C" of FIG. 26B is circular. The contact hole C" is provided at a position overlapping four column portions 6 in a plan view. These column portions 6 are arranged inside the side surface of the contact hole C", but may be arranged at a position overlapping the side surface (edge) of the contact hole C".

As described above, when the semiconductor device of the first embodiment is manufactured, the contact hole C" is formed in the stacked film 4, the sacrificial layers 33 and 34 are then formed in the contact hole C", and then the column portion 6 is formed in the stacked film 4. Then, after the column portion 6 is formed, the sacrificial layers 33 and 34 are removed from the contact hole C" to form the contact hole C' in the stacked film 4 and to permit the formation of the insulating film 7 and the contact plug 8 in the contact hole C'. Thus, according to the first embodiment, the contact plug 8 can be suitably formed in the stacked film 4. For example, the contact plug 8 can be formed such that the expansion of the seam in the column portion 6 and the unnecessary removal of the column portion 6 are prevented. Furthermore, a short circuit between the electrode layers 12 can be prevented by the design of the contact plug 8.

Second Embodiment (1) Structure of Semiconductor Device

Figure 27:
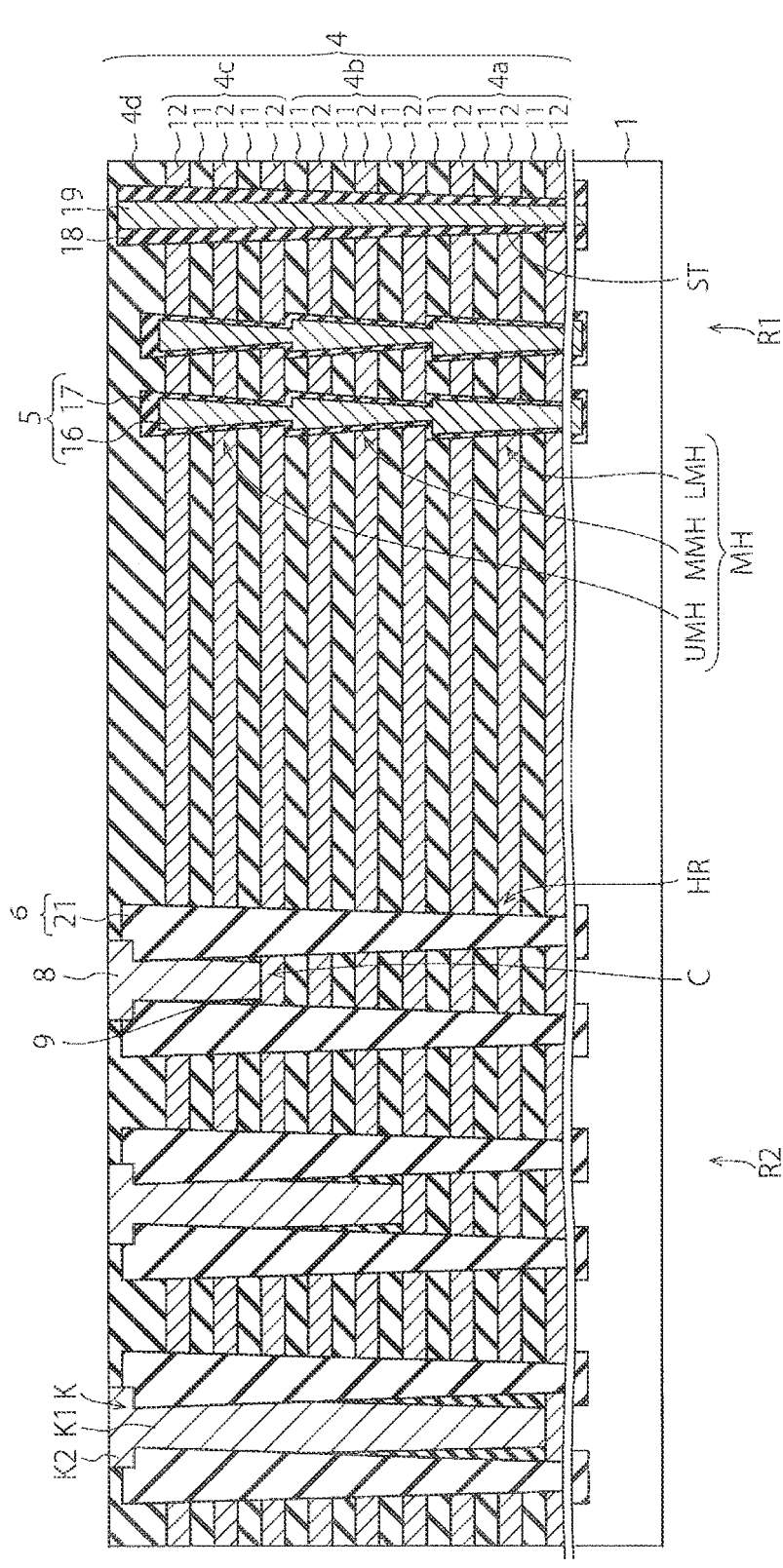
FIG. 27 is a cross-sectional view illustrating a structure of a semiconductor device according to a second embodiment.

FIG. 27 is a cross-sectional view illustrating a structure of a semiconductor device according to a second embodiment.

Similarly to the semiconductor device according to the first embodiment (FIG. 1), the semiconductor device according to the second embodiment (FIG. 27) includes a substrate 1, a stacked film 4, a plurality of columnar portions 5, a plurality of column portion 6, and a plurality of contact plugs 8. The semiconductor device according to the second embodiment further includes a plurality of insulating films 9 provided on side surfaces of the plurality of contact plugs 8, respectively.

The stacked film 4 according to the second embodiment includes a lower stacked film 4*a*, an intermediate stacked film 4*e*, an upper stacked film 4*c*, and an insulating film 4*d*, which are sequentially stacked on the substrate 1. Similarly to the lower stacked film 4*a* and the upper stacked film 4*c*, the intermediate stacked film 4*e* includes a plurality of insulating films 11 and a plurality of electrode layers 12 which are alternately formed in the Z direction. The stacked film 4 of the second embodiment also includes a cell region R1 (where the columnar portion 5 is disposed) and a contact region R2 (where the column portion 6 and the contact plug 8 are disposed).

Each columnar portion 5 according to the second embodiment includes a memory insulating film 17 and a channel semiconductor layer 16. The memory insulating film 17 includes a block insulating film 13, charge storage layer 14, and tunnel insulating film 15 (see FIG. 3). Each columnar portion 5 according to the second embodiment is embedded in a lower memory hole LMH formed in the lower stacked film 4*a*, an intermediate memory hole MMH formed in the intermediate stacked film 4e, and an upper memory hole UMH formed in the upper stacked film 4c. Each memory hole MH illustrated in FIG. 27 includes a lower memory hole LMH, an intermediate memory hole MMH, and an upper memory hole UMH coupled (linked) to each other.

Each column portion 6 according to the second embodiment is formed of only the insulating film 21. The insulating film 21 is, for example, a SiO$_2$ film. Each column portion 6 according to the second embodiment is embedded in a hole HR which is formed through the lower stacked film 4a, the intermediate stacked film 4e, and the upper stacked film 4c.

Similarly to the first embodiment, each contact plug 8 according to the second embodiment is embedded in a contact hole C. Each contact plug 8 according to the first embodiment is formed in the stacked film 4 through the insulating film 7, whereas each contact plug 8 according to the second embodiment is formed in the stacked film 4 through the insulating film 9. The insulating film 7 is formed after the column portions 6 are formed, and the insulating film 9 is formed before the column portions 6 are formed. The insulating film 9 is, for example, a SiO$_2$ film.

Each contact plug 8 according to the second embodiment includes a lower portion K1 and an upper portion K2 formed on the lower portion K1. A step K is between the lower portion K1 and the upper portion K2. In FIG. 27, a width of the upper portion K2 in the X direction is greater than a width of the lower portion K1 in the X direction at the height position of the step K. The upper portion K2 is formed on the lower portion K1 and the column portion 6 at the height of the step K. The reason why the step K is formed will be described when the step of forming the contact hole C and the contact plug 8 is described.

The semiconductor device according to the second embodiment includes a plurality of slits ST. FIG. 27 illustrates one of the slits ST. Each slit ST is formed through the lower stacked film 4a, the intermediate stacked film 4e, and the upper stacked film 4c, and extends in the Y direction and the Z direction. The semiconductor device according to the second embodiment includes an insulating film 18 and a wiring layer 19 which are formed in each slit ST. The insulating film 18 is, for example, a SiO$_2$ film. The wiring layer 19 is, for example, a metal layer such as a tungsten (W) layer.

Figure 28:
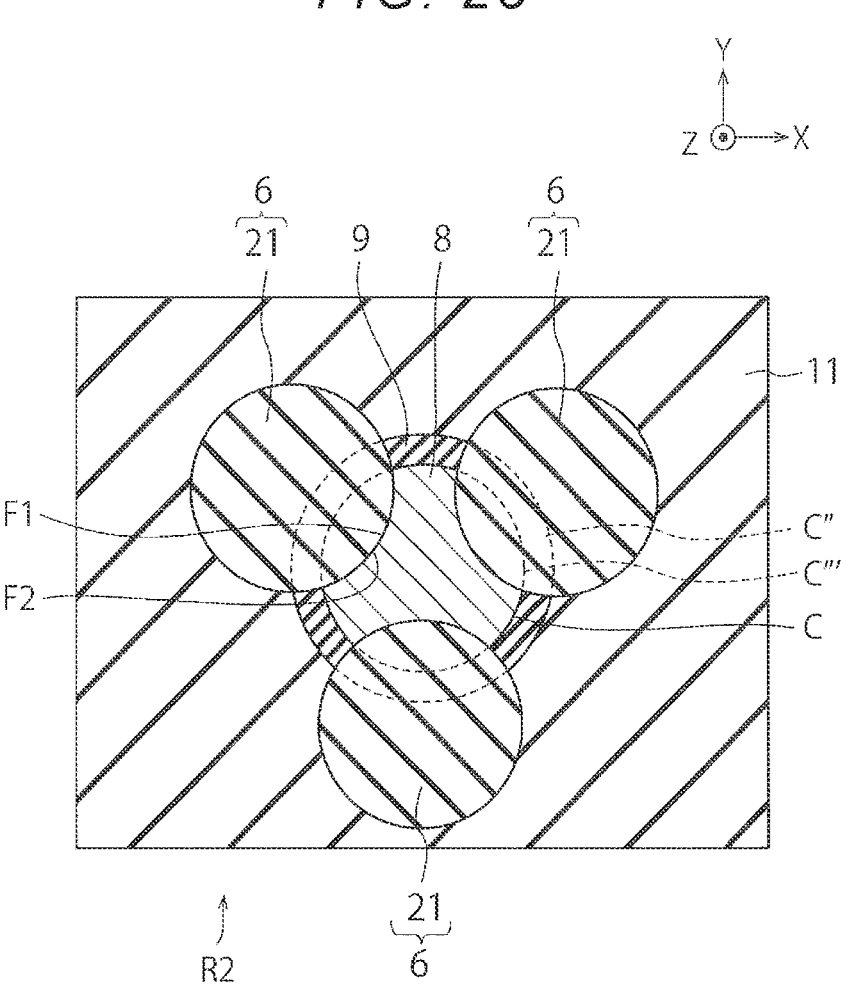
FIG. 28 is a plan view illustrating a structure of a semiconductor device according to the second embodiment.

FIG. 28 is a plan view illustrating a structure of a semiconductor device according to the second embodiment.

FIG. 28 illustrates an XY cross-sectional shape of one contact plug 8, one insulating film 9 provided on the side surface of the contact plug 8, and three column portions 6 provided near the contact plug 8. FIG. 28 further illustrates one insulating film 11 formed in the stacked film 4.

FIG. 28 illustrates a contact hole C", a contact hole C"", and the contact hole C. According to the second embodiment, the contact hole C" is formed in the stacked film 4. The insulating film 9 and the sacrificial layer are then formed in the contact hole C". The column portion 6 is formed in the stacked film 4 before performing the replacement process of the stacked film 4. The contact hole C"' corresponds to a hole in a state in which the contact hole C" is narrowed by the insulating film 9. The sacrificial layer (material) is formed in the contact hole C"". Next, the sacrificial layer is removed from the contact hole C"" after performing the replacement process of the stacked film 4. As a result, the contact hole C is formed in the stacked film 4. Next, the contact plug 8 is formed in the contact hole C.

In the second embodiment, after the column portion 6 is formed in the stacked film 4, the contact hole C is formed in a region between the column portions 6, and the contact plug 8 is formed in the contact hole C. Therefore, the shape of the side surface F2 of the contact plug 8 is affected by the shape of the side surface F1 of the column portion 6. Specifically, similarly to the first embodiment, the shape of the side surface F2 of the second embodiment is concave in a direction of the side surface F1. It is noted that unlike the first embodiment, the side surface F2 according to the second embodiment is in contact with the side surface F1.

(2) Method for Manufacturing Semiconductor Device

FIGS. 29 to 40 are cross-sectional views illustrating a method for manufacturing the semiconductor device according to the second embodiment. The cross-sectional views illustrate an XZ cross section corresponding to FIG. 27.

Hereinafter, a method for manufacturing a semiconductor device according to the second embodiment will be described with reference to FIGS. 29 to 40. In the description, FIGS. 41A to 42C are also referred to as appropriate. FIGS. 41A to 42C are plan views illustrating aspects of the method of manufacturing a semiconductor device according to the second embodiment. The plan views illustrate an XY cross section corresponding to FIG. 28.

Figure 29:
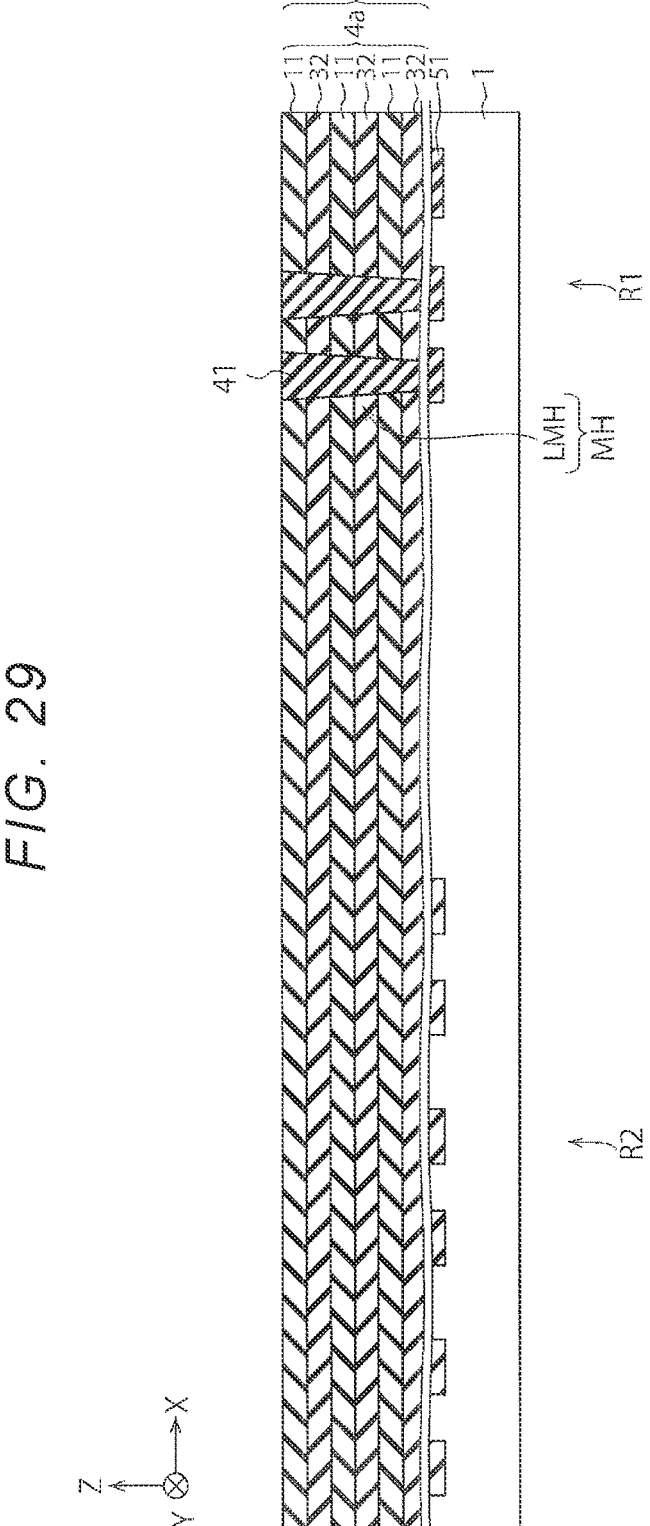

First, the substrate 1 is prepared, and a plurality of sacrificial regions 51 are formed in the substrate 1 (FIG. 29). For example, the sacrificial regions 51 are formed by forming a plurality of concave portions in the substrate 1 by RIE and embedding the sacrificial layer, which serves as an etching stopper, in the concave portions. The sacrificial layer is, for example, a carbon layer or a metal layer. Next, a lower stacked film 4a is formed on the substrate 1, a plurality of lower memory holes LMH are formed in the lower stacked film 4a by RIE, and a sacrificial layer 41 is formed in each lower memory hole LMH (FIG. 29). Like the sacrificial layer 41 according to the first embodiment, the sacrificial layer 41 according to the second embodiment can be a carbon layer. The lower stacked film 4a includes a plurality of insulating films 11 and a plurality of sacrificial layers 32 which are alternately formed on the substrate 1. Each sacrificial layer 32 is an example of the first layer. Each lower memory hole LMH according to the carbon embodiment is formed on the corresponding sacrificial region 51 in the cell region R1.

Figure 30:
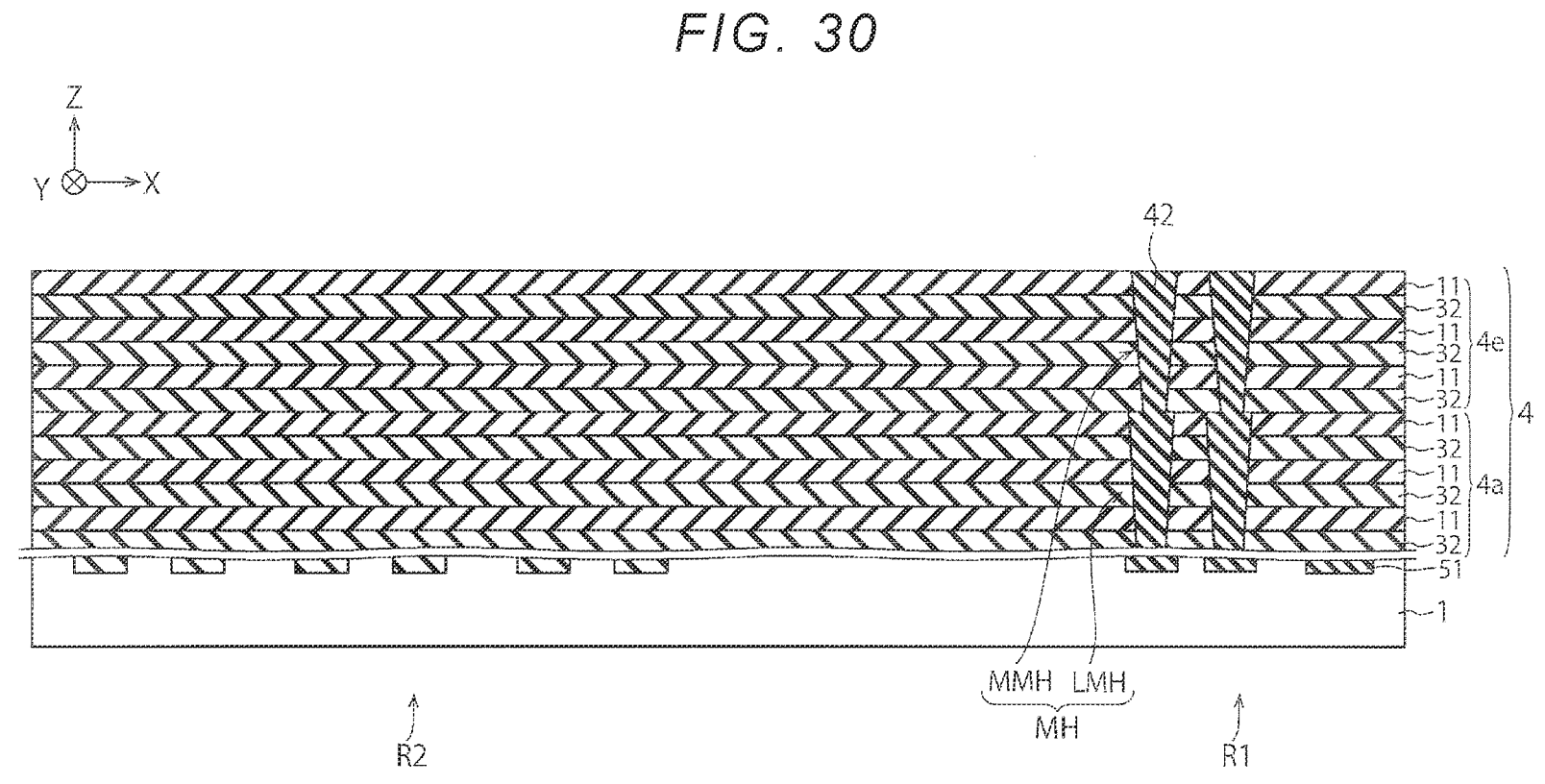

Next, an intermediate stacked film 4e is formed on the lower stacked film 4a, and a plurality of intermediate memory holes MMH are formed in the intermediate stacked film 4e by RIE (FIG. 30). Each sacrificial layer 41 is removed by asking after the intermediate memory holes MMH are formed. Next, a sacrificial layer 42 is formed in each intermediate memory hole MMH and in the lower memory hole LMH below the intermediate memory hole MMH (FIG. 30). The sacrificial layer 42 according to the second embodiment is, for example, a carbon layer. The intermediate stacked film 4e includes a plurality of insulating films 11 and a plurality of sacrificial layers 32 which are alternately formed on the lower stacked film 4a. Each intermediate memory hole MMH according to the second embodiment is formed on the corresponding lower memory hole LMH in the cell region R1.

Figure 31:
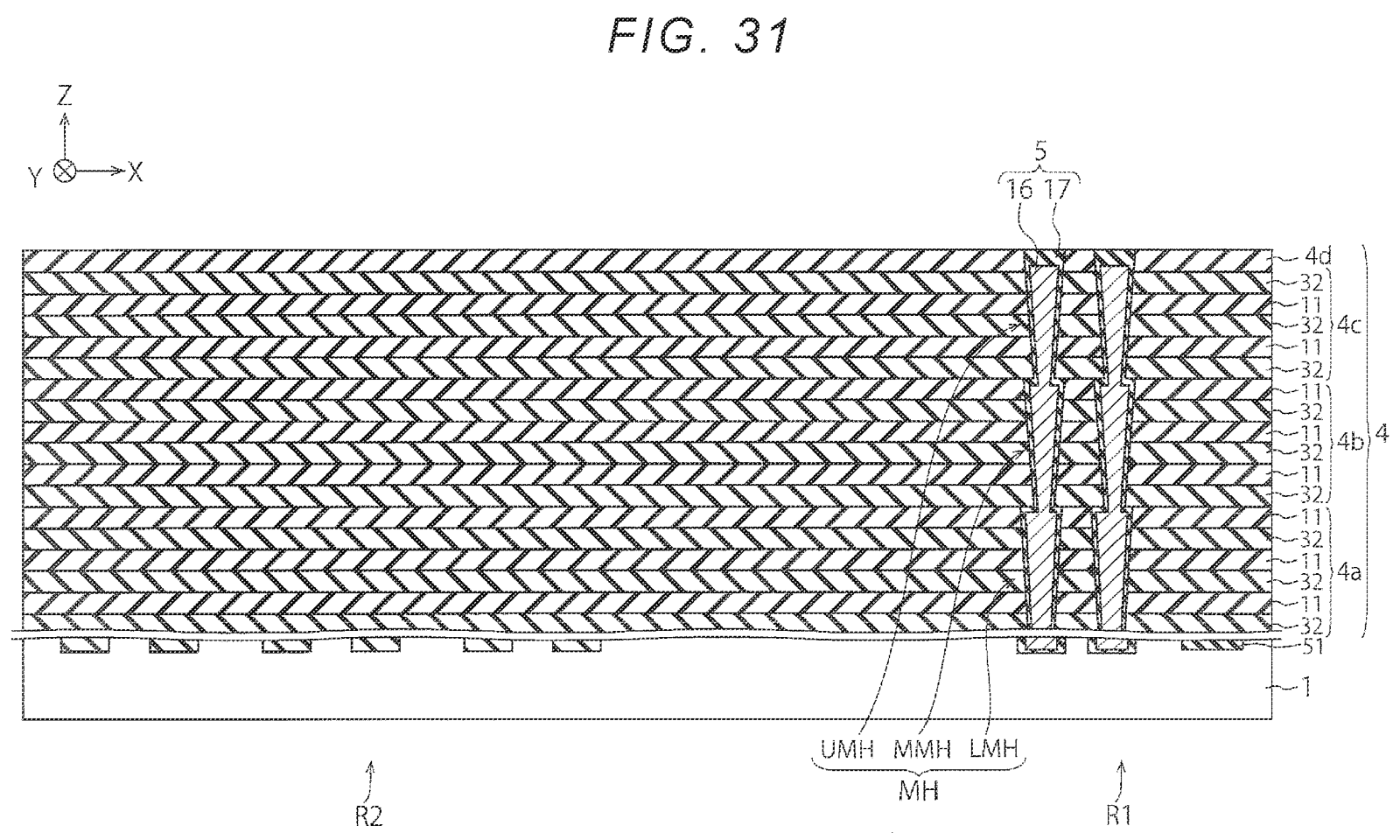

Next, the upper stacked film 4c is formed on the intermediate stacked film 4e, and a part of the insulating film 4d is formed on the upper stacked film 4c (FIG. 31). Next, a plurality of upper memory holes UMH are formed in the upper stacked film 4c and the insulating film 4d by RIE, and then the sacrificial layer 42 and the sacrificial layer in the sacrificial region 51 below the sacrificial layer 42 is removed (FIG. 31). As a result, a plurality of memory holes MH including the lower memory hole LMH, the intermediate memory hole MMH, and the upper memory hole UMH are formed in the stacked film 4 including the lower stacked film 4a, the intermediate stacked film 4e, the upper stacked film 4c, and the insulating film 4d. The upper stacked film 4c includes a plurality of insulating films 11 and a plurality of sacrificial layers 32 which are alternately formed on the intermediate stacked film 4e. Each upper memory hole UMH according to the second embodiment is formed on the corresponding intermediate memory hole MMH in the cell region R1. Next, a plurality of columnar portions 5 are formed in the memory holes MH (FIG. 31). Each columnar portion 5 is formed by sequentially embedding the memory insulating film 17 and the channel semiconductor layer 16 in the corresponding memory hole MH.

Figure 32:
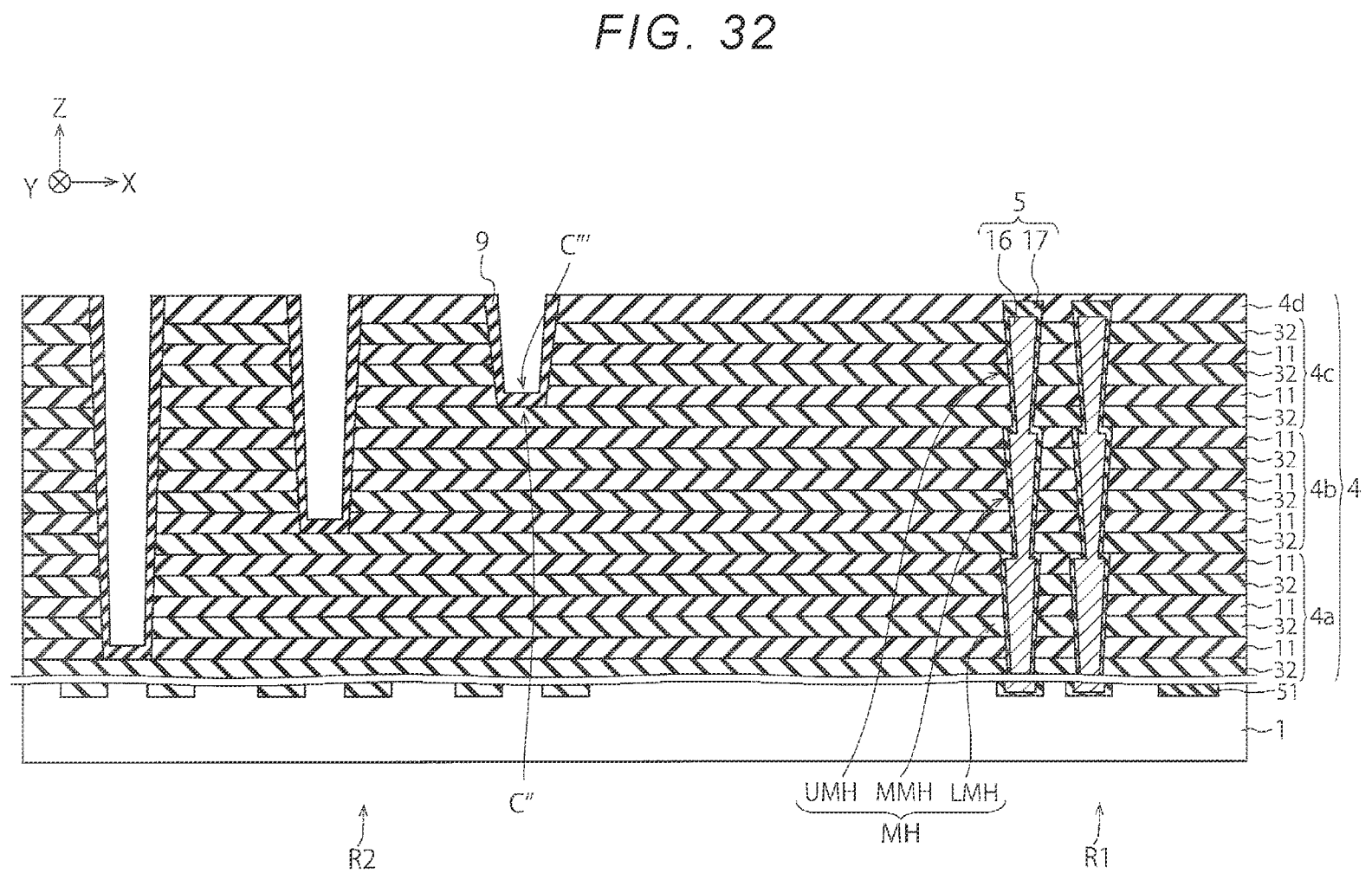
Figure 41A:
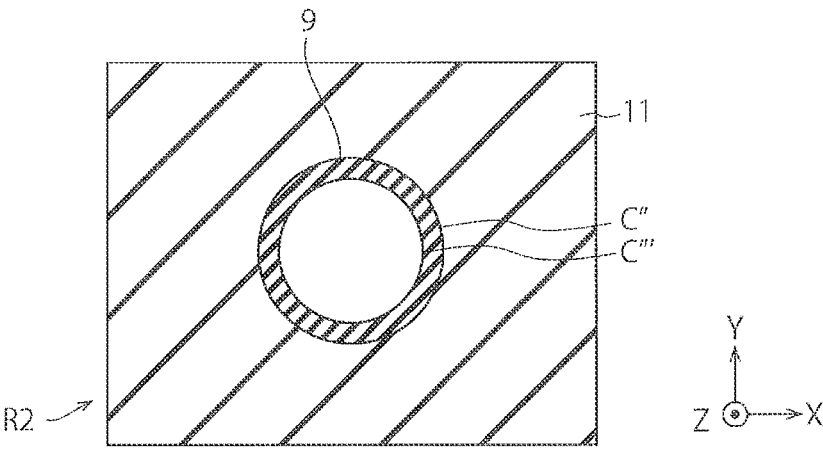
FIGS. 41A to 41C are plan views illustrating aspects of a method for manufacturing a semiconductor device according to the second embodiment.

Next, an additional part of the insulating film 4d is formed on the entire surface of the substrate 1, and a plurality of contact holes C" are formed in the stacked film 4 by RIE (FIG. 32). Each contact hole C" reaches an upper surface of the corresponding sacrificial layer 32 in the contact region R2. Next, the insulating film 9 is formed in each contact hole C" (FIG. 32). The insulating film 9 is formed on the side surface and the bottom surface of each contact hole C". Each contact hole C"" illustrated in FIG. 32 is formed in the corresponding contact hole C". The contact holes C" and C"" are examples of a first hole. FIG. 41A illustrates the contact holes C" and C"" and the insulating film 9 illustrated in FIG. 32.

Figure 33:
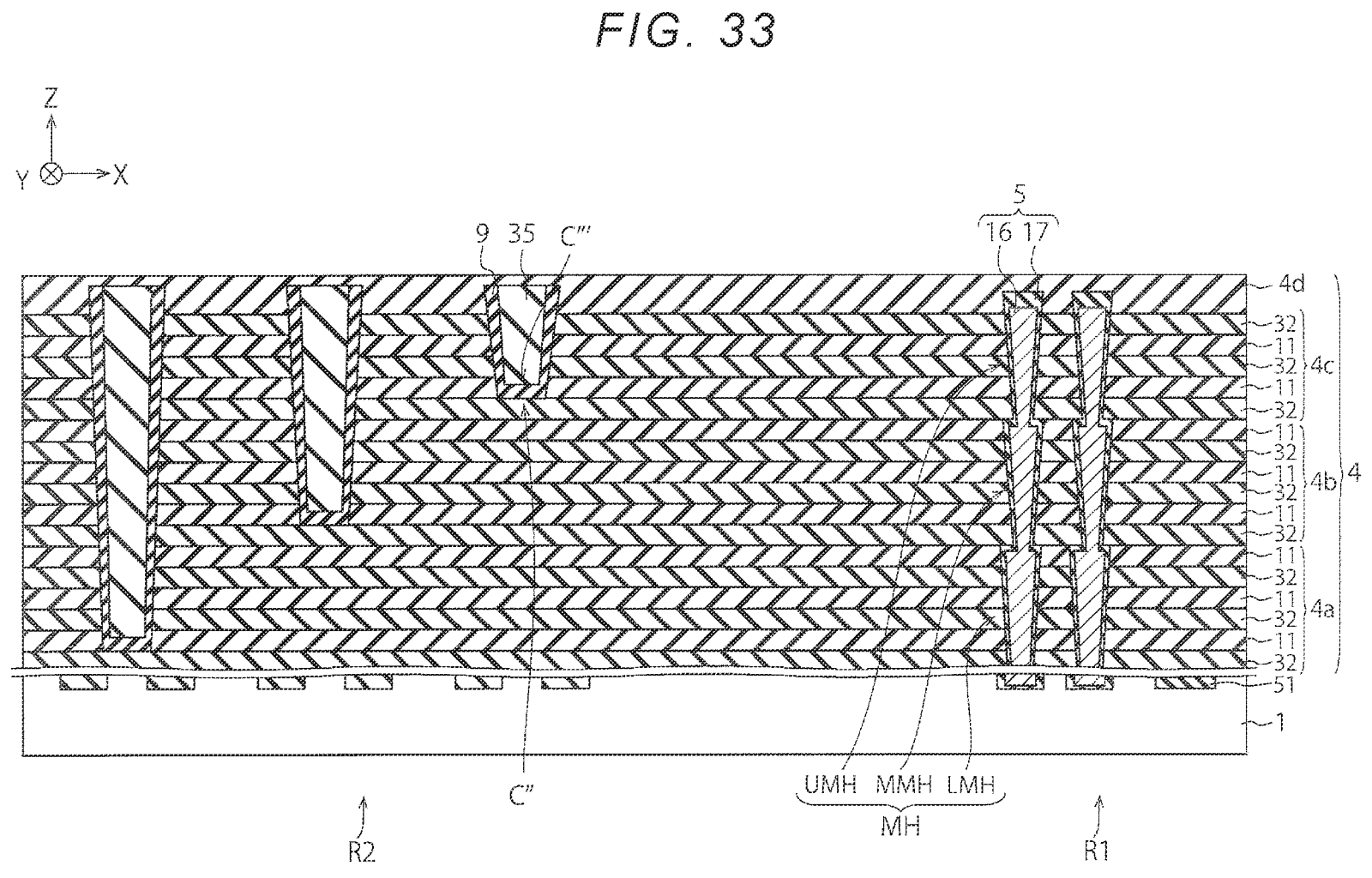
Figure 41B:
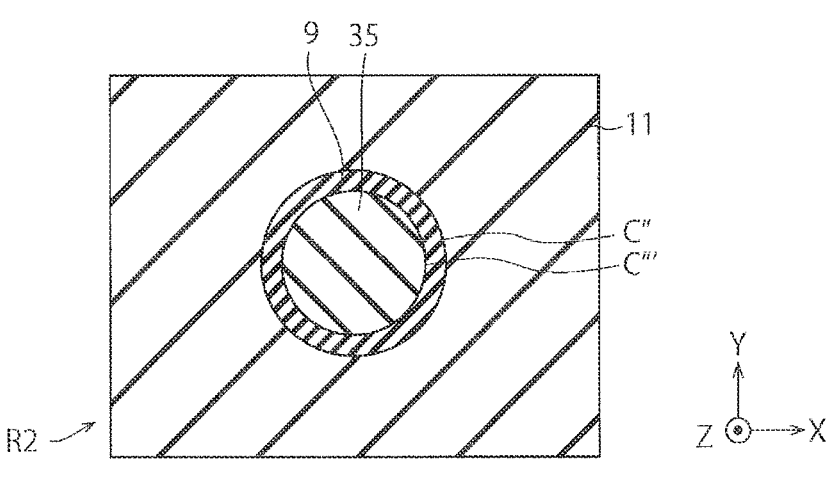

Next, a sacrificial layer 35 is formed in each contact hole C"", and an additional part of the insulating film 4d is formed on the entire surface of the substrate 1 (FIG. 33). The sacrificial layer 35 is, for example, an amorphous silicon layer or a SiN film. The sacrificial layer 35 is an example of the second layer. FIG. 41B illustrates the sacrificial layer 35 illustrated in FIG. 33.

Figure 34:
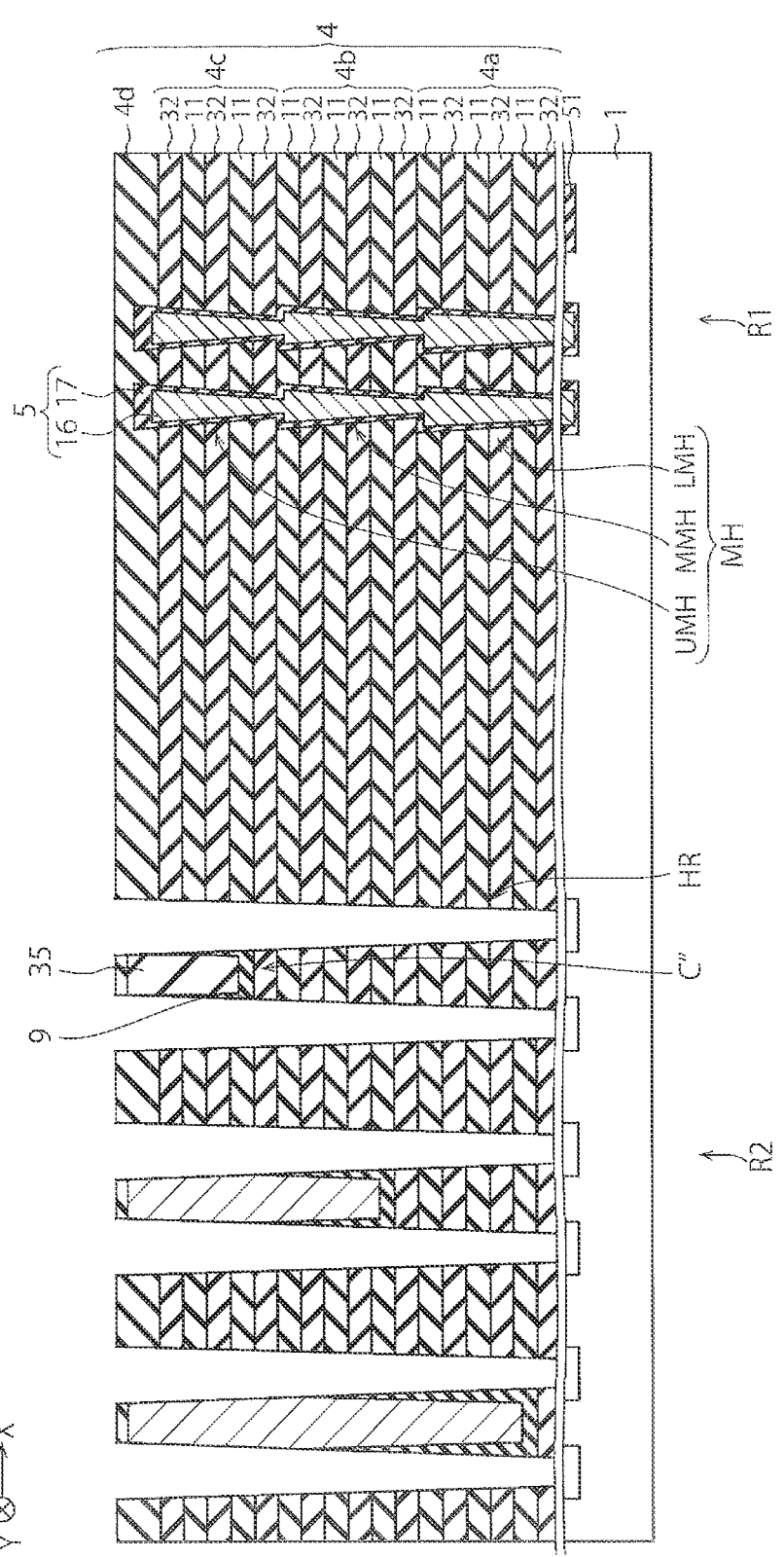
Figure 41C:
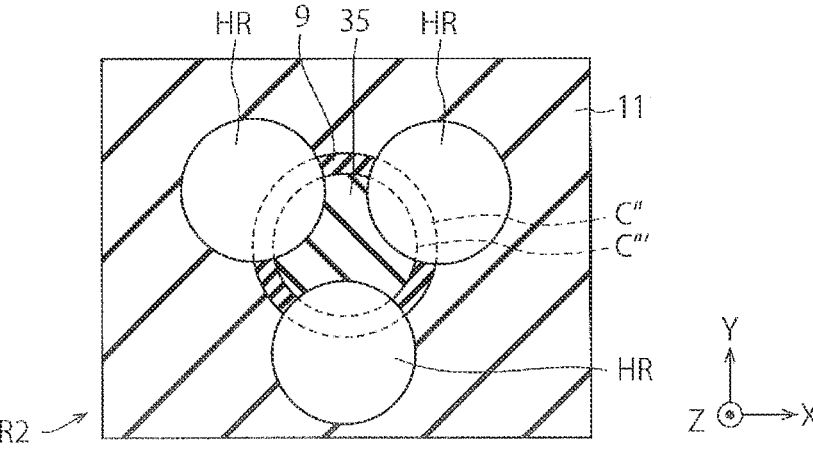

Next, a plurality of holes HR are formed in the stacked film 4 by RIE (FIG. 34). Each hole HR according to the second embodiment is formed on the corresponding sacrificial region 51 in the contact region R2. Next, the sacrificial material in the sacrificial region 51 below each hole HR is removed (FIG. 34). FIG. 41C illustrates the hole HR illustrated in FIG. 34. In FIG. 41C, the hole HR is formed at a position where the insulating film 9 overlaps the sacrificial layer 35 in a plan view.

Figure 35:
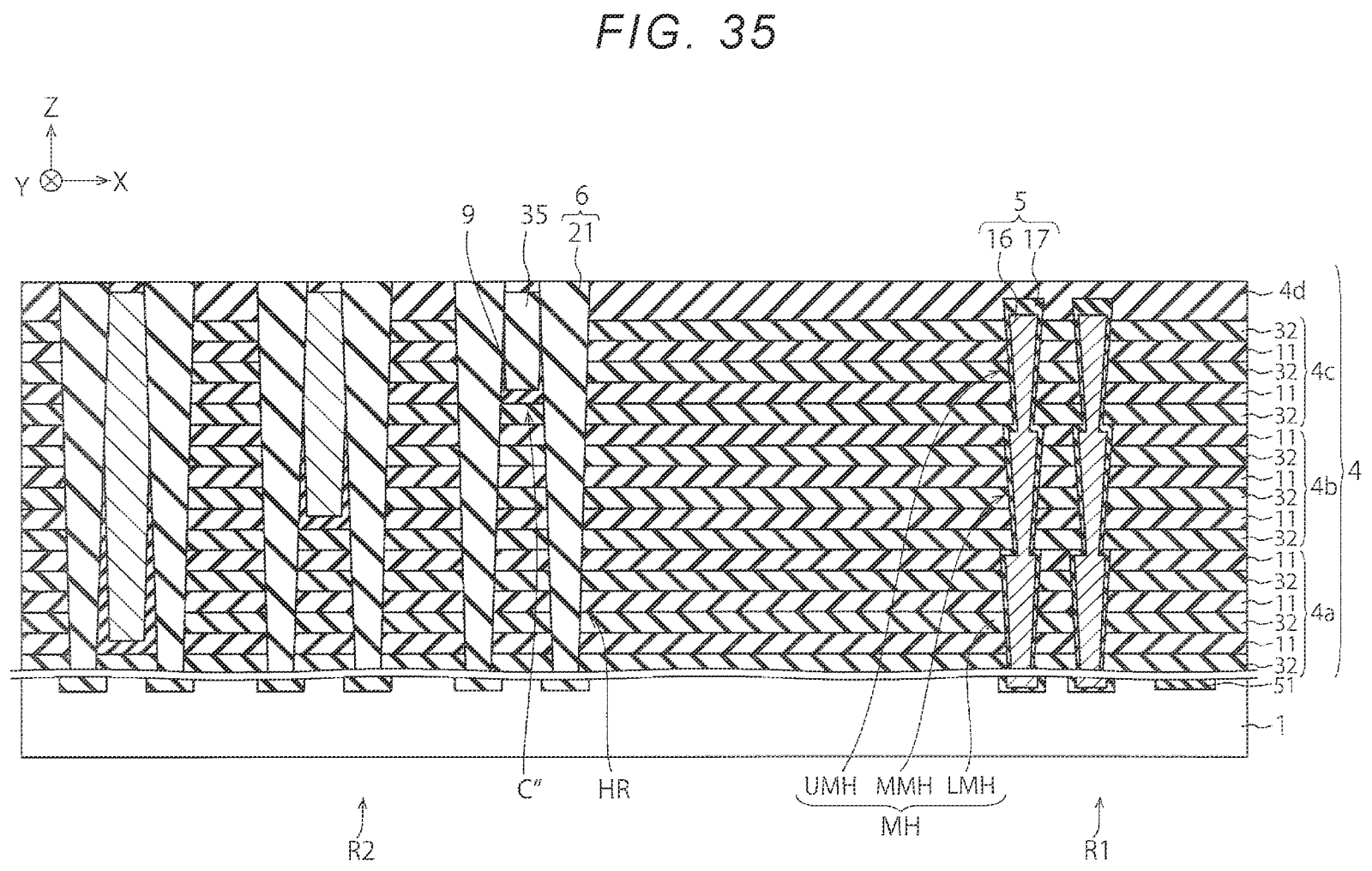
Figure 42A:
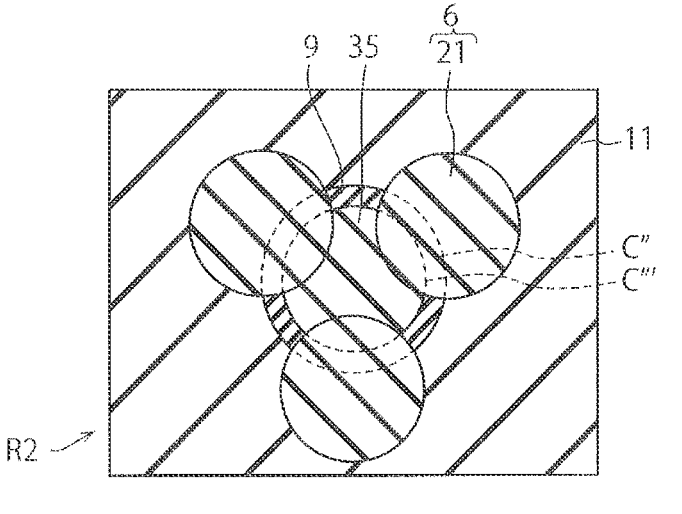
FIGS. 42A to 42C are plan views illustrating aspects of a method for manufacturing a semiconductor device according to the second embodiment.

Next, a plurality of column portions 6 are formed in the holes HR (FIG. 35). Each column portion 6 is formed by embedding the insulating film 21 in the corresponding hole HR. FIG. 42A illustrates the column portion 6 illustrated in FIG. 35.

Figure 36:
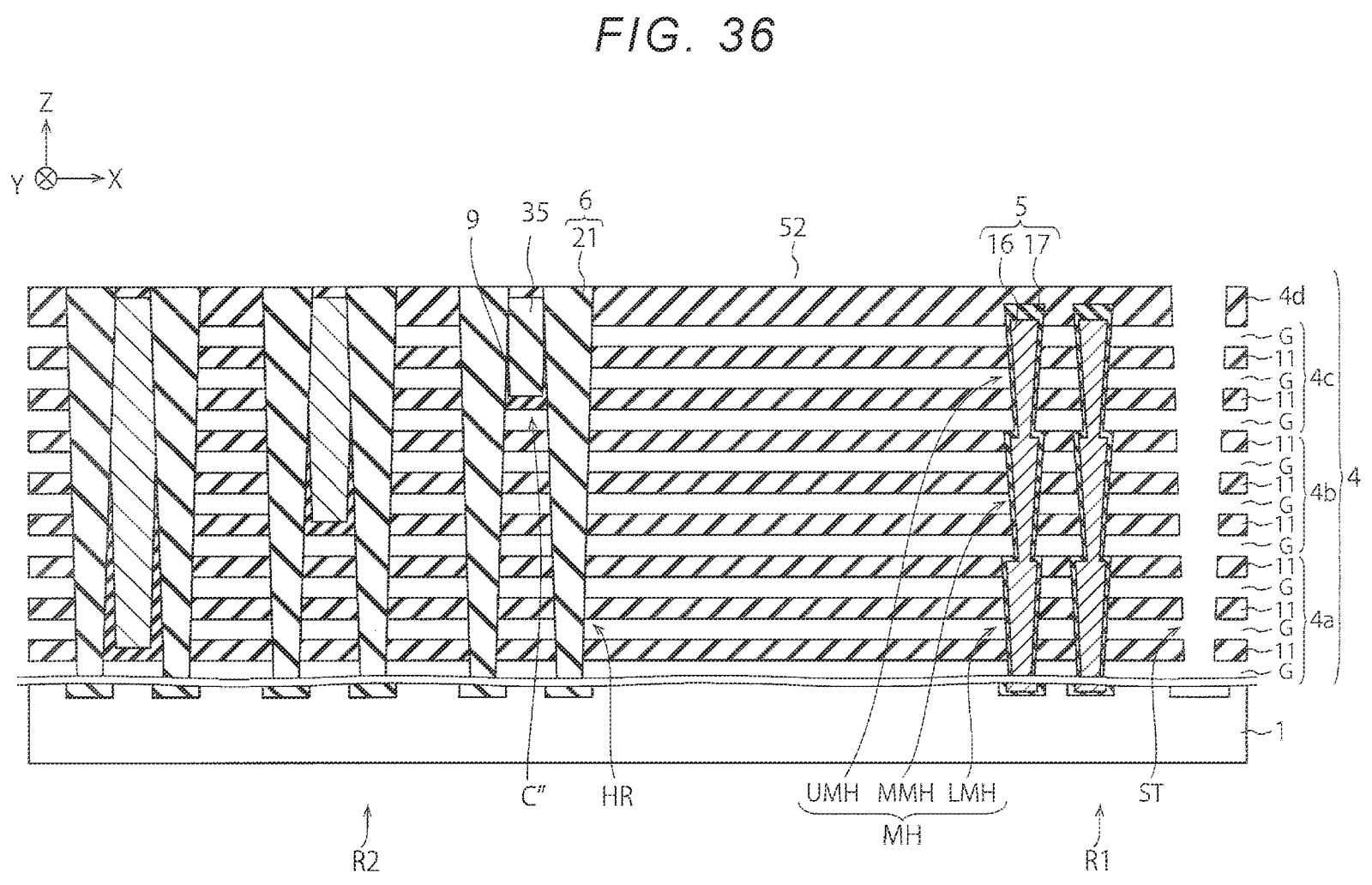

Next, a plurality of slits ST are formed in the stacked film 4 by RIE (FIG. 36). FIG. 36 illustrates one of the slits ST. Each slit ST according to the present embodiment is formed on the corresponding sacrificial region 51 in the cell region R1. Next, the sacrificial material in the sacrificial region 51 below each slit ST is removed (FIG. 36). Next, each sacrificial layer 32 is removed from the slit ST by wet etching (FIG. 36). As a result, a plurality of cavities G are formed in the stacked film 4. The wet etching is performed using, for example, a chemical solution containing phosphoric acid.

Figure 37:
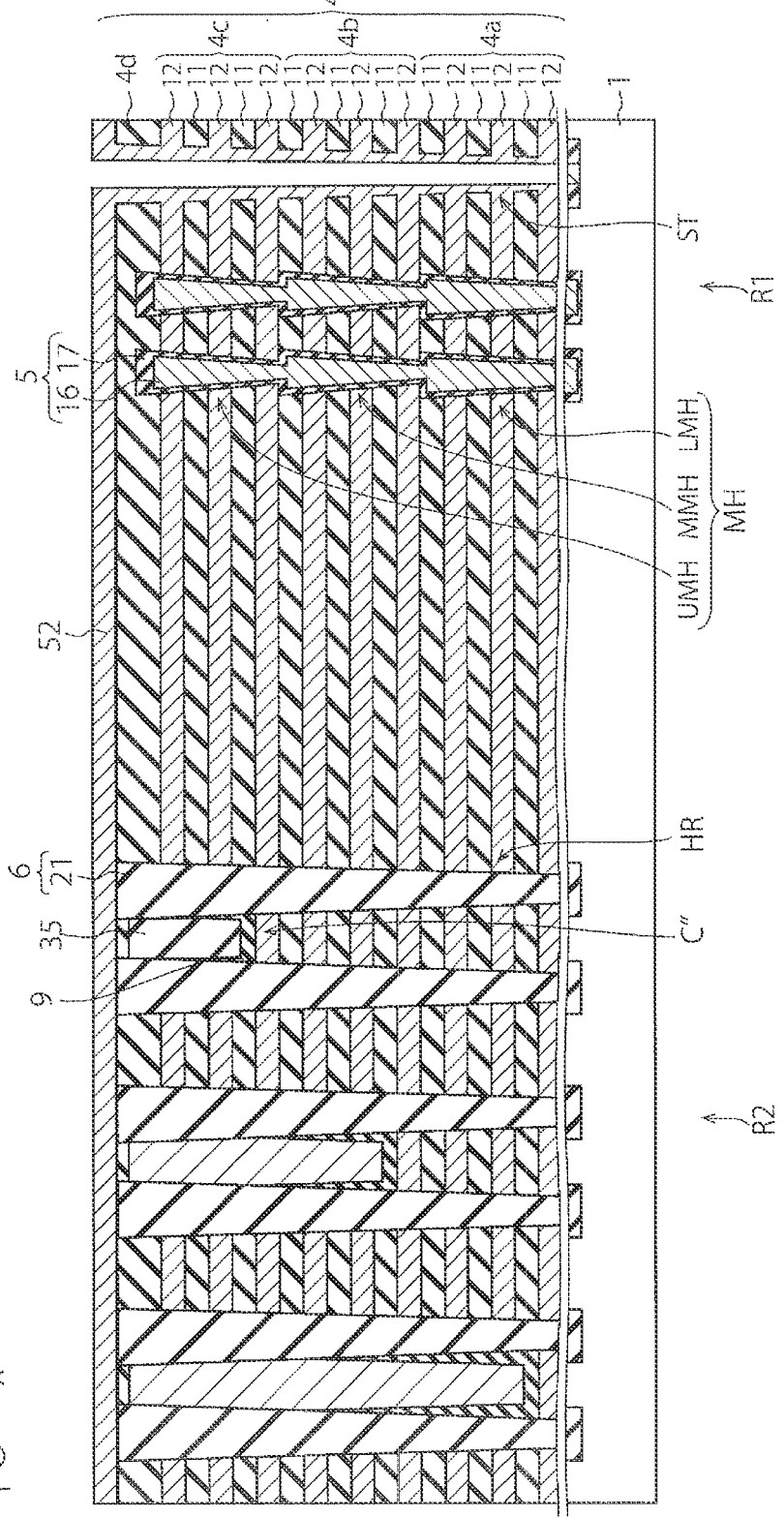

Next, a metal layer 52 is formed on the entire surface of the substrate 1 (FIG. 37). As a result, the metal layer 52 is formed in the upper surface of the stacked film 4, in each slit ST and in each cavity G. The metal layer 52 formed in each cavity G serves as the electrode layer 12. In this manner, the plurality of sacrificial layers 32 in the stacked film 4 are replaced with the plurality of electrode layers 12 in a replacement process. The metal layer 52 includes, for example, a tungsten (W) layer and a molybdenum (Mo) layer.

Figure 38:
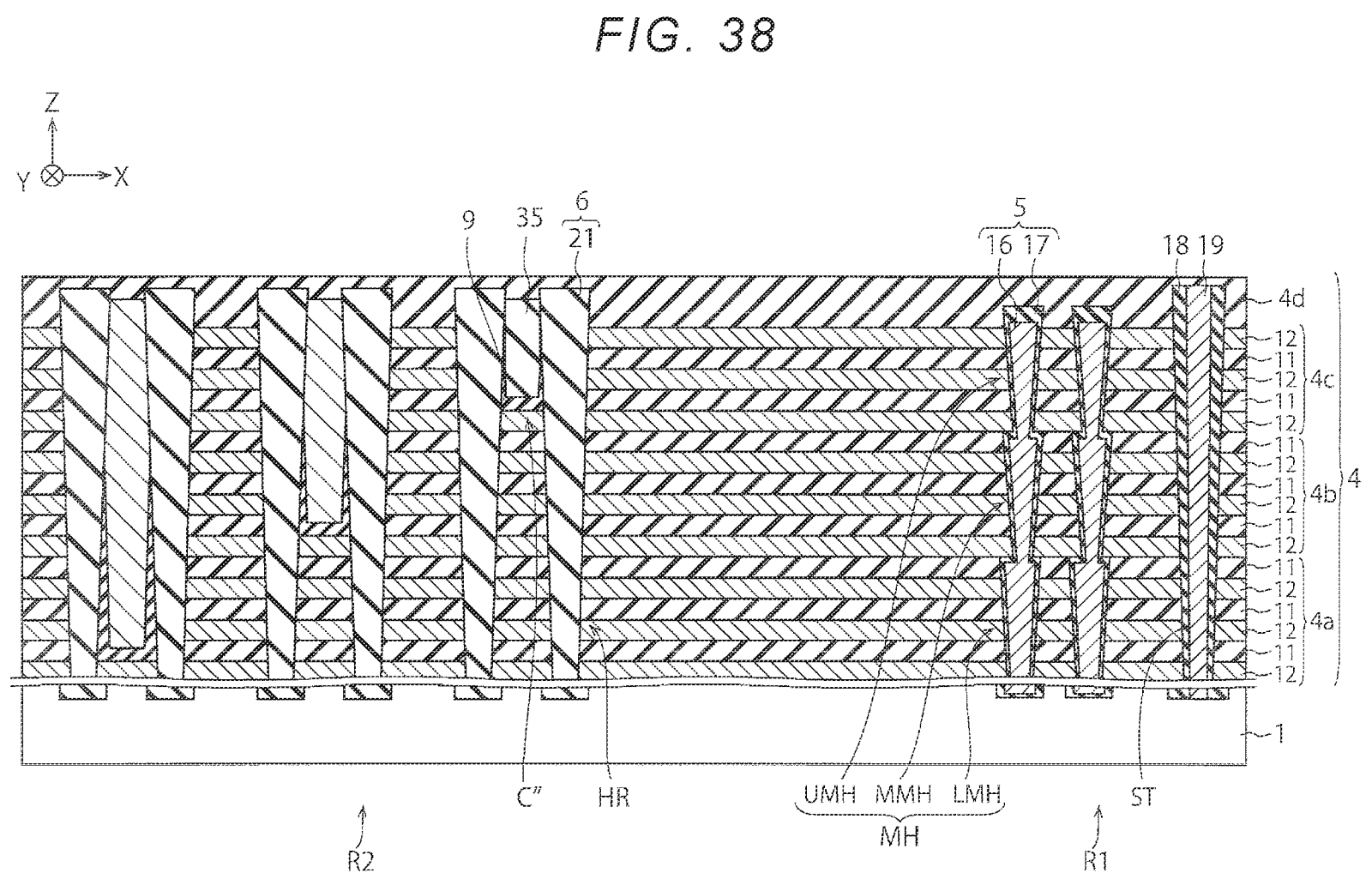

Next, the upper surface of the stacked film 4 and the metal layer 52 in each slit ST are removed, and the insulating film 18 and the wiring layer 19 are formed in each slit ST (FIG. 38). Next, an additional part of the insulating film 4d is formed on the entire surface of the substrate 1 (FIG. 38).

Figure 39:
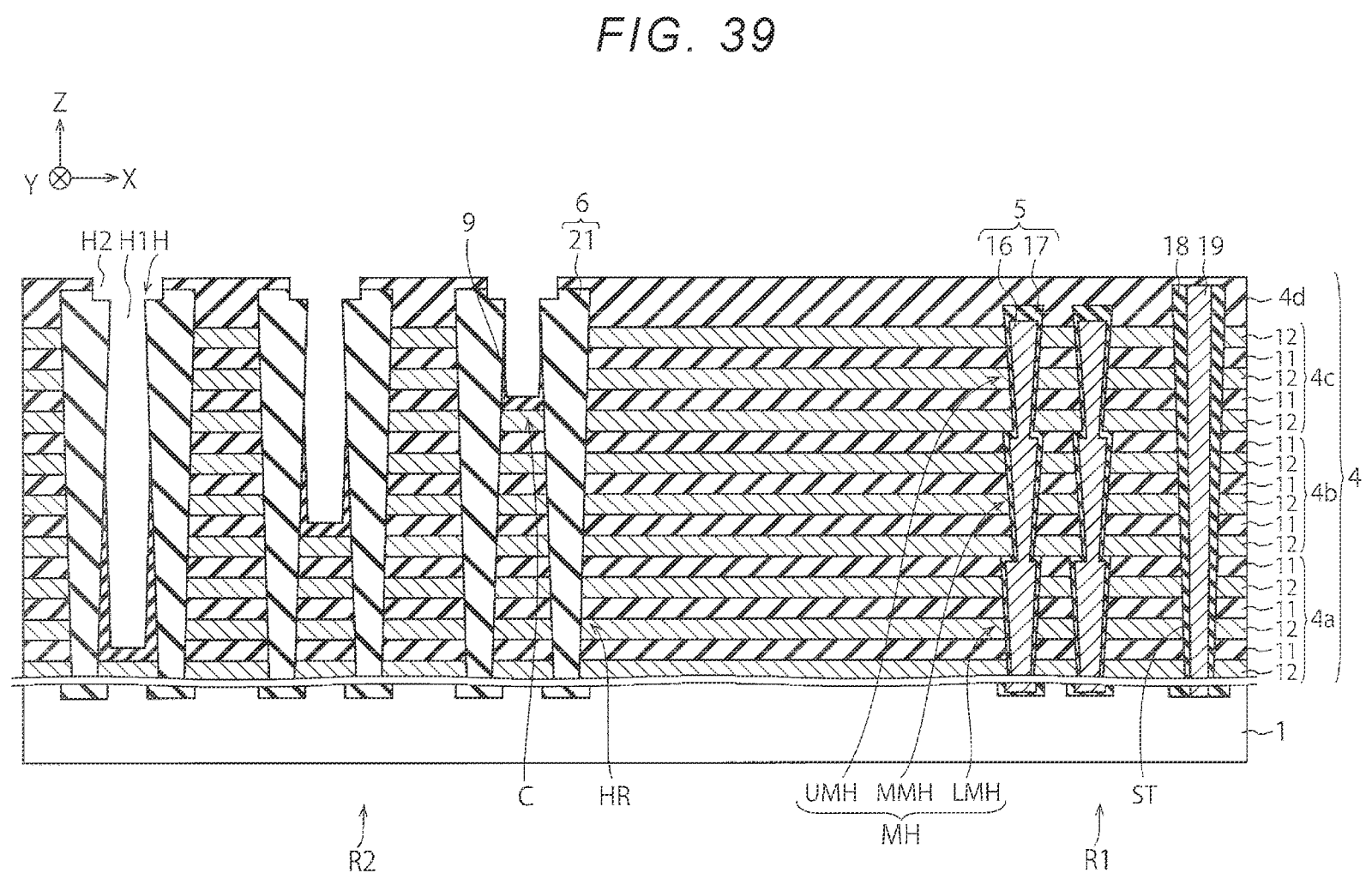
Figure 40:
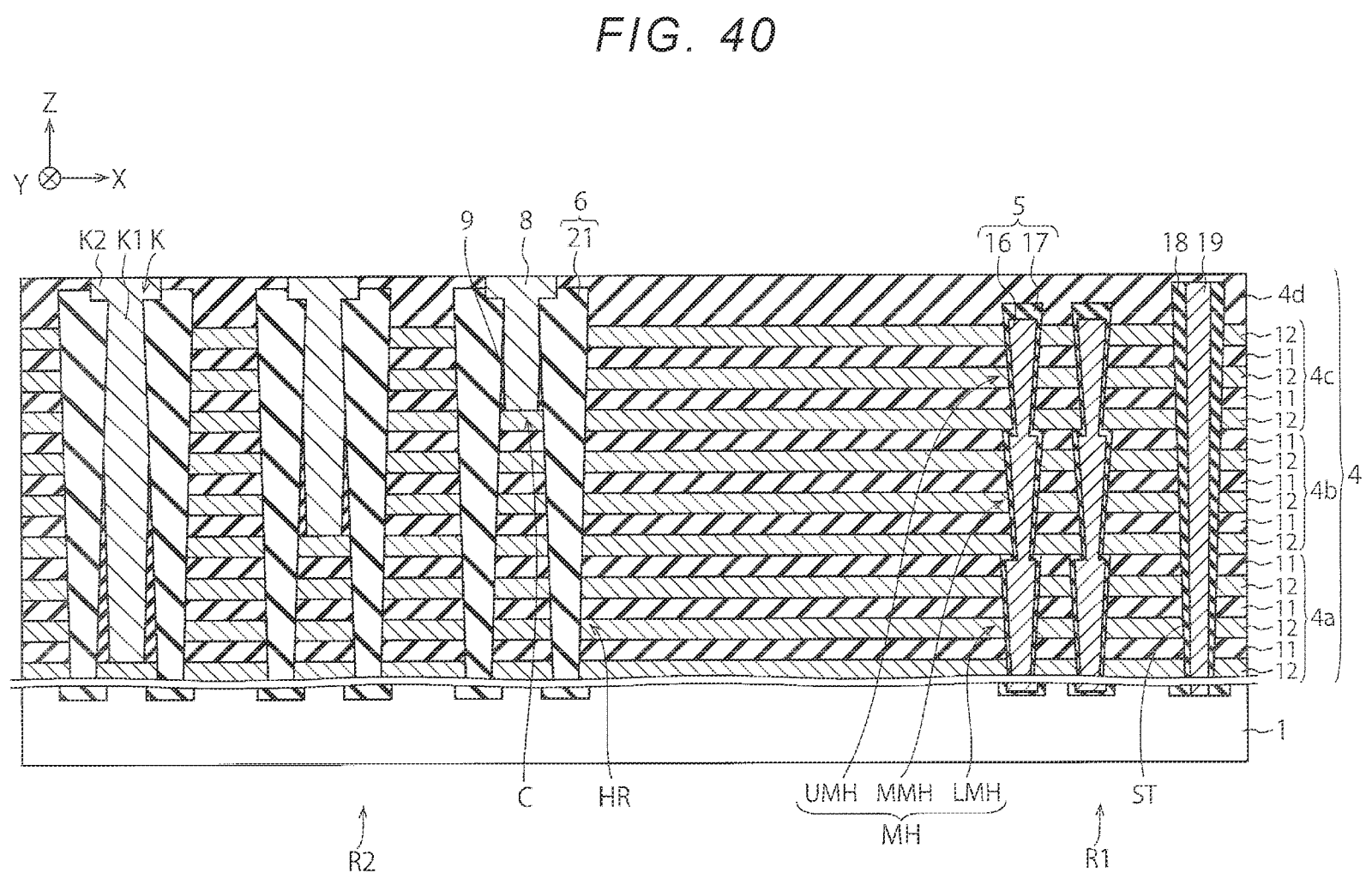
Figure 42B:
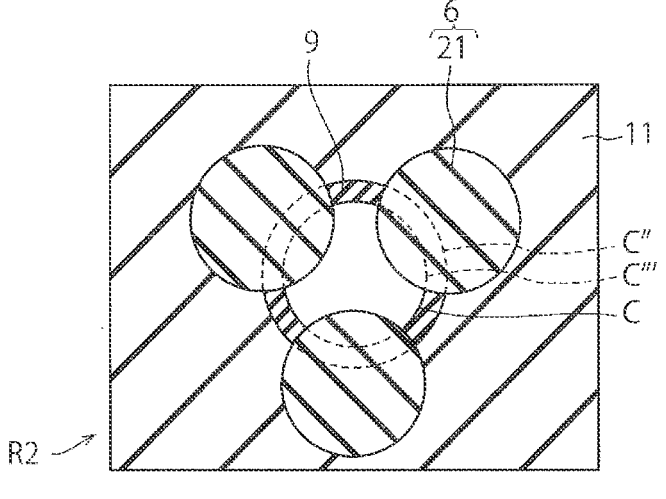
Figure 42C:
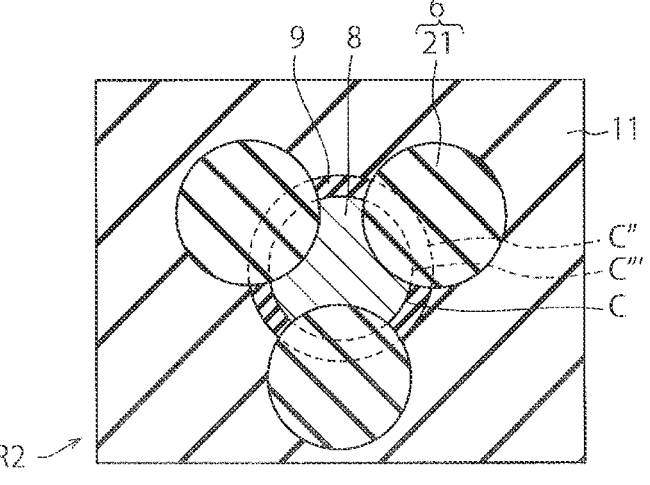

Next, the insulating film 4d on each sacrificial layer 35 is removed by RIE (FIG. 39). As a result, an upper portion H2 of each contact hole C is formed in the insulating film 4d, and the upper surface of each sacrificial layer 35 is exposed in the upper portion H2. Next, each sacrificial layer 35 is removed by wet etching (FIG. 39). As a result, a lower portion H1 of each contact hole C is formed below the upper portion H2 in the stacked film 4. Each contact hole C according to the second embodiment is formed such that a step H is provided between the lower portion H1 and the upper portion H2. In FIG. 39, a width of the upper portion H2 in the X direction is greater than a width of the lower portion H1 in the X direction at a height level of the step H. Therefore, the upper portion H2 is formed on the lower portion H1 and the column portion 6 at the height of the step H. Each contact hole C is an example of a second hole. FIG. 42B illustrates the contact hole C illustrated in FIG. 39. Next, the insulating film 9 is removed from the bottom portion of each contact hole C by RIE, and then the contact plug 8 is formed in each contact hole C (FIG. 40). The lower portion K1 and the upper portion K2 of each contact plug 8 are formed in the lower portion H1 and the upper portion H2 of the corresponding contact hole C, respectively. The step K between the lower portion K1 and the upper portion K2 is formed due to a step H between the lower portion H1 and the upper portion H2. FIG. 42C illustrates the contact plug 8 illustrated in FIG. 40.

Thereafter, various wiring layers, via plugs, interlayer insulating films, and the like are formed on the substrate 1. In this way, the semiconductor device according to the second embodiment illustrated in FIG. 27 is manufactured.

Each memory hole MH according to the second embodiment is divided into three portions called the lower memory hole LMH, the intermediate memory hole MMH, and the upper memory hole UMH, but each memory hole MH may be formed by other methods. For example, each memory hole MH according to the second embodiment may be formed without being distinctly divided into a plurality of portions, or may be formed separately from two portions or four or more portions.

(3) Various Examples of Structure of Semiconductor Device

Figure 43A:
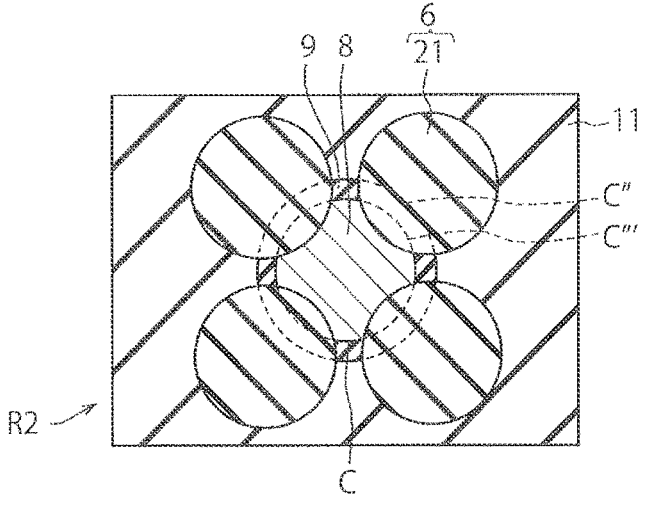
FIGS. 43A to 43C are, respectively, plan views illustrating structures of semiconductor devices according to first, second, and third modified examples of the second embodiment.
Figure 43B:
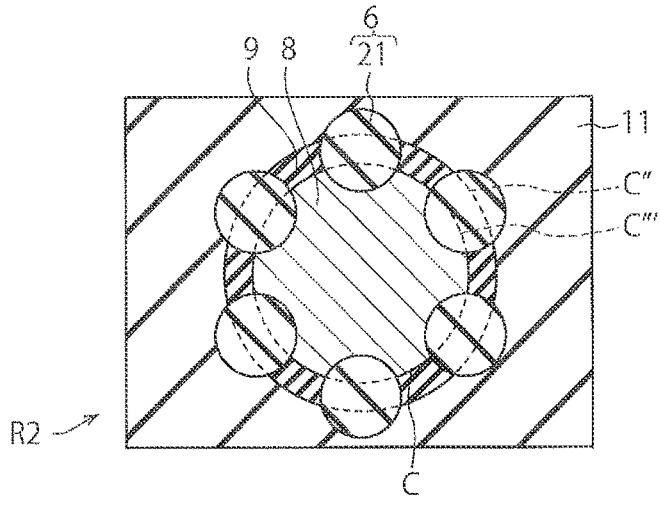
Figure 43C:
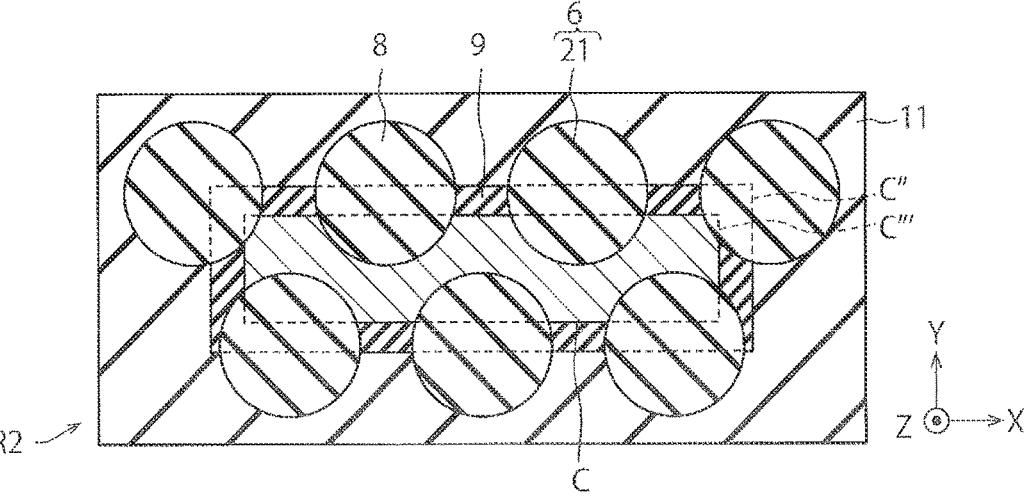

FIGS. 43A to 43C are plan views illustrating structures of semiconductor devices according to first to third modified examples of the second embodiment.

FIG. 43A illustrates a semiconductor device according to a first modified example. In FIG. 43A, four column portions 6 are provided near one contact plug 8.

FIG. 43B illustrates a semiconductor device according to a second modified example. In FIG. 43B, six column portions 6 are provided near one contact plug 8.

FIG. 43C illustrates a semiconductor device according to a third modified example. In FIG. 43C, a planar shape of the contact hole C" is not a circle but rather a rectangular shape, and seven column portions 6 are provided near one contact plug 8.

In this way, any number of the column portions 6 may be provided in the vicinity of each contact plug 8. The planar shape of each contact hole C" may also be any shape.

Figure 44A:
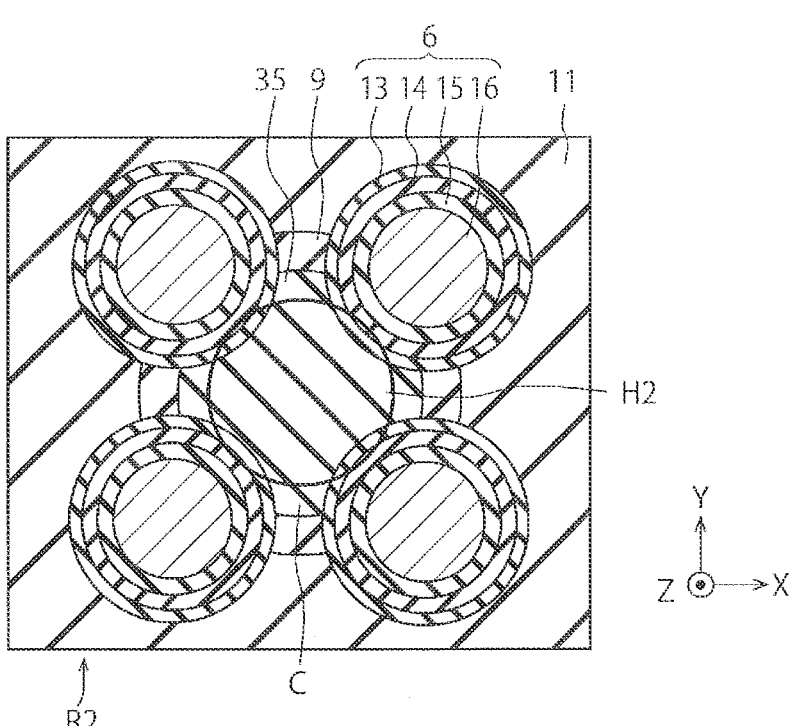
FIGS. 44A and 44B are plan views illustrating aspects of a method for manufacturing a semiconductor device according to a comparative example of the second embodiment and a semiconductor device according to the first modified example of the second embodiment.
Figure 44B:
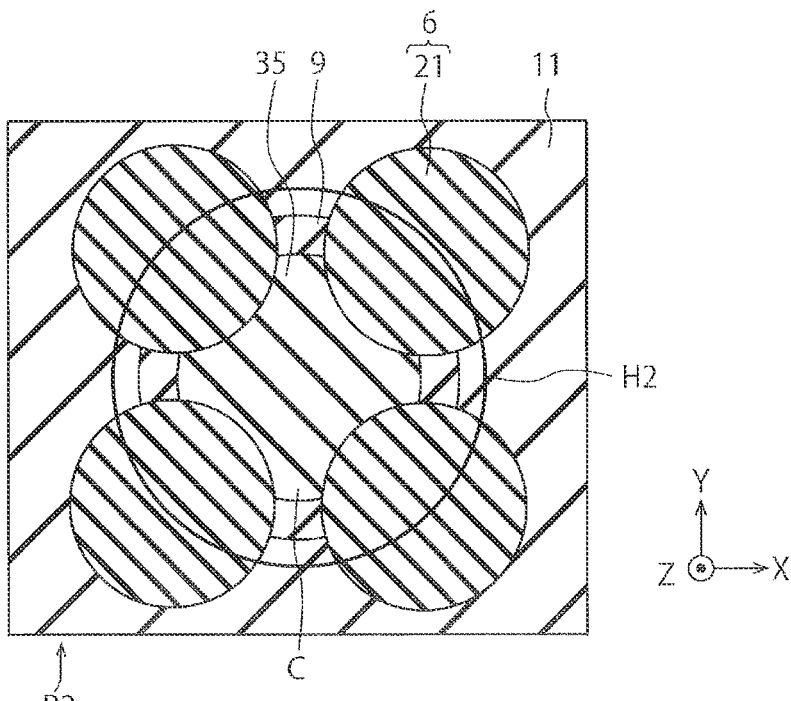

FIGS. 44A and 44B are plan views illustrating a method for manufacturing a semiconductor device according to the first comparative example of the second embodiment and a method for manufacturing a semiconductor device according to the first modified example of the second embodiment.

FIG. 44A illustrates a position (indicated by a thick solid line) at which the upper portion H2 of the contact hole C is formed when the semiconductor device according to the first comparative example of the second embodiment is manufactured. Similarly to the first embodiment, each column portion 6 of this first comparative example includes a block insulating film 13, a charge storage layer 14, a tunnel insulating film 15, and a channel semiconductor layer 16. In this case, when the upper portion H2 is misaligned when the upper portion H2 is formed, the channel semiconductor layer 16 may be exposed in the upper portion H2. When the channel semiconductor layer 16 is exposed in the upper portion H2, the channel semiconductor layer 16 may be severely damaged when the sacrificial layer 35 (for example, an amorphous silicon layer) is removed by wet etching.

Therefore, in this first comparative example, a diameter of the upper portion H2 in a plan view is set to a small value. In this first comparative example, it is necessary to accurately perform lithography when forming the upper portion H2 such that the channel semiconductor layer 16 will not be exposed in the upper portion H2 due to the misalignment of the upper portion H2.

FIG. 44B illustrates a position (indicated by a thick solid line) at which the upper portion H2 of the contact hole C is formed when the semiconductor device according to the first modified example of the second embodiment (see FIG. 43A) is manufactured. Each column portion 6 of this first modified example is formed of only the insulating film 21 (for example, a $SiO_2$ film). In this case, even when the insulating film 21 is exposed in the upper portion H2, when the sacrificial layer 35 (for example, the amorphous silicon layer) is removed by wet etching, it is possible to prevent severe damage to the insulating film 21.

Therefore, according to this first modified example, the diameter of the upper portion H2 in a plan view can be set to a large value. In this first modified example, since a margin for misalignment of the upper portion H2 is larger, lithography can be less accurately performed when the upper portion H2 is formed.

The same also applies to the upper portion H2 illustrated in FIG. 39. In FIG. 39, the width of the upper portion H2 in the X direction is greater than the width of the lower portion H1 in the X direction at a height level of the step H. This is because the diameter of the upper portion H2 in a plan view is set to a large value. According to the second embodiment and the first modified example of the second embodiment, the diameter of the upper portion H2 is greater than the diameter of the lower portion H1 (the diameter of the contact hole C"") at the height of the step H, and furthermore, is greater than the diameter of the contact hole C". Accordingly, the diameter of the upper portion H2 illustrated in FIG. 44B is larger than the diameter of the sacrificial layer 35 (the diameter of the contact hole C"") and the diameter of the insulating film 9 (the diameter of the contact hole C").

Figure 45:
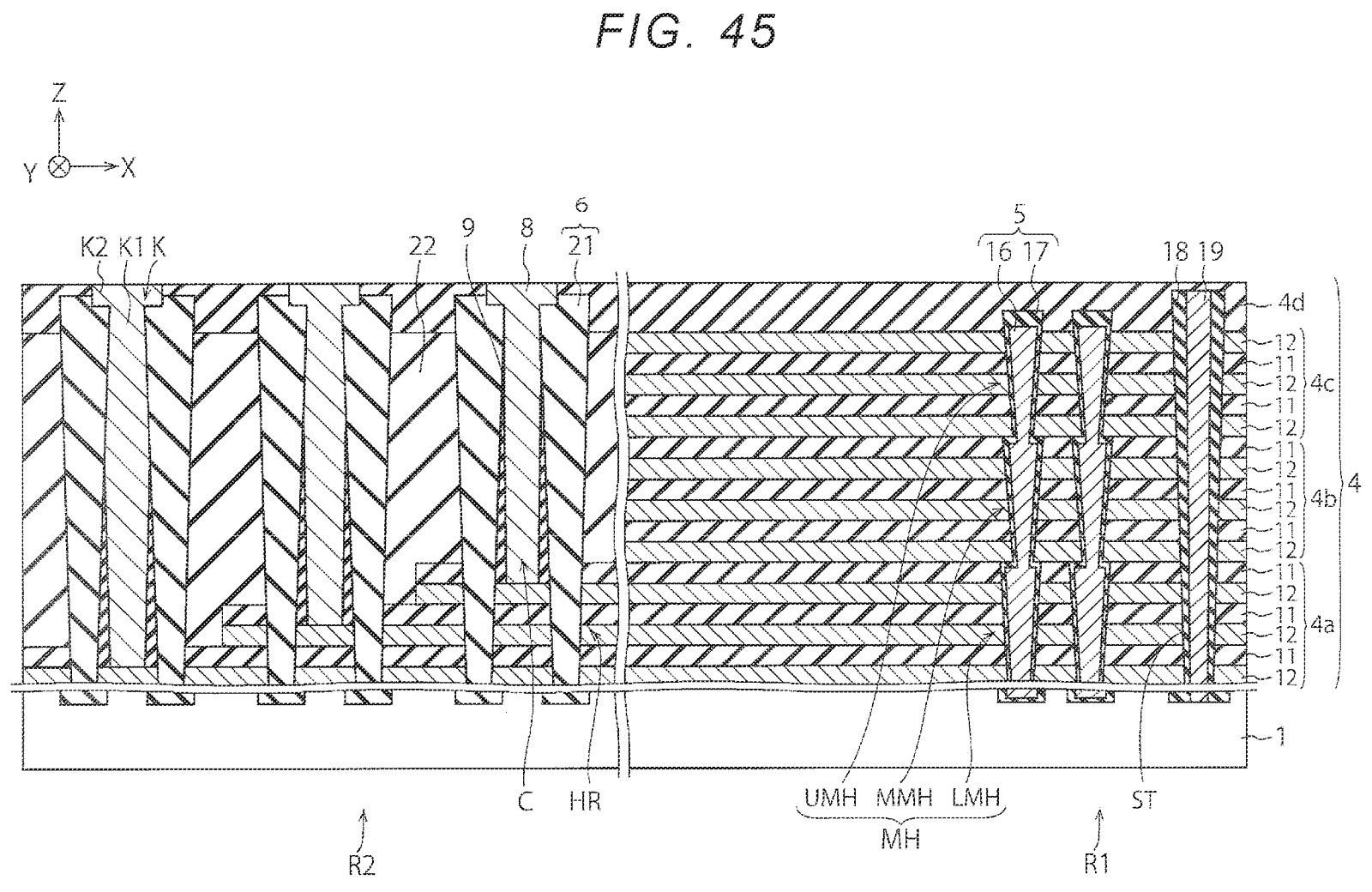

FIG. 45 is a cross-sectional view illustrating a structure of a semiconductor device according to a fourth modified example of the second embodiment.

The semiconductor device according to this fourth modified example (FIG. 45) has substantially the same structure as that of the semiconductor device according to the second embodiment (FIG. 27). It is noted that the contact region R2 of the stacked film 4 according to the fourth modified example is a stepped portion having a stepped shape. On the other hand, the cell region R1 of the stacked film 4 according to the fourth modified example is a flat portion having a non-step shape. The semiconductor device according to the fourth modified example includes an insulating film 22 formed on the lower stacked film 4*a*, the intermediate stacked film 4*e*, and the upper stacked film 4*c* in the contact region R2. The Insulating film 22 is, for example, a $SiO_2$ film.

The column portion 6, the contact plug 8, and the insulating film 9 according to this fourth modified example are formed in the stacked film 4 and the insulating film 22. The semiconductor device according to this fourth modified example can be manufactured by the method illustrated in FIGS. 29 to 40 similarly to the semiconductor device of the second embodiment. It is noted that when the semiconductor device according to this fourth modified example is manufactured, a stepped portion (contact region R2) can be formed in the lower stacked film 4*a*, the intermediate stacked film 4*e*, and the upper stacked film 4*c*, and an insulating film 22 is formed on the stepped portion.

Figure 46:
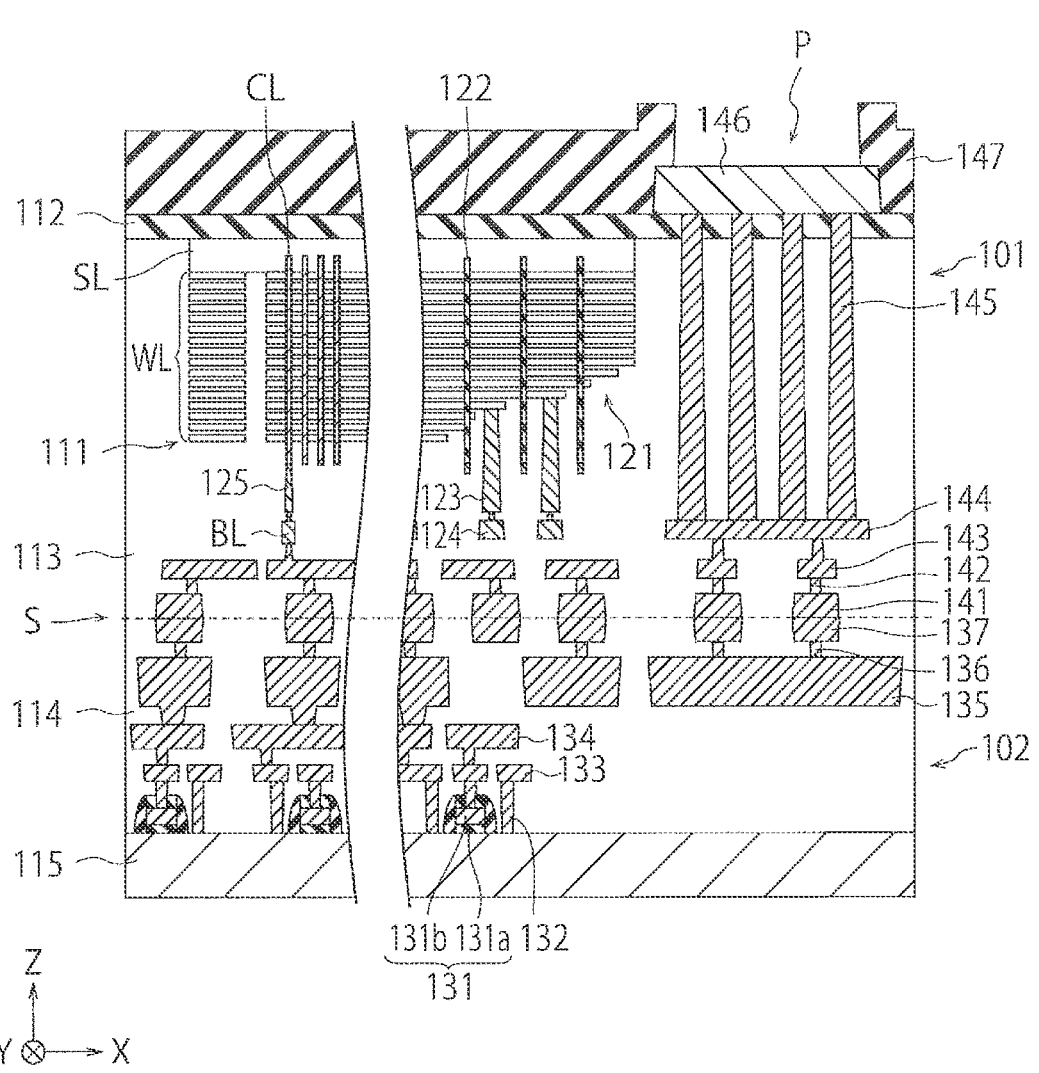
FIG. 46 is a cross-sectional view illustrating a structure of a semiconductor device according to a fifth modified example of the second embodiment.

FIG. 46 is a cross-sectional view illustrating a structure of a semiconductor device according to a fifth modified example of the second embodiment.

The semiconductor device (FIG. 46) according to this fifth modified example includes a stepped portion similar to the semiconductor device of the fourth modified example (FIG. 45). The semiconductor device according to the fifth modified example can be manufactured by bonding an array wafer including an array chip 101 and a circuit wafer including a circuit chip 102. The semiconductor device of the fifth modified example has otherwise the same structure as that of the semiconductor device of the fourth modified example.

The array chip 101 includes a memory cell array 111 including a plurality of memory cells, an insulating film 112 formed on the memory cell array 111, and an interlayer insulating film 113 formed below the memory cell array 111. The memory cell array 111 corresponds to the stacked film 4 of the fourth modified example. The insulating film 112 is, for example, a $SiO_2$ film. The interlayer insulating film 113 is, for example, a stacked film including a $SiO_2$ film and another insulating film.

The circuit chip 102 is provided below the array chip 101. A reference sign S denotes a bonding surface between the array chip 101 and the circuit chip 102. The circuit chip 102 includes an interlayer insulating film 114 formed below the interlayer insulating film 113 and a substrate 115 formed below the interlayer insulating film 114. The interlayer insulating film 114 is, for example, a stacked film including a $SiO_2$ film and another insulating film. The substrate 115 is, for example, a semiconductor substrate such as a Si substrate.

The array chip 101 includes a plurality of word lines WL as a plurality of electrode layers in the memory cell array 111. The electrode layers correspond to the electrode layer 12 of the fourth modified example. FIG. 46 illustrates a stepped structure portion 121 formed in the memory cell array 111 and a plurality of column portions 122 provided in the stepped structure portion 121. Each word line WL is electrically connected to a word wiring layer 124 through a contact plug 123. Each columnar portion CL which passes through the word line WL is electrically connected to a bit line BL by a via plug 125, and is electrically connected to a source line SL. The bit line BL is provided below the word line WL, and the source line SL is provided above the word line WL.

The stepped structure portion 121, the column portion 122, the contact plug 123, and the columnar portion CL according to the fifth modified example correspond to the stepped portion (contact region R2), the column portion 6, the contact plug 8, and the columnar portion 5 according to the fourth modified example. Similarly to the column portion 6, the contact plug 8, and the columnar portion 5, the column portion 122, the contact plug 123, and the columnar portion CL according to the fifth modified example are formed by the method illustrated in FIGS. 29 to 40. In this case, the column portion 122, the contact plug 123, and the columnar portion CL of the fifth modified example can have the same structure as the column portion 6, the contact plug 8, and the columnar portion 5.

The circuit chip 102 includes a plurality of transistors 131. Each transistor 131 includes a gate insulating film 131a and a gate electrode 131b sequentially provided on the substrate 115, and a source diffusion layer and a drain diffusion layer provided in the substrate 115. In addition, the circuit chip 102 includes the gate electrode 131b and the source diffusion layer of the transistor 131, and a plurality of contact plugs 132 provided on the drain diffusion layer. In addition, the circuit chip 102 includes a wiring layer 133, a wiring layer 134, and a wiring layer 135. The wiring layer 133 includes a plurality of wirings and is provided on the contact plugs 132. The wiring layer 134 includes a plurality of wirings and is provided on the wiring layer 133. The wiring layer 135 includes a plurality of wirings and is provided on the wiring layer 134.

The circuit chip 102 further includes a plurality of via plugs 136 provided on the wiring layer 135, and a plurality of metal pads 137 provided on the via plugs 136. The metal pad 137 is, for example, a metal layer including a Cu layer. The circuit chip 102 serves as a control circuit (logic circuit) for controlling an operation of the array chip 101. The control circuit includes a transistor 131 and the like, and is electrically connected to the metal pad 137.

The array chip 101 includes a plurality of metal pads 141 provided on the metal pads 137, and a plurality of via plugs 142 provided on the metal pads 141. The metal pad 141 is, for example, a metal layer such as a copper (Cu) layer. In addition, the array chip 101 includes a wiring layer 143 and a wiring layer 144. The wiring layer 143 includes a plurality of wirings and is provided on the via plugs 142. The wiring layer 144 includes a plurality of wirings and is provided on the wiring layer 143. The bit line BL is provided in the wiring layer 144. The control circuit is electrically connected to the memory cell array 111 through the metal pads 141 and 137 or the like, and controls the operation of the memory cell array 111 through the metal pads 141 and 137 or the like.

The array chip 101 further includes a plurality of via plugs 145 provided on the wiring layer 144, and metal pads 146 provided on the via plugs 145 and on the insulating film 112. In addition, the array chip 101 includes a passivation insulating film 147 provided on the metal pad 146 and on the insulating film 112. The metal pad 146 is, for example, a metal layer including a Cu layer, and serves as an external connection pad (bonding pad) of the semiconductor device according to the present modified example. The passivation insulating film 147 is, for example, a stacked film including a $SiO_2$ film and a SiN film (silicon nitride film), and has an opening P for exposing the upper surface of the metal pad 146. The metal pad 146 can be electrically connected to a mounting substrate or another device by a bonding wire, a solder ball, a metal bump, or the like through the opening P.

Figure 47:
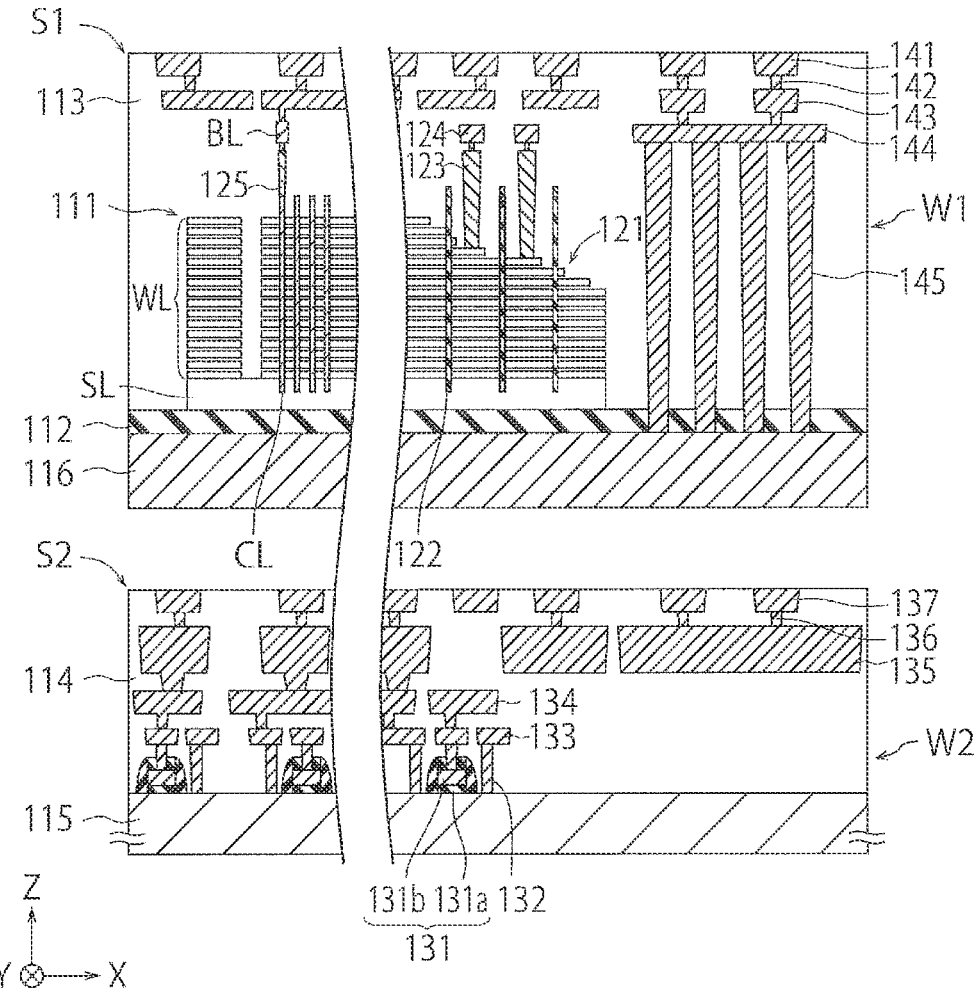
FIG. 47 is a cross-sectional view illustrating aspects of a method for manufacturing a semiconductor device according to a fifth modified example of the second embodiment.
Figure 48:
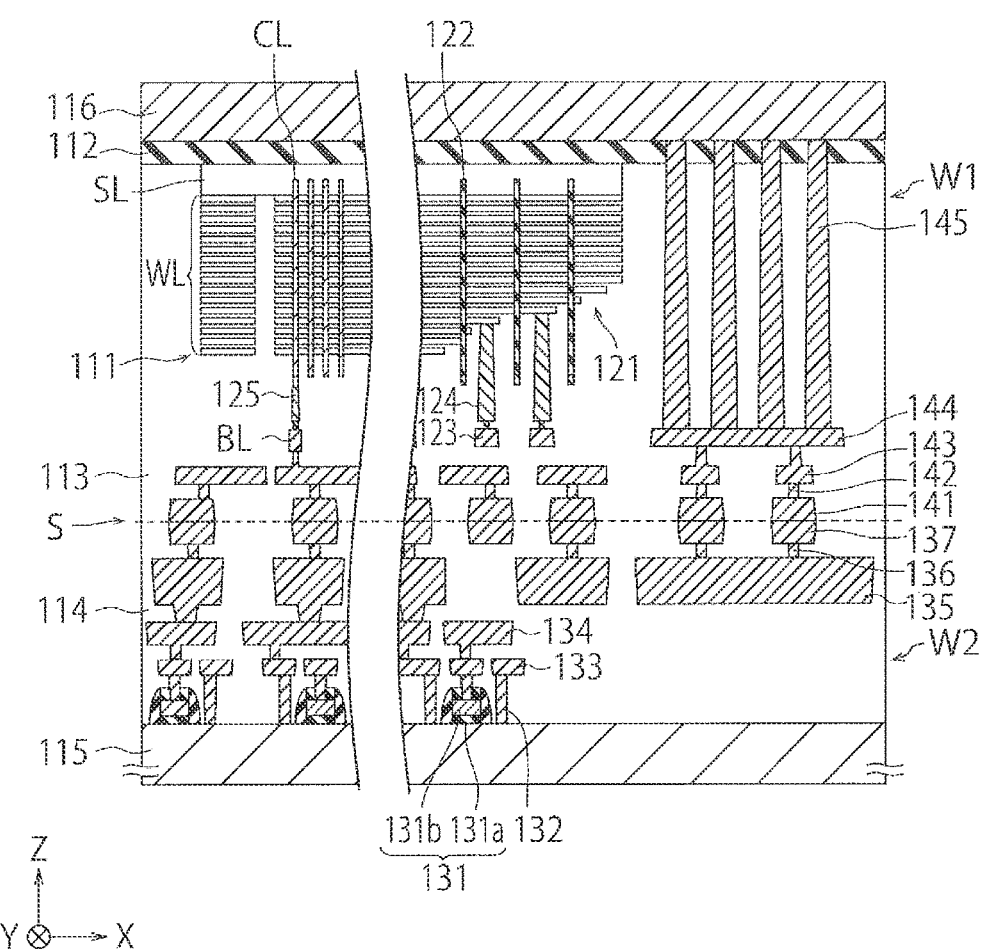
FIG. 48 is a cross-sectional view illustrating aspects of a method for manufacturing a semiconductor device according to a fifth modified example of the second embodiment.

FIGS. 47 and 48 are cross-sectional views illustrating a method of manufacturing a semiconductor device according to a fifth modified example of the second embodiment.

FIG. 47 illustrates an array wafer W1 including a plurality of array chips 101 and a circuit wafer W2 including a plurality of circuit chips 102. Note, the orientation of the array wafer W1 in FIG. 47 is opposite to the orientation of the array chip 101 in FIG. 46. In the fifth modified example, the semiconductor device is manufactured by bonding the array wafer W1 with the circuit wafer W2. FIG. 47 illustrates the array wafer W1 before the orientation is reversed for bonding, and FIG. 46 illustrates the array chip 101 after the orientation has been reversed for bonding and bonding and dicing are performed.

In FIG. 47, a reference sign S1 denotes the upper surface of the array wafer W1, and a reference sign S2 denotes the upper surface of the circuit wafer W2. The array wafer W1 includes a substrate 116 provided below the insulating film 112. The substrate 116 is, for example, a semiconductor substrate such as a Si substrate. The substrate 116 corresponds to the substrate 1 according to the fourth modified example.

In the fifth modified example, as illustrated in FIG. 47, the memory cell arrays 111, the insulating film 112, the interlayer insulating film 113, the metal pad 141, and the like are formed on the substrate 116 of the array wafer W1, and the interlayer insulating film 114, the transistor 131, the metal pad 137, and the like are formed on the substrate 115 of the circuit wafer W2. Next, as illustrated in FIG. 48, the array wafer W1 and the circuit wafer W2 are bonded to each other by a mechanical pressure as the surface S1 and the surface S2 face each other. Thus, the interlayer insulating film 113 and the interlayer insulating film 114 are bonded. Next, the array wafer W1 and the circuit wafer W2 are annealed. The metal pad 141 and the metal pad 137 are bonded to each other in the annealing. In this way, the substrate 116 and the substrate 115 are bonded to each other through the interlayer insulating films 113 and 114.

Thereafter, the substrate 116 can be removed by chemical mechanical polishing (CMP), the substrate 115 is thinned by CMP, and then the array wafer W1 and the circuit wafer W2 are cut (diced) into a plurality of chips. In this way, the semiconductor device illustrated in FIG. 46 is manufactured. The metal pad 146 and the passivation insulating film 147 are formed on the insulating film 112 after removal of the substrate 116 and thinning of the substrate 115.

FIG. 46 illustrates a boundary surface between the interlayer insulating film 113 and the interlayer insulating film 114 and a boundary surface between the metal pad 141 and the metal pad 137, but it is common that these boundary surfaces are not easily observed after the annealing process. Nevertheless, positions of these boundary surfaces can be estimated by detecting, for example, inclinations of side surfaces of the metal pads 141 and side surfaces of the metal pads 137, or misalignments between the side surfaces (outer edges) of the metal pads 141 and the side surfaces (outer edges) of the metal pads 137.

Figure 49:
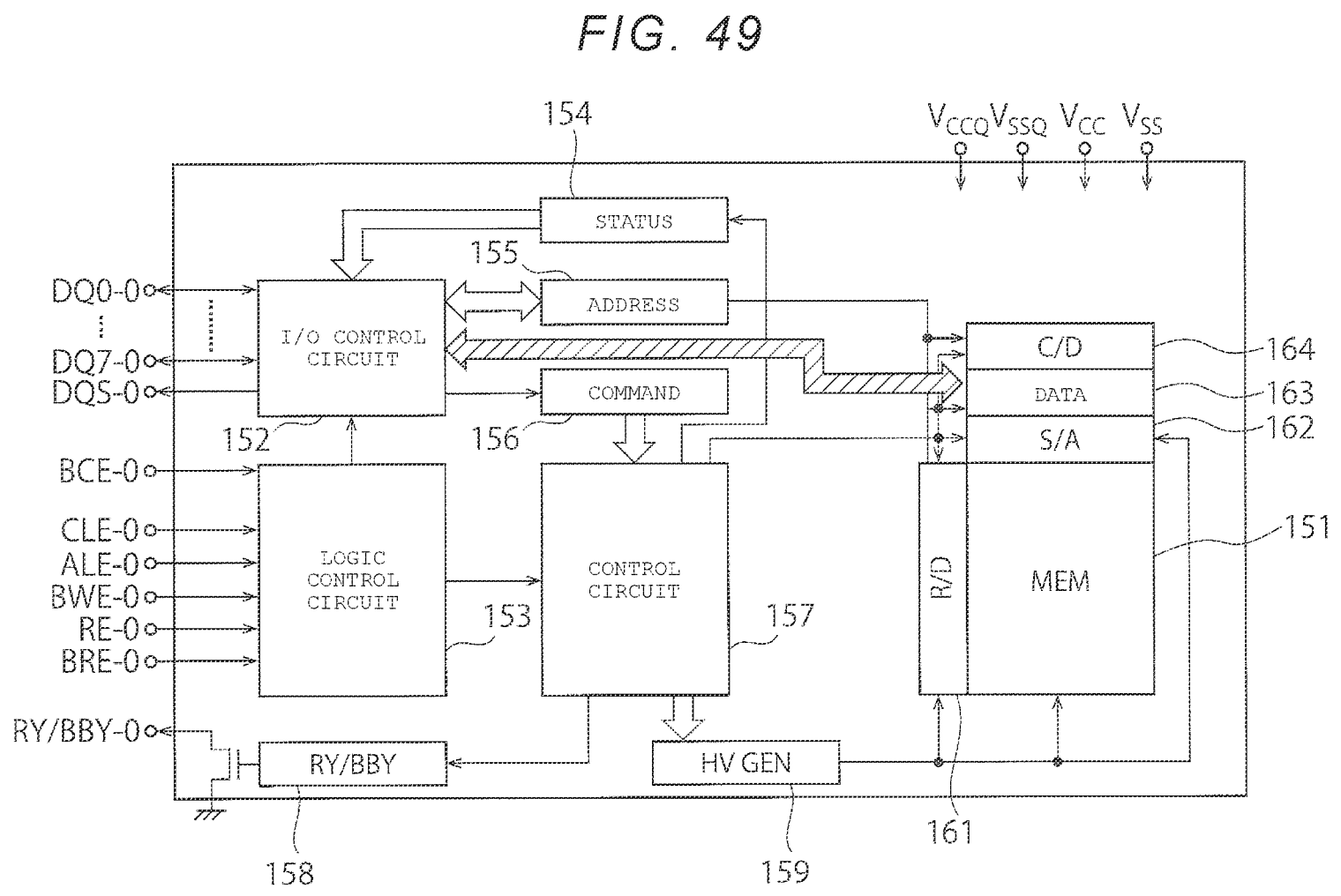

FIG. 49 is a block diagram illustrating a configuration of a semiconductor device according to the fifth modified example of the second embodiment.

In FIG. 49, the semiconductor device according to the fifth modified example includes a memory cell array 151, an input/output (I/O) control circuit 152, a logic control circuit 153, a status register 154, an address register 155, a command register 156, a control circuit 157, a ready/busy circuit 158, a voltage generator 159, a row decoder 161, a sense amplifier 162, a data register 163, and a column decoder 164.

The memory cell array 151 corresponds to the memory cell array 111 and includes a plurality of memory cells. The I/O control circuit 152 exchanges an input signal and an output signal with a controller or the like through data lines DQ0-0 to DQ7-0. The logic control circuit 153 receives a chip enable signal BCE-0, a command latch enable signal CLE-0, an address latch enable signal ALE-0, a write enable signal BWE-0, read enable signals RE-0 and BRE-0 to control an operation of the I/O control circuit 152 and the control circuit 157 in response to the signals.

The status register 154 stores a status of a read operation, write operation, erase operation, and the like to use the status for notifying the controller of completion of the operation. The address register 155 is used for the I/O control circuit 152 to store the address signal received from the controller. The command register 156 is used for the I/O control circuit 152 to store the command signal received from the controller.

The control circuit 157 controls the status register 154, the ready/busy circuit 158, the voltage generator 159, the row decoder 161, the sense amplifier 162, the data register 163, and the column decoder 164 in response to the command signal of the command register 156 to perform the read operation, the write operation, the erase operation, and the like.

The ready/busy circuit 158 transmits a ready/busy signal RY/BBY-0 to the controller according to an operation condition of the control circuit 157. Therefore, the control circuit 157 can notify whether a command can be received. The voltage generator 159 generates voltages necessary for the read operation, the write operation, and the erase operation.

The row decoder 161 applies a voltage to the word line WL. The sense amplifier 162 detects data read to the bit line BL. The data register 163 is used to store the data from the I/O control circuit 152 and the sense amplifier 162. The column decoder 164 decodes a column address and selects a latch circuit in the data register 163 based on a decoding result. The row decoder 161, the sense amplifier 162, the data register 163, and the column decoder 164 serve as interfaces for the read operation, the write operation, and the erase operation for the memory cell array 151.

The structure of the semiconductor device according to the fifth modified example can also be applied to each of the semiconductor devices according to the first and second embodiments. That is, each of the various semiconductor devices according to the first and second embodiments may be manufactured by bonding an array wafer including the array chip 101 and a circuit wafer including the circuit chip 102. It is noted that when the structure of the semiconductor device according to the fifth modified example is applied to a semiconductor device according to the first embodiment, the stepped structure portion 121 in the memory cell array 111 can be replaced with a non-stepped structure portion such as the contact region R2 illustrated in FIGS. 1 and 27. In addition, each of the semiconductor devices of the first and second embodiments may have the circuit configuration illustrated in FIG. 49.

As described above, when the semiconductor device of the second embodiment is manufactured, the contact hole " " is formed in the stacked film 4, then the insulating film 9 and the sacrificial layer 35 are formed in the contact hole C". The column portion 6 is then formed in the stacked film 4. Then, after the column portion 6 is formed, the sacrificial layer 35 is removed from the contact hole C" to form the contact hole C' and the contact plug 8 in the contact hole C. Thus, according to the second embodiment, the contact plug 8 can be suitably formed in the stacked film 4 as in the first embodiment. For example, the contact plug 8 can be formed such that the expansion of the seam in the column portion 6 and the removal of the column portion 6 are prevented. Furthermore, a short circuit between the electrode layers 12 can be prevented.

The semiconductor device according to the second embodiment is manufactured using the sacrificial region 51, but may be manufactured without using the sacrificial region 51. Conversely, the semiconductor device according to the first embodiment can be manufactured without using the sacrificial region 51, but may also be manufactured using the sacrificial region 51.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a stacked film including a plurality of first insulating films alternately stacked with a plurality of electrode layers in a first direction;
a columnar portion in a first region of the stacked film, the columnar portion extending in the first direction and forming a plurality of memory cells at intersections with the plurality of electrode layers;
a support column portion in a second region of the stacked film and extending in the first direction; and
a plug contacting a first electrode layer among the plurality of electrode layers in the second region, wherein
a first side surface of the support column portion faces a second side surface of the plug, and
the second side surface is concave in a direction toward the first side surface.

2. The semiconductor device according to claim 1, wherein
the plug passes through at least one electrode layer in the plurality of electrode layers above the first electrode layer in the first direction, and
the semiconductor device further includes:
a second insulating film between the plug and each of the electrode layers above the first electrode layer.

3. The semiconductor device according to claim 2, wherein the second insulating film is between the first side surface and the second side surface.

4. The semiconductor device according to claim 2, wherein a position of an upper end of the second insulating film is higher in the first direction than a position of an upper end of the support column portion.

5. The semiconductor device according to claim 1, wherein the support column portion is circular in a cross section perpendicular to the first direction above an upper surface of the first electrode layer and also circular below the upper surface of the first electrode layer.

6. The semiconductor device according to claim 1, wherein the plug is not in contact with the support column portion.

7. The semiconductor device according to claim 1, wherein the columnar portion includes a first semiconductor layer, and the support column portion includes a second semiconductor layer.

8. The semiconductor device according to claim 7, wherein the columnar portion further includes a third insulating film surrounding the first semiconductor layer, and the support column portion further includes a fourth insulating film surrounding the second semiconductor layer.

9. The semiconductor device according to claim 8, wherein the second semiconductor layer and the first semiconductor layer are the same material as one another, and fourth insulating film and the third insulating film are the same material as one another.

10. The semiconductor device according to claim 1, wherein the support column portion consists of only of an insulating material.

11. The semiconductor device according to claim 1, wherein the stacked film has a stepped shape in the second region.

12. A semiconductor device, comprising:

a stacked film including a plurality of first insulating films alternately stacked with a plurality of electrode layers in a first direction;

a columnar portion in a first region of the stacked film, the columnar portion extending in the first direction and forming a plurality of memory cells at intersections with the plurality of electrode layers;

a support column portion provided in a second region of the stacked film and extending in the first direction;

a plug contacting a first electrode layer among the plurality of electrode layers in the second region, the plug passing through at least one electrode layer in the plurality of electrode layers above the first electrode layer in the first direction; and a second insulating film between the support column portion and the plug and surrounding the plug in a cross section perpendicular to the first direction, wherein an interface between the support column portion and the second insulating film protrudes in a direction toward the second insulating film in the cross section perpendicular to the first direction or the support column portion is surrounded by the second insulating film in the cross section perpendicular to the first direction.

* * * * *